(12) United States Patent
Nakano et al.

(10) Patent No.: US 6,714,833 B2
(45) Date of Patent: Mar. 30, 2004

(54) PERFORMANCE EVALUATION METHOD FOR PLASMA PROCESSING APPARATUS

(75) Inventors: Akira Nakano, Miyagi-ken (JP); Tadahiro Ohmi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 355 days.

(21) Appl. No.: 10/033,343

(22) Filed: Nov. 2, 2001

(65) Prior Publication Data

US 2002/0132380 A1 Sep. 19, 2002

(30) Foreign Application Priority Data

Nov. 14, 2000 (JP) ........................... 2000-346793

(51) Int. Cl.[7] .................. G06F 11/30; G06F 19/00; H01L 21/00
(52) U.S. Cl. ................. 700/121; 700/108; 702/183; 438/10
(58) Field of Search ................. 700/108, 121; 702/183, 184; 438/10, 11

(56) References Cited

U.S. PATENT DOCUMENTS

| | | | |
|---|---|---|---|
| 4,207,137 A | * | 6/1980 | Tretola ...................... 438/10 |
| 5,474,648 A | | 12/1995 | Patrick et al. |
| 6,060,837 A | * | 5/2000 | Richardson et al. .... 315/111.51 |
| 6,197,116 B1 | * | 3/2001 | Kosugi ...................... 118/712 |
| 6,291,999 B1 | * | 9/2001 | Nishimori et al. .......... 324/464 |
| 6,351,683 B1 | * | 2/2002 | Johnson et al. ............. 700/121 |
| 6,521,874 B2 | * | 2/2003 | Thompson et al. ......... 219/666 |

* cited by examiner

Primary Examiner—Leo Picard
Assistant Examiner—Elliot Frank
(74) Attorney, Agent, or Firm—Beyer Weaver & Thomas

(57) ABSTRACT

A plasma processing apparatus includes a plurality of plasma processing units. Each of the plasma processing units has a plasma excitation electrode, a radiofrequency generator connected to the plasma excitation electrode, and a matching circuit which matches the impedance between the radiofrequency generator and the plasma processing unit. The absolute value $|\Delta RA|$ of the difference $\Delta RA$ between the AC resistance $RA_0$ at a time $t_0$ and the AC resistance $RA_1$ at a later time $t_1$ and the absolute value $|\Delta RB|$ of the difference $\Delta RB$ between the AC resistance $RB_0$ at the time $t_0$ and the AC resistance $RB_1$ at the later time $t_1$ are maintained at a value less than an upper limit. Based on these values, whether or not the plasma processing apparatus which is reassembled or used at a user site maintains a required level of performance is evaluated.

25 Claims, 36 Drawing Sheets

FIG. 33

DETAILED MAINTENANCE PAGE    CP4 xxxx / K13

ELECTRICAL PERFORMANCE    K10

| $f_o$ ... | $f_e$ ... | Z ... | R ... | $C_e$ ... | $C_x$ ... |
|---|---|---|---|---|---|

MAINTENANCE HISTORY    K17

| | CHAMBER 1 xxxx K13 | | | | | | CHAMBER 2 xxxx K13 | | | | | | VARIATIONS xxxx K13 | | | | | |
|---|---|---|---|---|---|---|---|---|---|---|---|---|---|---|---|---|---|---|
| | $f_o$ | $f_e$ | Z | R | $C_e$ | $C_x$ | $f_o$ | $f_e$ | Z | R | $C_e$ | $C_x$ | $f_o$ | $f_e$ | Z | R | $C_e$ | $C_x$ |
| DATE | MHz | MHz | Ω | Ω | pF | pF | MHz | MHz | Ω | Ω | pF | pF | | | | | | |
| 7/27 | 45.3 | 40.68 | 8 | 3.1 | 37 | 1800 | 45.3 | 40.68 | 8 | 3.1 | 37 | 1800 | 0.04 | 0.05 | 0.4 | 0.3 | 0.09 | 0.02 |

PERFORMANCE EVALUATION METHOD FOR PLASMA PROCESSING APPARATUS

BACKGROUND OF THE INVENTION

1. Field of the Invention

The present invention relates to a performance evaluation method, a maintenance method, a performance validation system, and a performance validation system for a plasma processing apparatus and relates to a plasma processing apparatus. In particular, the present invention relates to a technology for maintaining the performance of the plasma processing apparatus at a desired level.

2. Description of the Related Art

FIG. 40 illustrates a typical conventional dual-frequency excitation plasma processing unit which constitutes a plasma processing apparatus and performs a plasma process such as a chemical vapor deposition (CVD) process, a sputtering process, a dry etching process, or an ashing process.

In the plasma processing unit shown in FIG. 40, a matching circuit 2A is connected between a radiofrequency generator 1 and a plasma excitation electrode 4. The matching circuit 2A matches the impedances of the radiofrequency generator 1 and the excitation electrode 4.

Radiofrequency power generated in the radiofrequency generator 1 is supplied to the plasma excitation electrode 4 through the matching circuit 2A and a feed plate 3. The matching circuit 2A is accommodated in a matching box 2 which is a housing composed of a conductive material. The plasma excitation electrode 4 and the feed plate 3 are covered by a chassis 21 composed of a conductor.

An annular projection 4a is provided on the bottom face of the plasma excitation electrode (cathode) 4, and a shower plate 5 having many holes 7 comes into contact with the projection 4a below the plasma excitation electrode 4. The plasma excitation electrode 4 and the shower plate 5 define a space 6. A gas feeding tube 17 comprising a conductor is connected to the space 6 and is provided with an insulator 17a at the middle thereof so as to insulate the plasma excitation electrode 4 and the gas source.

Gas from the gas feeding tube 17 is introduced inside a plasma processing chamber 60 surrounded by a chamber wall 10, via the holes 7 in the shower plate 5. An insulator 9 is disposed between the chamber wall 10 and the plasma excitation electrode (cathode) 4 for insulation therebetween. The exhaust system is omitted from the drawing.

A wafer susceptor (susceptor electrode) 8 which holds a substrate 16 and also functions as another plasma excitation electrode is installed inside the plasma processing chamber 60. A susceptor shield 12 is disposed under the wafer susceptor 8.

The susceptor shield 12 comprises a shield supporting plate 12A for supporting the susceptor electrode 8 and a cylindrical support 12B extending downward from the center of the shield supporting plate 12A. The cylindrical support 12B extends through a chamber bottom 10A, and the lower portion of the cylindrical support 12B and the chamber bottom 10A are hermetically sealed with bellows 11.

The shaft 13 and the susceptor electrode 8 are electrically isolated from the susceptor shield 12 by a gap between the susceptor shield 12 and the susceptor electrode 8 and by insulators 12C provided around the shaft 13. The insulators 12C also maintain high vacuum in the plasma processing chamber 60. The susceptor electrode 8 and the susceptor shield 12 can be moved vertically by the bellows 11 so as to control the distance between plasma excitation electrodes 4 and the susceptor electrode 8.

The susceptor electrode 8 is connected to a second radiofrequency generator 15 via the shaft 13 and a matching circuit accommodated in a matching box 14. The chamber wall 10 and the susceptor shield 12 have the same DC potential.

FIG. 41 illustrates another conventional plasma processing unit. This plasma processing unit is of a single-frequency excitation type. In other words, radiofrequency power is supplied only to the cathode electrode 4, the susceptor electrode 8 being grounded. Thus, the matching box 14 and the radiofrequency generator 15 shown in FIG. 40 are not provided. The susceptor electrode 8 and the chamber wall 10 have the same DC potential.

In these plasma processing units, power with a frequency of approximately 13.56 MHz is generally supplied to generate a plasma between the electrodes 4 and 8 which is used for a plasma process such as a plasma-enhanced CVD process, a sputtering process, a dry etching process, or an ashing process.

These plasma processing units each, however, does not always exhibit a high power consumption rate in the plasma space (the ratio of the electrical power consumed in the plasma space to the electrical power supplied from the radiofrequency generator 1 to the plasma excitation electrode 4). In particular, the power consumption rate in the plasma space decreases noticeably as the frequency of the radiofrequency waves from the radiofrequency generator increases. Moreover, the power consumption rate decreases noticeably as the size of the substrate to be treated increases.

Such a decrease in power consumption rate results in a decreased layer deposition rate. When an insulating film is deposited, the resulting insulating film will not exhibit a high isolation voltage.

The operation validation and performance evaluation of the above-described plasma processing units have been performed by actual processing such as deposition and evaluation of characteristics of the resulting layers according to following Procedures:

Procedure (1) Deposition Rate and Planar Uniformity
  Step 1: Depositing a desired layer on a 6-inch substrate by a plasma-enhanced CVD process.
  Step 2: Patterning a resist layer.
  Step 3: Dry-etching the layer.
  Step 4: Removing the resist layer by ashing.
  Step 5: Measuring the surface roughness using a contact displacement meter to determine the layer thickness.
  Step 6: Calculating the deposition rate from the deposition time and the layer thickness.
  Step 7: Measuring the planar uniformity at 16 points on the substrate surface.
Procedure (2) BHF Etching Rate
  A resist mask is patterned as in Steps 1 and 2 in (1) above.
  Step 3: Immersing the substrate in a buffered hydrofluoric acid (BHF) solution for one minute to etch the layer.
  Step 4: Rinsing the substrate with deionized water, drying the substrate, and separating the resist mask using a mixture of sulfuric acid and hydrogen peroxide ($H_2SO_4+H_2O_2$).
  Step 5: Measuring the surface roughness as in Step 5 in Procedure (1) to determine the layer thickness after the etching.

Step 6: Calculating the etching rate from the immersion time and the reduced layer thickness.

Procedure (3) Isolation Voltage

Step 1: Depositing a conductive layer on a glass substrate by a sputtering method and patterning the conductive layer to form a lower electrode.

Step 2: Depositing an insulating layer by a plasma-enhanced CVD method.

Step 3: Forming an upper electrode as in Step 1.

Step 4: Forming a contact hole for the lower electrode.

Step 5: Measuring the current-voltage characteristics (I-V characteristics) of the upper and lower electrodes by using probes while applying a voltage up to approximately 200 V.

Step 6: Defining the isolation voltage as the voltage V at 100 pA corresponding to 1 $\mu A/cm^2$ in a 100 $\mu m$ square electrode.

The plasma processing apparatus has been required to achieve a higher plasma processing rate (a deposition rate or a processing rate), increased productivity, and improved planar uniformity of the plasma processing (planar uniformity of the layer thickness and the process variation). As the size of substrates has been increasing in recent years, the requirement of planar uniformity has become severer. Moreover, as the size of the substrate increases, the power required also increases to the order of kilowatts, thus increasing the power consumption. Accordingly, as the capacity of the power supply increases, both the cost for developing the power supply and the power consumption during the operation of the apparatus increase. In this respect, it is desirable to reduce the operation costs.

Furthermore, an increase in power consumption leads to an increase in emission of carbon dioxide which places a burden on the environment. Since the power consumption increases by the combination of an increase in the size of substrates and a low power consumption efficiency, reduction of the carbon dioxide emission is desired.

The density of the plasma generated can be improved by increasing the plasma excitation frequency. For example, a frequency in the VHF band of 30 MHz or more can be used instead of the conventional 13.56 MHz. Thus, one possible way to improve the deposition rate in a deposition apparatus such as a plasma-enhanced CVD apparatus is to use a higher plasma excitation frequency.

In a plasma processing apparatus having a plurality of the above-described plasma processing units, variation in plasma processing among the plasma processing units and matching circuits thereof is required to be reduced, so that the plasma processing rate (deposition rate when the apparatus is applied to a deposition process), productivity, and planar uniformity after the plasma process of workpieces (planar distribution in the layer thickness) is substantially the same among the workpieces plasma-treated in different plasma processing units.

The plasma processing apparatus is also required to yield substantially the same process results using the same process recipe which specifies external parameters for respective plasma processing units such as a gas flow rate, a gas pressure, a supplied power, and a process time.

The reduction in the time required for adjusting the plasma processing apparatus newly installed or subjected to maintenance to achieve substantially the same process results using the same recipe and to eliminate the variation among these plasma processing units, as well as the cost required for such adjustment, has been desired to be reduced.

Furthermore, reduction in the variation among the plasma processing units has also been required for a plasma processing system comprising a plurality of such plasma processing apparatuses.

The above-described plasma processing unit is designed to use power with a frequency of approximately 13.56 MHz and is not suited for power of higher frequencies. Specifically, radiofrequency characteristics such as impedance and resonant frequency characteristics of the overall plasma processing unit, and more specifically, the radiofrequency characteristics of the plasma processing chamber and the matching circuit have been neglected; consequently, no improvement in the electrical consumption efficiency has been achieved when power of a frequency higher than approximately 13.56 MHz is employed, resulting in decrease in the deposition rate rather than increase. Although the density of a generated plasma increases as the frequency increases, the density decreases once its peak value is reached, eventually reaching a level at which glow-discharge is no longer possible, thus rendering further increases in frequency undesirable.

In a plasma processing apparatus and a plasma processing system comprising a plurality of plasma processing units, the radiofrequency characteristics of the plasma processing units including the matching circuits are defined by their mechanical dimensions such as shape. However, the components constituting one plasma processing unit inevitably have differences in size, etc., due to the mechanical tolerance during manufacturing. When these components are assembled to make a plasma processing unit, the tolerance due to the assembly is added to the tolerance in the mechanical dimensions. Furthermore, some portions of the plasma processing chamber may not be measurable after assembly of the components; consequently, whether the plasma chamber as a whole has designed radiofrequency characteristics may not be quantitatively validated. Thus, no means for examining the variation in the radiofrequency characteristics of the plasma processing chambers is available.

Even if the plasma processing apparatus is sufficiently adjusted such that differences in radiofrequency characteristics between the plasma chambers are significantly low, a desired level of performance will not maintained and the differences will increase during repeating the plasma processing.

In particular, radiofrequency characteristics of a plasma chamber will deviate from initial values during repeating plasma processing, and thus a desired plasma treatment will not be achieved. Such a deviation may further increase the differences in the radiofrequency characteristics over time. When the plasma processing apparatus is subjected to adjustment works such as overhaul, parts replacement, and assembly with alignment, the performance before the adjustment works may not be maintained due to misalignment. Thus, the radiofrequency characteristics may change from the initial values. In general, the plasma processing apparatus is disassembled at a manufacturer site, transferred to a customer site, and reassembled at the customer site. The performance of such a plasma processing apparatus may not be maintained due to vibration during transfer and unsatisfactory reassembling. Also, in this case, the radiofrequency characteristics may change from the initial values.

In order to validate and evaluate the operation of the plasma processing apparatus using Procedures (1) to (3) above, the plasma processing apparatus must be operated and treated substrates must be examined by an ex-situ inspection method requiring many steps. Since such inspection requires several days to several weeks to obtain evaluation results, the characteristics of the plasma-treated substrates processed during that period, supposing that the production line is not stopped, remain unknown during that period. If the performance of the plasma processing apparatus is unsatisfactory, products not satisfying a required level may be manufactured. In this respect, a method for easily maintaining the operation of the plasma processing apparatus at the required level has been desired.

Conventional plasma processing apparatuses and system are not designed to eliminate the differences in electrical radiofrequency characteristics such as impedance and resonant frequency characteristics among the plasma processing units constituting the plasma processing apparatus or system. Thus, the effective power consumed in the plasma generating spaces of the plasma processing units and the density of the generated plasma vary between these plasma processing units. As a consequence, uniformity in plasma process results may not be achieved when the same process recipe is applied to these plasma processing units.

In order to obtain uniform plasma process results, external parameters such as a gas flow rate, a gas pressure, a supplied power, a process time, and the like must be compared with the process results according to Procedures (1) to (3) described above for each of the plasma processing units so as to determine the correlation between them. However, the amount of data is too enormous to completely perform the comparison.

When Procedures (1) to (3) described above are employed to inspect the plasma processing units constituting the plasma processing apparatus or system, the time required for adjusting the plasma processing units in installation or inspection so as to eliminate the difference in performance and variation in processing among the plasma processing units to achieve the same process results using the same process recipe may be months. This time needs to be reduced. Also, the cost of substrates for inspection, the cost of processing the substrates for inspection, the labor cost for workers involved with the adjustment and so forth are significantly high.

SUMMARY OF THE INVENTION

In view of the above, objects of the present invention are as follows:

1. To provide a method for rapidly and simply evaluating whether or not a plasma processing apparatus maintains a required level of performance;
2. To provide a maintenance method for rapidly and simply correcting the plasma processing apparatus which does not maintain the required level of performance;
3. To provide a performance management system for controlling the performance of a plasma processing apparatus at a customer site at a required level and for prompting a maintenance work when the performance is not at the required level;
4. To provide a plasma processing apparatus which maintains a required level of performance;
5. To reduce differences in AC resistance as a radiofrequency characteristic in matching circuits of a plurality of plasma processing units;
6. To achieve substantially the same process results for a plurality of plasma processing units using the same process recipe; and
7. To reduce adjustment cost and operation cost and to increase the productivity.

In order to achieve the above-described objects, the present invention provides a performance evaluation method for a plasma processing apparatus comprising a plasma processing unit, the plasma processing unit comprising: a plasma processing chamber including an electrode for exciting a plasma; a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point. The performance evaluation method comprises: calculating the absolute value $|\Delta RA|$ of the difference $\Delta RA$ between an AC resistance $RA_0$ at a time $t_0$ and an AC resistance $RA_1$ at a later time $t_1$ in the matching circuit, the AC resistances $RA_0$ and $RA_1$ being measured from the input terminal side of the matching circuit; calculating the absolute value $|\Delta RB|$ of the difference $\Delta RB$ between an AC resistance $RB_0$ at the time $t_0$ and an AC resistance $RB_1$ at the later time $t_1$ in the matching circuit, the AC resistances $RB_0$ and $RB_1$ being measured from the output terminal side of the matching circuit; and determining that the plasma processing apparatus maintains a required level of performance when the absolute value $|\Delta RA|$ is less than a first upper limit and when the absolute value $=\Delta RB|$ is less than a second upper limit and that the plasma processing apparatus does not maintain the required level of performance when the absolute value $|\Delta RA|$ is not less than the first upper limit or when the absolute value $|\Delta RB|$ is not less than the second upper limit.

Preferably, the matching circuit is disconnected from the plasma processing unit at the output terminal and at the input terminal, and the AC resistances $RA_0$ and $RA_1$ are measured at a first measuring point corresponding to the input terminal.

The plasma processing unit may further comprise a radiofrequency supplier connected between the radiofrequency generator and the input terminal of the matching circuit, and the matching circuit may be disconnected from the plasma processing unit at the output terminal and at an input end of the radiofrequency supplier to measure the AC resistances $RA_0$ and $RA_1$ at a second measuring point corresponding to the input end of the radiofrequency supplier.

The matching circuit may be disconnected from the plasma processing unit at the input terminal and at the output terminal of the matching circuit to measure the AC resistances $RB_0$ and $RB_1$ at a third measuring point corresponding to the output terminal.

The plasma processing unit may further comprise a radiofrequency feeder connected between the output terminal of the matching circuit and the electrode, and the matching circuit may be disconnected from the plasma processing unit at the input terminal of the matching circuit and at an output end of the radiofrequency feeder to measure the AC resistance $RB_0$ and $RB_1$ at a fourth measuring point corresponding to the output end of the radiofrequency feeder.

Preferably, the AC resistances $RA_0$, $RA_1$, $RB_0$, and $RB_1$ are measured at a power frequency of the radiofrequency generator.

Preferably, the above-described first upper limit is 0.5 times the AC resistance $RA_0$, and the second upper limit is 0.5 times the AC resistance $RB_0$. More preferably, the first upper limit is 0.4 times the AC resistance $RA_0$, and the second upper limit is 0.4 times the AC resistance $RB_0$.

The matching circuit may further comprise at least one connection point for connecting the matching circuit to the ground potential portion. In such a case, the AC resistances $RA_0$, $RA_1$, $RB_0$, and $RB_1$ are measured for each of the connection points by sequentially switching the connection points so that only one of the connection points is connected to the ground potential portion.

Also, a workpiece may be introduced into the plasma processing chamber to perform a plasma process on the workpiece between the time $t_0$ and the later time $t_1$. Adjustment work may be performed between the time $t_0$ and the later time $t_1$. The plasma processing apparatus may be disassembled, transferred, and reassembled between the time $t_0$ and the later time $t_1$.

Another aspect of the present invention provides a maintenance method for a plasma processing apparatus, wherein, based on the results obtained by the above-described evaluation method, the AC resistances $RA_1$ and $RB_1$ are corrected when the absolute value $|\Delta RA|$ is not less than the first upper limit or the absolute value $|\Delta RB|$ is not less than the second upper limit.

Another aspect of the present invention provides a performance management system for a plasma processing apparatus comprising a plasma processing unit, the plasma processing unit comprising: a plasma processing chamber including an electrode for exciting a plasma; a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point. The performance management system comprises: a server for storing an AC resistance $RA_0$ in the matching circuit measured from the input terminal side of the matching circuit at a time $t_0$ and an AC resistance $RB_0$ in the matching circuit measured from the output terminal side of the matching circuit at the time $t_0$; and a customer I/O device linked to the server via a communication line. The server receives an AC resistance $RA_1$ at a later time $t_1$ and an AC resistance $RB_1$ at the later time $t_1$ from the customer I/O device, calculates the absolute value $|\Delta RA|$ of the difference $\Delta RA$ between the AC resistances $RA_0$ and $RA_1$ and the absolute value $|\Delta RB|$ of the difference $\Delta RB$ between the AC resistances $RB_0$ and $RB_1$, and transmits to the customer I/O device a signal indicating that the plasma processing apparatus maintains a required level of performance when the absolute value $|\Delta RA|$ is less than a first upper limit and when $|\Delta RB|$ is less than a second upper limit and a signal indicating that that the plasma processing apparatus does not maintain the required level of performance when the absolute value $|\Delta RA|$ is not less than the first upper limit or when the absolute value $|\Delta RB|$ is not less than the second upper limit.

The server may further store the identification number of the plasma processing unit associated with the AC resistances $RA_0$ and $RB_0$. In this system, the server receives the identification number of the plasma processing unit from the customer I/O device and calculates the absolute values $|\Delta RA|$ and $|\Delta RB|$ based on the AC resistances $RA_0$ and $RB_0$ associated with the identification number.

In this system, an RF characteristic meter may be connected to the plasma processing apparatus and the customer I/O device, and the AC resistances $RA_1$ and $RB_1$ may be directly transmitted from the RF characteristic meter to the server.

The server may further comprise an output device located at the site of a supplier. A maintenance command may be output through the output device when the absolute value $|\Delta RA|$ is not less than the first upper limit or when the absolute value $|\Delta RB|$ is not less than the second upper limit.

Another aspect of the present invention provides another performance management system for a plasma processing apparatus comprising a plasma processing unit, the unit comprising: a plasma processing chamber including an electrode for exciting a plasma; a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point. The performance management system comprises: a server for storing an AC resistance $RA_0$ at a time $t_0$ in the matching circuit measured from the input terminal side of the matching circuit, an AC resistance $RB_0$ at the time $t_0$ in the matching circuit measured from the output terminal side of the matching circuit, and service engineer information containing fault levels and names of registered service engineers corresponding to the fault levels; an output device of the server, the output device being located at the site of a supplier; a customer I/O device linked to the server via a communication line. In this system, the server receives an AC resistance $RA_1$ and an AC resistance $RB_1$ measured at a later time $t_1$ from the customer I/O device, calculates the absolute value $|\Delta RA|$ of the difference $\Delta RA$ between the AC resistances $RA_0$ and $RA_1$ and the absolute value $|\Delta RB|$ of the difference $\Delta RB$ between the AC resistances $RB_0$ and $RB_1$, and, when one of the absolute values $|\Delta RA|$ and $|\Delta RB|$ falls under any one of these fault levels, outputs a relevant fault level, information on the registered service engineer corresponding to the relevant fault level, and a maintenance command from the output device.

In this system, the server may transmit the relevant fault level to the customer I/O device.

Yet another aspect of the present invention provides a plasma processing apparatus having a plasma processing unit comprising: a plasma processing chamber including an electrode for exciting a plasma; a radiofrequency generator for supplying radiofrequency power to the electrode; and a matching circuit for matching the impedances of the plasma processing chamber and the radiofrequency generator. The matching circuit has an input terminal connected to the radiofrequency generator, an output terminal connected to the electrode, and a connection point provided between the input terminal and the output terminal. The matching circuit is connected to a ground potential portion via the connection point. In this apparatus, the absolute value $|\Delta RA|$ of the difference $\Delta RA$ between an AC resistance $RA_0$ at a time $t_0$ and an AC resistance $RA_1$ at a later time $t_1$ in the matching circuit, the AC resistances $RA_0$ and $RA_1$ being measured from the input terminal side of the matching circuit, is maintained at a value less than a first upper limit, and the absolute value $|\Delta RB|$ of the difference $\Delta RB$ between an AC resistance $RB_0$ at the time $t_0$ and an AC resistance $RB_1$ at the later time $t_1$ in the matching circuit, the AC resistances $RB_0$ and $RB_1$ being measured from the input terminal side of the matching circuit, is maintained at a value less than a second upper limit.

Another aspect of the present invention provides a performance validation system for a plasma processing apparatus, comprising: a customer terminal which allows a customer to request via a public line browsing of performance information indicating operation performance at the time $t_0$ and at the later $t_1$ of the above-described plasma processing apparatus which the customer purchased from an engineer; an engineer terminal which allows the engineer to upload the performance information; and performance information providing means for providing the performance information uploaded from the engineer terminal to the customer terminal upon the request from the customer terminal.

In this system, the performance information may include the AC resistances $RA_1$, $RA_1$, $RB_0$ and $RB_1$ and may be output as a catalog or a specifications document.

Each of the above aspects of the present invention will now be described in greater detail.

In the performance evaluation method of the present invention, the absolute value $|\Delta RA|$ and the absolute value $|\Delta RB|$ in the matching circuit of the plasma processing unit are calculated. The method determines that the plasma processing apparatus maintains a required level of performance when the absolute value $|\Delta RA|$ is less than the first upper limit and when the absolute value $|\Delta RB|$ is less than the second upper limit and that the plasma processing apparatus does not maintain the required level of performance when the absolute value $|\Delta RA|$ is not less than the first upper limit or when the absolute value $|\Delta RB|$ is not less than the second upper limit.

Moreover, according to this performance evaluation method, the performance of the plasma processing apparatus optimized once at the time $t_0$ may be evaluated at the later time $t_1$ in order to adjust the AC resistances based on the evaluation results. Consequently, even when the state of the plasma processing unit is varied over time, an increase in power losses, i.e., the power other than the power effectively consumed in the plasma processing space, can be prevented.

Thus, whether the plasma processing unit maintains the required level of performance at the time of installation after disassembly and transfer, after repeating plasma processes, or at the time of adjustment or maintenance can be evaluated. When the plasma processing apparatus having a plurality of plasma processing units is evaluated, variation in performance of the plasma processing units can be evaluated. When applied to a deposition apparatus, whether desired layer characteristics such as layer thickness, isolation voltage, and etching rate are obtained in these plasma processing units under the same deposition conditions can be evaluated.

Since the AC resistances RA and RB can be instantaneously measured, the time required for evaluation can be significantly reduced compared to a conventional inspection method requiring actual deposition on substrates. Furthermore, the cost of the substrates for inspection, the cost of inspecting the substrates, and labor cost for the workers involved in the inspection procedure can be reduced.

In this evaluation method for the plasma processing apparatus, the performance of the plasma processing apparatus can be instantaneously evaluated at low costs. When the plasma processing apparatus includes a plurality of the plasma processing units, the AC resistances RA and RB are measured for each of the plasma processing units and are optimized at the time $t_0$ so as to eliminate the difference among these units. Thus, when the same process recipe is applied to these plasma processing units at the later time $t_1$, substantially the same plasma process results can be obtained. When a deposition process is performed in such a plasma processing apparatus, layers having substantially the same layer characteristics such as layer thickness, isolation voltage, and etching rate, can be continuously obtained.

According to the maintenance method of the present invention, the performance evaluation can be instantaneously obtained with low costs. Thus, the performance evaluation can be performed as often as required and the evaluation results can be immediately reflected to perform corrective action.

According to the performance management system for the plasma processing apparatus of the present invention, the customer can easily access the performance evaluation results and variation among plasma processing units through the server administered by the supplier such as manufacturer.

According to the plasma processing apparatus of this invention, the performance of the plasma processing apparatus is maintained at the required level by using the parameter such as the AC resistances RA and RB which can be readily inspected. Thus, satisfactory plasma processes can be continuously performed.

According to the performance validation system of the plasma processing apparatus of this invention, the customer can easily know the state of the operation and performance of the plasma processing apparatus through the server administered by the maintenance engineer.

All of the aspects of the present invention described above contribute to preventing performing defective plasma process and to maintaining the performance of the plasma processing apparatus at the required level.

Moreover, substantially the same process results can be obtained by applying the same process recipe when the same plasma treatment is repeated. That is, when a deposition process is performed in the plasma processing apparatus, the layers of substantially the same layer characteristics such as thickness, isolation voltage, and etching rate, can be continuously deposited.

When the plasma processing apparatus includes a plurality of plasma processing units or when a plurality of plasma processing apparatus is integrated into one plasma processing system, the AC resistances RA and RB as parameters can be determined for each of the plasma processing unit.

Next, the measured region of the matching circuit constituting the plasma processing unit is explained.

The matching circuit has its input terminal connected to the radiofrequency generator via the radiofrequency supplier (feed line) and its output terminal connected to the electrode via the radiofrequency feeder (feed plate). A ground potential portion is connected between these input and output terminals. In measuring the radiofrequency characteristics, the matching circuit is detached from the rest of the plasma processing unit at the input terminal and the output terminal. Thus, the measured region for the input-terminal-side AC resistance RA is from the input terminal to the ground potential portion. The measured region for the output-terminal-side AC resistance RB is from the output terminal to the ground potential portion. The input-terminal-side AC resistance RA is measured from the first measuring point corresponding to the input terminal of the matching circuit, and the output-terminal-side AC resistance RB is measured from the third measuring point corresponding to the output terminal of the matching circuit, as described above.

In this manner, the AC resistance of the whole matching circuit, i.e., from the input terminal to the output terminal, can be measured.

When the input-terminal-side AC resistance RA is measured from the first measuring point as described above, the performance of the plasma processing apparatus including the matching circuit optimized once at the time $t_0$ may be adjusted at the later time $t_1$ in order to adjust the AC resistances based on the evaluation results. Consequently, even when the state of the plasma processing unit is varied over time, an increase in power losses, i.e., the power other than the power effectively consumed in the plasma processing space, can be prevented. Thus, variation in the radiofrequency characteristics over time can be eliminated, and the effective power consumed in the plasma generating space can be made substantially uniform over time. In a plasma treatment, plasma process results will remain substantially the same over time when the same process recipe is applied compared to the case in which the matching circuit is not included in the measured region. In the plasma processing apparatus having plural plasma processing units, the variation over time in the radiofrequency characteristics of the plasma processing units including the matching circuits can be minimized, and the effective power consumed in the plasma generating spaces of these units can be made substantially uniform. When the same process recipe is used in these units, the plasma process results will be substantially the same.

Instead of the above-described first measuring point, the input-terminal-side AC resistance RA can be measured at the second measuring point corresponding to the input end of the radiofrequency supplier. In this manner, the radiofrequency characteristics of not only the matching circuit but also the radiofrequency supplier (feed line) can be considered. Thus, variation over time in the radiofrequency characteristics of the matching circuit and the feed line can be minimized, and the effective power consumed in the plasma generating space of the plasma processing unit can be further made uniform over time. In a plasma treatment, uniformity over time in plasma process results can be further improved under the same process recipe compared to the case where the feed line is not included in the measured region. When applied to a plasma processing apparatus having plural plasma processing units, variation over time in the radiofrequency characteristics of the plasma processing units including the feed lines can be minimized, and the effective power consumed in the plasma generating spaces can be made further uniform. Uniformity in the plasma process results under the same process recipe is further improved compared to the case in which the feed line is not included in the measured region.

In this evaluation method, the output-terminal-side AC resistance RB may be measured at the third measuring point corresponding to the output terminal of the matching circuit. In this manner, the AC resistances as the radiofrequency characteristics of the plasma processing unit including the matching circuit can be adjusted at the time $t_0$, evaluated at the later time $t_1$, and readjusted based on the evaluation results. Thus, even when the performance of the plasma processing unit is changed over time, an increase in power losses, i.e., the power other than the power consumed in the plasma generating space, due to change in the AC resistance can be eliminated. Consequently, the radiofrequency characteristics remain unchanged over time, and the effective power consumed in the plasma generating space can be made substantially uniform over time. The same process recipe can be used to obtain substantially the same process results over time. When applied to the plasma processing apparatus having plural plasma processing units, variation over time in the radiofrequency characteristics of the plasma processing units including the matching circuits can be eliminated, and the effective power consumed in each of the plasma processing space can be made substantially uniform over time. Thus, substantially the same plasma processing results can be obtained over time by using the same process recipe.

In this performance evaluation method, the output-terminal-side AC resistance RB may be measured at the fourth measuring point corresponding to the output end of the radiofrequency feeder (feed plate) instead of the above-described third measuring point. Since the feed plate is included in the measured region, variation over time in the radiofrequency characteristics of not only the matching circuit but also the feed plate can be eliminated, and the effective power consumed in the plasma generating space can be further made uniform over time. For example, in performing a plasma treatment, substantially the same plasma process results can be obtained over time by applying the same process recipe. When the method is applied to a plasma processing apparatus having a plurality of plasma processing units, variation over time in the radiofrequency characteristics of these units can be eliminated, and effective power consumed in the plasma generating spaces of these units can be made substantially uniform. When the same process recipe is applied to these units, the plasma process results will have an improved uniformity compared to the case in which the feed plate is not included in the measured region.

In the above-described evaluation (hereinafter referred to as "Evaluation Standard 1"), the upper limits for the AC resistances $\Delta RA$ and $\Delta RB$ can be any values. Preferably, the upper limit for input-terminal-side AC resistance RA is 0.5 times $RA_0$, and the upper limit for output-terminal-side AC resistance RB is 0.5 times $RB_0$. When applied to a plasma-enhanced CVD apparatus, variation in the deposition rate can be kept within ±7% each time the plasma treatment is repeated.

More preferably, the upper limit for the input-terminal-side AC resistance RA is 0.4 times $RA_0$, and the upper limit for the output-terminal-side AC resistance RB is 0.4 times $RB_0$. When applied to a plasma-enhanced CVD apparatus, variation in the deposition rate can be kept within ±3%.

Preferably, the AC resistances RA and RB are measured at the frequency of the radiofrequency generator. In this manner, variation in the radiofrequency characteristics at the frequency for exciting a plasma can be eliminated, and the plasma processing unit can be maintained at the required level of the performance indicated by radiofrequency characteristics such as AC resistance. Thus, uniformity over time in the effective power consumed in the plasma generating space can be improved.

The radiofrequency characteristics of the plasma processing unit at the plasma excitation frequency are directly reflected in the resistance R compared to the impedance Z, since the impedance Z is a vector quantity defined by the resistance R and the reactance X.

Furthermore, in the evaluation method of this invention, another evaluation standard (hereinafter referred to as "Evaluation Standard 2") may also be used. Evaluation Standard 2 is effective for evaluating a plasma processing apparatus having plural plasma processing units or a plasma processing system incorporating a plurality of the plasma processing apparatuses. In evaluating the plasma processing apparatus according to Evaluation Standard 2, a variation <RA> is defined by equation (14A) below:

$$<RA> = (RA_{max} - RA_{min})/(RA_{max} + RA_{min}) \tag{14A}$$

wherein $RA_{max}$ and $RA_{min}$ are the maximum and minimum values, respectively, of the AC resistances RA in the matching circuits of the plurality of plasma processing units measured from the input-terminal-side of the matching circuits. A variation <RB> is defined by equation (14B) below:

$$<RB> = (RB_{max} - RB_{min})/(RB_{max} + RB_{min}) \quad (14B)$$

wherein $RB_{max}$ and $RB_{min}$ are the maximum and minimum values, respectively, of AC resistances RB in the matching circuits of the plurality of plasma processing units measured from the output-terminal-side of the matching circuits. The variations <RA> and <RB> are determined at the time $t_0$ and at the later time $t_1$ and are maintained to be less than prescribed upper limits. In this manner, variation in the AC resistances of the plasma processing units contributing to the impedance can be eliminated among the plasma processing units, and the plasma processing units can be maintained within the required performance level indicated by the impedance characteristics. Thus, the effective power consumed in the plasma generating spaces of these plasma processing units can be made substantially uniform.

Consequently, substantially the same plasma process results can be obtained from these plasma processing units by applying the same process recipe. When applied to a deposition apparatus, deposited layers will exhibit substantially the same layer characteristics such as layer thickness, isolation voltage, and etching rate.

The AC resistance is the radiofrequency characteristic mainly determined by the mechanical structure of the plasma processing units; accordingly, different plasma processing units have different AC resistances. By adjusting the AC resistances in these units as above, the overall radiofrequency characteristics of the plasma processing units which have never been considered in the conventional art can be optimized, and plasmas can be generated stably. As a result, stability of the plasma processing apparatus or system will be improved.

Moreover, when the variations <RA> and <RB> are adjusted to be less than 0.4, variations in the radiofrequency characteristics of the plasma processing units, such as impedance, AC resistance as the real part of the impedance, resonant frequency characteristics, and capacitance can be minimized, and the plasma processing units can be maintained at a required level indicated by the AC resistance. Thus, the effective power consumed in the plasma generating spaces of the plasma processing units can be made substantially uniform.

Consequently, substantially the same plasma process results can be obtained in these plasma processing units by applying the same process recipe. When applied to a deposition apparatus, the deposited layers will exhibit substantially the same layer characteristics such as layer thickness, isolation voltage, and etching rate. More particularly, when the variations <RA> and <RB> are adjusted to be less than 0.4, the variation in the thickness of the layers deposited in these plasma processing units under the same conditions can be kept within ±3%.

In the evaluation method of the present invention, Evaluation Standards 1 and 2 may be used in combination. Such a combination is suitable for maintaining the plasma processing apparatus at the required operational level and for evaluating the performance of the plasma processing apparatus having a plurality of the plasma processing units. In other words, the evaluation method using such a combination is suitable for minimizing variations in the radiofrequency characteristics such as AC resistances RA and RB among plural plasma processing units.

In this evaluation method, the matching circuit may further include at least one connection point for connecting the matching circuit to the ground potential portion, and the AC resistances $RA_0$, $RA_1$, $RB_0$, and $RB_1$ may be measured for each of the connection points by sequentially switching the connection points so that only one of the connection points is connected to the ground potential portion.

In this manner, even when the matching circuit has a plurality of the connection points, the measured region is determined for each of the connection points, and the AC resistances RA and RB which are measured for each of the measured region having different passive elements are optimized at the time $t_0$ and at the time $t_1$. Thus, the power consumed in the plasma generating space of the plasma processing unit can be made substantially uniform over time.

It should be noted that the largest variation among the variations calculated from $RA_0$, $RB_0$, $RA_1$, and $RB_1$ measured by switching these connection points is preferably set to be less than the above-described upper limit.

Another aspect of the present invention provides the performance management system for the plasma processing apparatus, as described above. The performance management system evaluates the performance of the plasma processing apparatus and determines whether the performance at the time $t_0$ is maintained at the later time $t_1$. More particularly, when the plasma processing apparatus is first installed at the customer site, the supplier of the plasma processing apparatus or system such as the manufacturer, distributor, or maintenance engineer, disassembles the plasma processing apparatus for the purpose of delivery, and reassembles the plasma processing apparatus at the customer site. The system evaluates at the time $t_1$ whether the plasma processing apparatus after reassembly maintains the required level of the performance. Also, the system evaluates at the time $t_1$ the plasma processing apparatus already in use.

The server in this management system is administered by the supplier such as the manufacturer, distributor, or maintenance engineer of the plasma processing apparatus or system and may be located at any desired place. The server stores data on the AC resistances $RA_0$ and $RB_0$ measured before the disassembly of the plasma processing apparatus and evaluates the performance of the plasma processing apparatus located at the customer site based on these AC resistances $RA_0$ and $RB_0$.

The AC resistances $RA_0$ and $RB_0$ may be standard values controlled by the manufacturer or may be unique to the individual plasma processing apparatus or unit with an identification number. The server storing unique $RA_0$ and $RB_0$ can evaluate the individual plasma processing apparatus or unit more precisely, and the management system having such a server will have an improved accuracy.

It should be noted here that the identification number of the plasma processing apparatus or unit refers to any type of number, character, or combination thereof, which can specify the plasma processing apparatus or unit. For example, if a plasma processing apparatus has one plasma processing unit, the serial number of the plasma processing apparatus may be used as the identification number of the plasma processing unit. If a plasma processing apparatus has a plurality of plasma processing units or a plasma processing system has a plurality of plasma processing apparatuses, each of the plasma processing units constituting the apparatus or system will be provided with the identification number.

The server is linked to the customer I/O device via a communication line. No limit is imposed as to the media or the types of the communication line used as long as the server can communicate with the customer I/O device at a remote location. Examples of the communication medium are various wire and wireless communication media such as cable lines, optical fiber lines, and satellite channels. Examples of the type of the communication line are telephone network and the Internet. Also, no limit is imposed as to the customer I/O device or to the input device. Examples of the input device are personal computers, dedicated terminals, and telephone set. The customer I/O device used in the performance management system employing Evaluation Standard 2 needs input function only but may have both input and output functions.

The server receives from the customer I/O device the AC resistances $RA_1$ and $RB_1$ measured after the installation (reassembly) of the plasma processing apparatus. The identification number of the plasma processing apparatus or unit may be received with $RA_1$ and $RB_1$ if necessary. Herein, "after the installation" is not limited to the time immediately after the installation but also to the subsequent period of using the plasma processing apparatus. In other words, the server continuously receives the AC resistances $RA_1$ and $RB_1$ from the customer I/O device as the values which reflect the performance of the plasma processing apparatus or system installed at the customer site. In the performance management system using Evaluation Standard 1, the server stores the AC resistances $RA_0$ and $RB_0$ as the basis for evaluation. This server may also receive the AC resistances $RA_1$ and $RB_1$ and the identification number of the plasma processing apparatus or unit in which these resistances are measured.

In order to transmit the AC resistances $RA_1$ and $RB_1$ and the identification number of the plasma processing apparatus or unit to the server, the user of the plasma processing apparatus or the maintenance engineer visiting the customer may manually input these values through the customer I/O device. This manual operation may be automated. For example, a meter for measuring the AC resistance connected to the plasma processing apparatus or system may be provided to directly send $RA_1$, $RB_1$, and the identification number to the server. If a customer uses a single plasma processing apparatus having a single plasma processing unit, the customer may register the identification number of the plasma processing apparatus onto the customer I/O device to omit input operation of the identification number thereafter.

The arithmetic processing unit of the server calculates the absolute values of the difference $\Delta RA$ between $RA_0$ and $RA_1$ and the difference $\Delta RB$ between $RB_0$ and $RB_1$. When both absolute values are less than their upper limits, a signal indicating that the required level of the performance is satisfied (evaluation information) is sent from the server to the customer I/O device. When at least one of the absolute values is not less than its prescribed upper limit, a signal indicating that the required level of the performance is not satisfied (evaluation information) is sent form the server to the customer I/O device. In other words, the evaluation information can be received at the customer I/O device and thus the customer can immediately know the performance evaluation results of the plasma processing apparatus or unit. The evaluation results may be conveyed to the user by means of message on the display, by means of printing, by means of alarm signals, or the like.

This server may have, as described above, the output device located at the site of the supplier so that the maintenance command as the evaluation information is output through this output device when at least one of the absolute values of $\Delta RA$ and $\Delta RB$ is not less than its prescribed upper limit. Preferably, the identification number of the relevant plasma processing unit is output together with the maintenance command. Thus, the supplier can immediately detect the defects in the plasma processing apparatus or system and can rapidly provide maintenance services.

When the server is not located at the site of the supplier, a suitable communication line is provided to connect the server to the output device.

When the evaluation information is provided to both the customer I/O device and the output device located at the site of the supplier, the upper limits as the basis for the evaluation information need not be the same between the customer I/O device and the output device at the site of the supplier. For example, the upper limit of the absolute value of $\Delta RA$ may be set at 0.5 times $RA_0$ for the customer I/O device and at 0.4 times $RA_0$ for the output device located at the site of the supplier so that the maintenance command is output when the absolute value is not less than these upper limits. By using a tighter evaluation standard at the output device at supplier site than at the customer I/O device, the maintenance service may be provided to the customer before the performance of the plasma processing apparatus significantly varies. Thus, the maintenance service will be preventive.

The present invention also provides another performance management system for the plasma processing apparatus, as described above. This performance management system also evaluates the performance of the plasma processing apparatus and determines whether the performance at the time $t_0$ is maintained at the later time $t_1$. More particularly, when the plasma processing apparatus is first installed at the customer site, the supplier of the plasma processing apparatus or system such as the manufacturer, distributor, or maintenance engineer, disassembles the plasma processing apparatus for the purpose of delivery, and reassembles the plasma processing apparatus at the customer site. The system evaluates at the time $t_1$ whether the plasma processing apparatus after reassembly maintains the required level of the performance. Also, the system evaluates at the time $t_1$ the plasma processing apparatus already in use.

This performance management system differs from the preceding performance management system in that the server stores information on registered service engineers according to fault levels and includes the output device located at the site of the supplier. The server calculates the absolute values of $\Delta RA$ and $\Delta RB$ and, when at least one of these values falls within a certain fault level, the server outputs from the output device the relevant fault level, information of the service engineers corresponding to that fault level, and a maintenance command.

In this performance management system, the maintenance command, the relevant fault level, and the information on the service engineers corresponding to that fault level are output at the site of the supplier.

In this performance management system, the fault level of the plasma processing apparatus installed at the place remote from the supplier can be detected by the supplier. Furthermore, service engineers having suitable skills can be dispatched to the customer. Thus, engineers can be efficiently distributed, and rapid yet adequate maintenance can be provided.

In the performance management system using Evaluation Standard 2, the server is provided with an output device. No limit is imposed as to the location of this output device. Preferably, the output device is at the place from which the maintenance service is provided, such as the site of the manufacturer, the service center, or the like. When the server and the output device are distant from each other, a desired communication is used to link the server and the output device.

The server evaluates the plasma processing apparatus by using Evaluation Standard 2. When the evaluation result does not satisfy the required level, the server outputs from the output device a maintenance command, the variation <RA> between the maximum value $RA_{max}$ and the minimum value $RA_{min}$, the variation <RB> between the maximum value $RB_{max}$ and the minimum value $RB_{min}$, and the identification numbers of the relevant plasma processing units.

In order for the server to evaluate a plurality of the plasma processing units according to Evaluation Standard 2, the server receives from the customer I/O device the AC resistances $RA_1$ and $RB_1$ measured after the installation of the plasma processing apparatus. Herein, "after the installation" refers not only to immediately after the reassembly but to the subsequent period of use. The server continuously receives the AC resistances $RA_1$ and $RB_1$ which reflect the performance of the plasma processing apparatus or system.

Moreover, the server receives the AC resistances $RA_1$ and $RB_1$ along with the identification of the plasma processing apparatus or unit in which $RA_1$ and $RB_1$ are measured.

After the server receives all the values of $RA_1$ of the plasma processing units in the plasma processing apparatus or system, the server specifies the maximum value $RA_{1max}$, the minimum value $RA_{1min}$, and the identification numbers of the relevant plasma processing units or apparatuses to calculate the variation <$RA_1$> using equation (14A) above. When the variation <$RA_1$> is not less than the upper limit, a maintenance command and the identification number of the relevant plasma processing units or plasma processing apparatuses are output through the output device. The server also receives all the values of $RB_1$ of the plasma processing units in the plasma processing apparatus or system, specifies the maximum value $RB_{1max}$, the minimum value $RB_{1min}$, and the identification numbers of the relevant plasma processing units or apparatuses to calculate the variation <$RB_1$> using equation (14B) above. When the variation <$RB_1$> is not less than the upper limit, a maintenance command and the identification numbers of the relevant plasma processing units or plasma processing apparatuses are output through the output device.

In this manner, malfunctioning of the plasma processing apparatus or system at the customer site can be readily detected by the service engineer and the maintenance service can be readily provided.

In this system, the customer can browse via a public line the performance information indicating the operation and performance of the plasma processing units uploaded by the maintenance engineer. Thus, the information on the performance, operation, and maintenance of the plasma processing apparatus or system is readily available to the customer who is already using the plasma processing apparatus. Also, in this system, a customer considering of purchasing the plasma processing apparatus can be provided with the information which serves as the basis for making purchasing decisions. Moreover, because the performance information includes radiofrequency characteristics such as the AC resistance RA and RB, and the variations <RA> and <RB> measured at the time $t_0$ and the later time $t_1$ as the performance parameters of the plasma processing apparatus or system, the customer can immediately evaluate the plasma processing apparatus or system in use. The customer who is considering of purchasing the plasma processing apparatus can be provided with the basis for making purchasing decisions. The performance information may be output as a catalog or a specification document.

In the present invention, the radiofrequency characteristics A between the impedance meter and the plasma processing units during measurement of the AC resistances RA and RB may be arranged to be the same. In this manner, the observed values of the AC resistances and impedance can be regarded equivalent to those measured at the respective measuring point described above; hence, the radiofrequency characteristics such as the AC resistances and impedances can be determined without conversion or correction. The efficiency of the operation is also improved.

In operation, the lengths of the coaxial cables connecting the measuring points to the impedance meter are set to be the same among the plasma processing units, for example.

In the plasma processing system of this invention, at least one plasma processing apparatus is provided.

The number of the plasma processing units provided in one plasma processing apparatus, or the number of the plasma processing apparatuses provided in one plasma processing system may be set as desired.

The plasma processing apparatus of this system may use different process recipes for different processes. In such a case, the setting conditions of the radiofrequency characteristics such as the AC resistances RA and RB may be different among the plasma processing apparatuses of the plasma processing system.

This invention can be applied to a dual-frequency plasma-enhanced CVD unit including: a first radiofrequency generator; a radiofrequency electrode connected to the first radiofrequency generator; a radiofrequency-generator-side matching circuit for matching impedances of the first radiofrequency generator and the radiofrequency electrode; a second radiofrequency generator; a susceptor electrode for supporting a substrate to be treated, the susceptor electrode being arranged to oppose the radiofrequency electrode and being connected to the second radiofrequency generator; and a susceptor-electrode-side matching box having another matching circuit for matching the impedances of the second radiofrequency generator and the susceptor electrode. In this unit, the radiofrequency characteristics such as AC resistance of the matching circuit at the susceptor electrode side are set to be the same as the above-described matching circuit connected to the plasma excitation electrode.

BRIEF DESCRIPTION OF THE DRAWINGS

FIG. 33 shows an output form of a subpage CP4 in accordance with the performance validation system of the plasma processing apparatus of the present invention;

DESCRIPTION OF THE PREFERRED EMBODIMENTS

First Embodiment

Now, a plasma processing apparatus according to a first embodiment of the present invention will be described with reference to the drawings.

Figure 1:
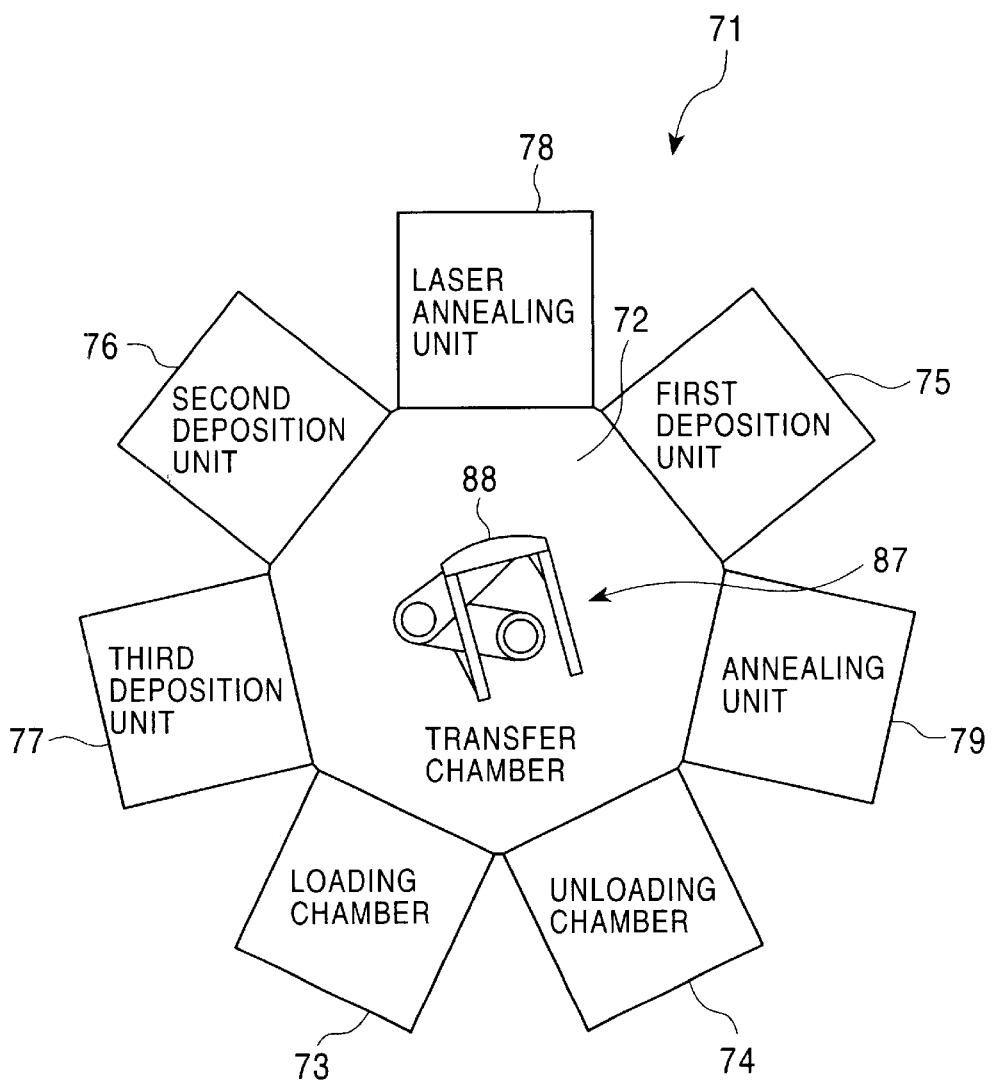
FIG. 1 is a schematic diagram showing the overall structure of a plasma processing apparatus according to a first embodiment of the present invention.

FIG. 1 is a diagram showing the configuration of a plasma processing apparatus 71 according to a first embodiment of the present invention. The plasma processing apparatus 71 comprises a plurality of processing units suitable for consecutive processing, for example, from depositing a polysilicon film as a semiconductor active film to depositing a gate insulating film of top-gate TFTs.

In this plasma processing apparatus 71, five processing units, one loading chamber 73, and one unloading chamber 74 are continuously arranged around a substantially heptagonal transfer chamber 72. The five processing units are a first deposition unit 75 for depositing an amorphous silicon film, a second deposition unit 76 for depositing a silicon oxide film, and a third deposition unit 77 for depositing a silicon nitride film, a laser annealing unit 78 for annealing a processed substrate after deposition, and an annealing unit 79 for performing a heat treatment of the processed substrate.

The first, second, and third deposition units 75, 76, and 77 having substantially the same structure may be used either for depositing different types of films or for performing the same treatment using the same process recipe. In each of the first to third deposition units 75 to 77, an absolute value $|\Delta RA|$ of a difference $\Delta RA$ between an AC resistance $RA_0$ at a time $t_0$ and an AC resistance $RA_1$ at a later time $t_1$ in the matching circuit, the AC resistances $RA_0$ and $RA_1$ being measured from the input-terminal-side of the matching circuit, is maintained to be less than a prescribed upper limit, and an absolute value $|\Delta RB|$ of a difference $\Delta RB$ between an AC resistance $RB_0$ at a time $t_0$ and an AC resistance $RB_1$ at the later time $t_1$ in the matching circuit, the AC resistances $RB_0$ and $RB_1$ being measured from the output-terminal-side of the matching circuit, is maintained to be less than another prescribed upper limit. Herein, the later time $t_1$ is, for example, a time after the reassembly of the plasma processing apparatus disassembled for the purpose of delivery and during subsequent period of use.

Moreover, a variation <RA> in the AC resistance RA measured from the input-terminal-side among matching circuits 2A (FIG. 2) of the first, second, and third deposition units 75, 76, and 77, defined by relationship (14A) below wherein $RA_{max}$ is the maximum value and $RA_{min}$ is the minimum value is less than a predetermined value:

$$<RA> = (RA_{max} - RA_{min})/(RA_{max} + RA_{min}) \quad (14A)$$

Furthermore, a variation <RB> in the AC resistance RB measured from the output-terminal-side among matching circuits 2A (FIG. 2) of the first, second, and third deposition units 75, 76, and 77, defined by relationship (14B) below wherein $RB_{max}$ is the maximum value and $RB_{min}$ is the minimum value is less than a predetermined value:

$$<RB> = (RB_{max} - RB_{min})/(RB_{max} + RB_{min}) \quad (14A)$$

$$<RB> = (RB_{max} - RB_{min})/(RB_{max} + RB_{min}) \quad (14B)$$

Now, the structure of the plasma processing unit will be described using the first deposition unit 75 as an example.

Figure 2:
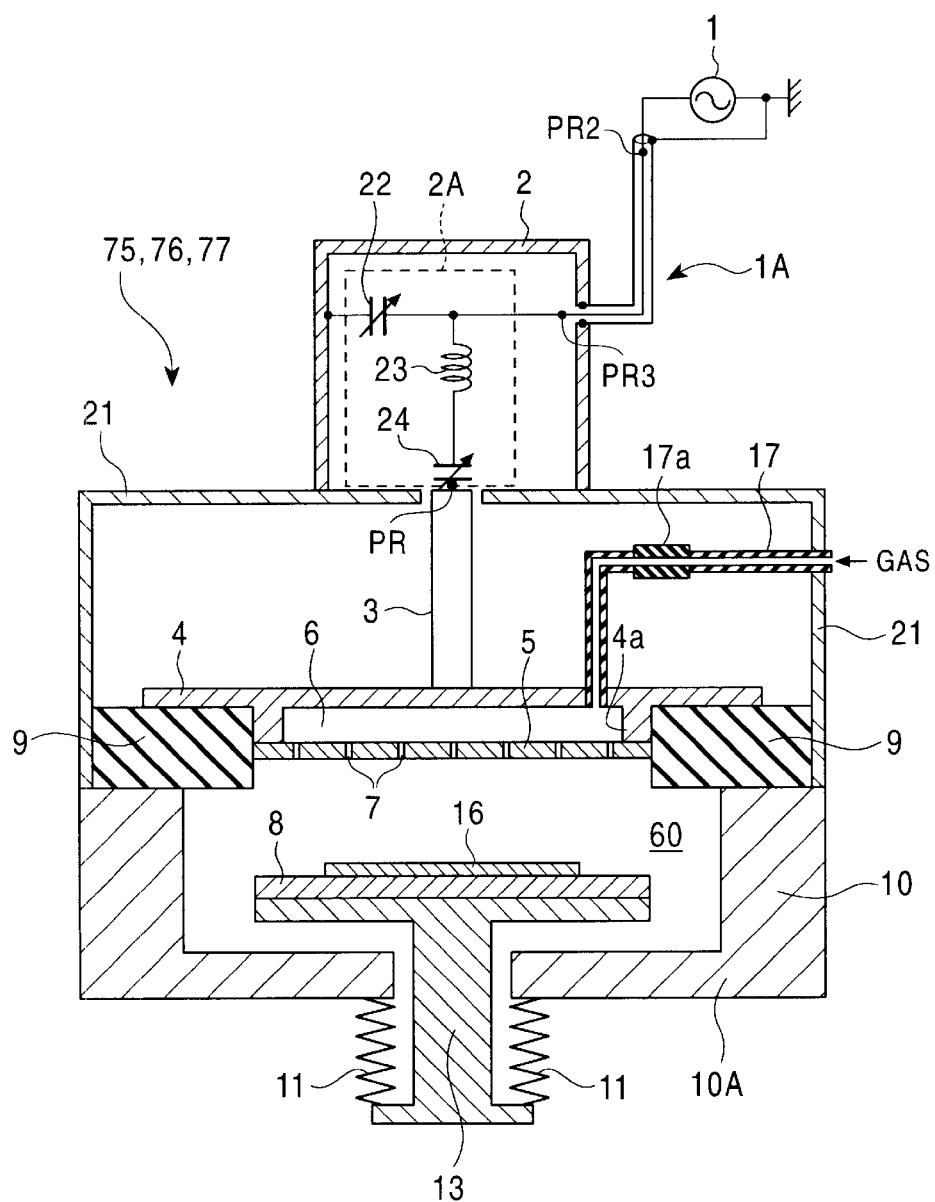
FIG. 2 is a cross-sectional view showing an overall structure of a plasma processing unit shown in FIG. 1.
Figure 3:
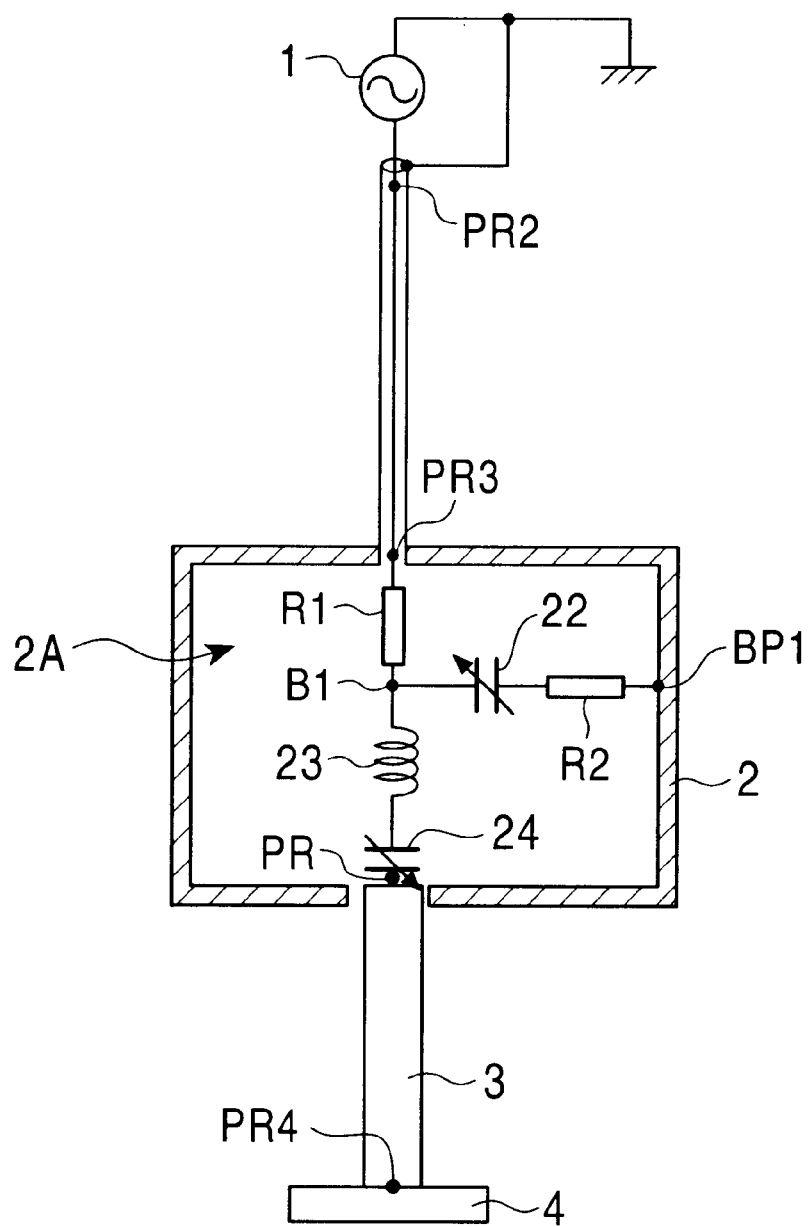
FIG. 3 is a schematic diagram of a matching circuit of the plasma processing unit shown in FIG. 2.

FIG. 2 is a cross-sectional view showing an overall structure of the plasma processing unit of this invention. FIG. 3 illustrates a matching circuit of the plasma processing unit shown in FIG. 2.

To describe in greater detail, in the first deposition unit 75, a shower plate 5 and a plasma excitation electrode 4 connected to a radiofrequency generator 1 are provided above a plasma processing chamber 60, and a susceptor electrode 8 for holding a substrate 16 is disposed in the lower portion of the plasma processing chamber 60 so as to oppose the shower plate 5, as shown in FIGS. 2 and 3. The plasma excitation electrode 4 is connected to the radiofrequency generator 1 through a feed plate 3 and a matching circuit 2A. The plasma excitation electrode 4 and the feed plate 3 are covered by a chassis 21, and the matching circuit 2A is accommodated inside a matching box 2.

A silver-plated copper plate 50 to 100 mm in width, 0.5 mm in thickness, and 100 to 300 mm in length is used as the feed plate 3. The feed plate 3 is detachably attached to an output terminal of a tuning capacitor 24 in the matching circuit 2A and to the plasma excitation electrode 4 by fixing means such as screws.

An annular projection 4a is provided on the bottom face of the plasma excitation electrode 4. The projection 4a comes into contact with the shower plate 5 having many holes 7 under the plasma excitation electrode 4. The plasma excitation electrode 4 and the second ferromagnetic layer 5 define a space 6 to which a gas feeding tube 17 extending through the side wall of the chassis 21 and through the plasma excitation electrode 4 is connected.

The gas feeding tube 17 is composed of a conductor, and an insulator 17a is provided midway inside the chassis 21 to insulate between the plasma excitation electrode 4 and the gas source.

The gas introduced from the gas feeding tube 17 is fed into the plasma processing chamber 60 surrounded by a chamber wall 10 through the many holes 7 in the shower plate 5. The chamber wall 10 and the plasma excitation electrode 4 are isolated from each other by an insulator 9. Note that in FIG. 2, the exhaust system connected to the plasma processing chamber 60 is omitted from the drawing.

The susceptor electrode 8 for holding the substrate 16 disposed in the plasma processing chamber 60 is of a disk shape and functions as another plasma excitation electrode.

A shaft 13 is joined to the bottom center of the susceptor electrode 8 and extends through a chamber bottom 10A. The lower end of the shaft 13 and the center portion of the chamber bottom 10A are hermetically connected by a bellows 11. The susceptor electrode 8 and the shaft 13 are vertically movable by the bellows 11 to control the distance between the plasma excitation electrode 4 and the susceptor electrode 8.

Since the susceptor electrode 8 and the shaft 13 are connected to each other as in FIG. 2, the susceptor electrode 8, the shaft 13, the bellows 11, the chamber bottom 10A, and the chamber wall 10 have the same DC potential. Moreover, because the chamber wall 10 and the chassis 21 are connected to each other, the chamber wall 10, the chassis 21, and the matching box 2 have the same DC potential.

The matching circuit 2A in most cases includes a plurality of passive elements in order to adjust impedance in response to the change in the plasma state inside the plasma processing chamber 60.

As shown in FIGS. 2 and 3, the matching circuit 2A is connected between the radiofrequency generator 1 and the feed plate 3 and comprises as the passive elements an inductance coil 23, a tuning capacitor 24 comprising an air-variable capacitor, and a load capacitor 22 comprising a vacuum-variable capacitor. The matching circuit 2A also includes conductors R1 and R2 made of copper plates for connecting these passive elements.

The conductor R1, the inductance coil 23, and the tuning capacitor 24 are connected in series in that order from the input terminal side of the matching circuit 2A to the output terminal side of the matching circuit 2A. The load capacitor 22 is connected to these elements in parallel at a branching point B1 between the conductor R1 and the inductance coil 23. The inductance coil 23 and the tuning capacitor 24 are directly connected to each other without a conductor, and one end of the load capacitor 22 is connected to the matching box 2 (ground potential portion) through the conductor R2 at a connection point BP1.

Herein, the tuning capacitor 24 is the last stage among the passive elements constituting the matching circuit 2A, and the output terminal of the tuning capacitor 24 is the output terminal of the matching circuit 2A. The tuning capacitor 24 is connected to the plasma excitation electrode 4 through the feed plate 3.

The matching box 2 is connected to a shielding line of a feed line (radiofrequency supplier) 1A which is a coaxial cable. Because the shielding line is DC grounded, the susceptor electrode 8, the shaft 13, the bellows 11, the chamber bottom 10A, the chamber wall 10, the chassis 21, and the matching box 2 are all set to the ground voltage. The above-described one end of the load capacitor 22 is thereby also DC grounded.

In the first deposition unit 75, radiofrequency power of 13.56 MHz or more, for example, 13.56 MHz, 27.12 MHz, and 40.68 MHz, may be used to generate a plasma between the plasma excitation electrode 4 and the susceptor electrode 8 to perform a plasma process such as a CVD process, a dry etching process, and an ashing process on the substrate 16 placed on the susceptor electrode 8.

During processing, radiofrequency power from the radiofrequency generator 1 is supplied to the feed line 1A which is a coaxial cable, the matching circuit 2A, the feed plate 3, and the plasma excitation electrode 4. As for the path of the radiofrequency current, the current after going through these elements flows into the plasma processing chamber 60 and to the susceptor electrode 8, the shaft 13, the susceptor shield 12, the bellows 11, the chamber bottom 10A, and the chamber wall 10. Subsequently, the current returns to the ground position of the radiofrequency generator 1 via chassis 21, the matching box 2, and the shielding line of the feed line 1A.

AC resistances RA and RB of the matching circuit 2A as the radiofrequency characteristics of the first deposition unit 75 of this embodiment will now be described.

The AC resistance of the matching circuit 2A measured from the input terminal side of the matching circuit 2A is the AC resistance RA and the AC resistance of the matching circuit 2A measured from the output terminal side of the matching circuit 2A is the AC resistance RB. The frequency for measuring the AC resistance is selected from the range of about 1 to 100 MHz including the power frequency of the radiofrequency generator 1. Preferably, a frequency corresponding to a power frequency $f_e$, i.e., 13.56 MHz, 27.12 MHz, or 40.68 MHz, is used as the frequency for measurement.

Figure 4:
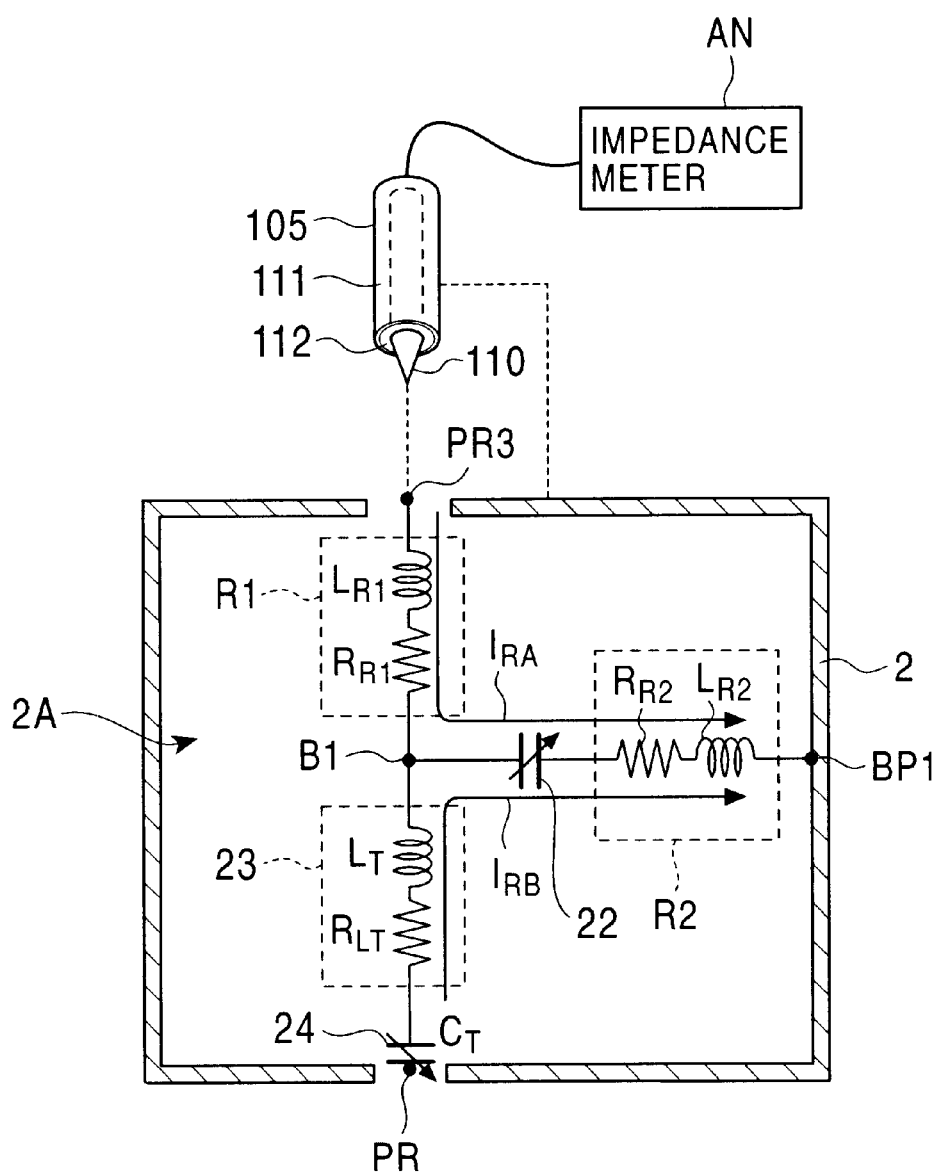
FIG. 4 is a schematic circuit diagram for describing parasitic resistances in the matching circuit shown in FIG. 3.

The AC resistances RA and RB are radiofrequency characteristics mainly determined by the structure of the matching circuit 2A and are measured as in FIG. 4.

Figure 5:
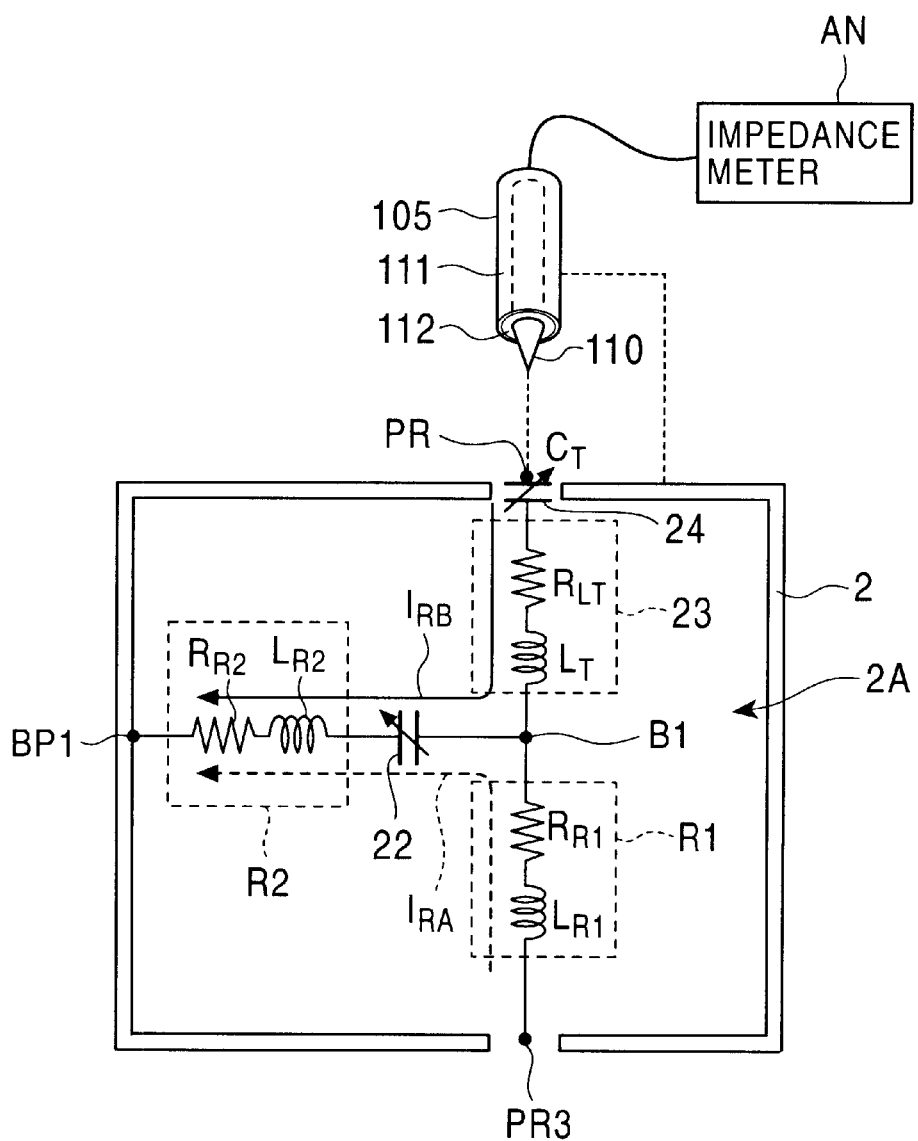
FIG. 5 is a schematic circuit diagram for describing parasitic resistances in the matching circuit shown in FIG. 3.

FIGS. 4 and 5 are schematic circuit diagrams showing parasitic resistance in the matching circuit 2A shown in FIG. 3.

The measured region in the matching circuit 2A according to this embodiment is from a point PR3 corresponding to the position of the input terminal of the passive element located at the first stage of the matching circuit 2A to a point PR which corresponds to the position of the output terminal of the passive element located at the last stage of the matching circuit 2A. As shown in FIG. 4, during the measurement, the feed line 1A is detached from the matching circuit 2A, and the feed plate 3 is detached from the matching circuit 2A at the point PR corresponding to the position of the output terminal of the tuning capacitor 24 by removing screws connecting the matching circuit 2A to the feed plate 3.

As shown by broken lines in FIG. 4, a probe 105 of an impedance meter (RF characteristic meter) AN is connected to a ground position on the matching box 2 (ground potential portion) and to the point PR3. The frequency oscillated by the impedance meter AN is then set to a frequency in the range of 1 to 100 MHz, for example, a frequency equal to the power frequency $f_e$ such as about 40.68 MHz, in order to determine the vector quantity $(Z, \theta)$ of the impedance in the above-described measured region of the matching circuit 2A. The real part in the complex expression of the impedance is calculated therefrom to define the AC resistance RA.

As shown in FIG. 4, the probe 105 comprises a conductive line 110, an insulation coating 112 coating the conductive line 110, and a peripheral conductor 111 covering the insulation coating 112. The probe 105 is connected to the impedance meter AN via a coaxial cable. The conductive line 110 is connected to the point PR3, and the peripheral conductor 111 is connected to the ground position which is the center of the upper face of the matching box 2.

Each of the inductance coil 23, the tuning capacitor 24, the load capacitor 22, and the conductors R1 and R2 constituting the matching circuit 2A has AC resistance and inductance. The AC resistance is defined by these resistances and inductances, and the parasitic resistance that exists in the circuit when the AC current is supplied.

As shown in FIG. 4, the radiofrequency factors contributing to the input-terminal-side AC resistance RA of the matching circuit 2A lying in the circuit indicated by an arrow $I_{RA}$ extending from the point PR3 to the connection point BP1 via the branching point B1 are as follows:

Parasitic resistance $R_{R1}$ in the conductor R1
Inductance $L_{R1}$ in the conductor R1
Capacitance $C_L$ of the load capacitor 22
Parasitic resistance $R_{R2}$ in the conductor R2
Inductance $L_{R2}$ in the conductor R2

As shown in FIG. 4, the parasitic resistance $R_{R1}$ in the conductor R1 and the parasitic resistance $R_{R2}$ in the conductor R2 are measured as the input-terminal-side AC resistance RA of the matching circuit 2A in this embodiment.

Here, the parasitic resistance $R_{R1}$ includes parasitic resistances existing in the circuit $I_{RA}$ during measurement of the input-terminal-side AC resistance RA but not being illustrated in the drawing, such as a resistance from the branching point B1 to the load capacitor 22.

The output-terminal-side AC resistance RB of the matching circuit 2A is measured in a manner similar to the above description. As shown in FIG. 5, the probe 105 of the impedance meter AN is attached to a ground position of the matching box 2 (ground potential portion) and to the point PR. The frequency oscillated by the impedance meter AN is then set to a frequency in the range of 1 MHz to 100 MHz, for example, in order to determine the vector quantity $(Z, \theta)$ of the impedance in the above-described measured region of the matching circuit 2A. The real part in the complex expression of the impedance is calculated therefrom to define the AC resistance RB.

As shown in FIG. 5, the conductive line 110 of the probe 105 is connected to the point PR, and the peripheral conductor 111 of the probe 105 is connected to a ground position of the matching box 2.

As shown in FIG. 5, the radiofrequency factors contributing to the output-terminal-side AC resistance RB of the matching circuit 2A lying on the path indicated by an arrow $I_{RB}$ extending from the point PR to the ground potential portion via the branching point B1 are as follows:

Capacitance $C_T$ of the tuning capacitor 24
Parasitic resistance $R_{LT}$ in the inductance coil 23
Inductance $L_T$ in the inductance coil 23
Capacitance $C_L$ of the load capacitor 22
Parasitic resistance $R_{R2}$ in the conductor R2
Inductance $L_{R2}$ in the conductor R2

Among these factors, as shown in FIG. 5, the parasitic resistance $R_{LT}$ in the inductance coil 23 and the parasitic resistance $R_{R2}$ in the conductor R2 are measured as the output-terminal-side AC resistance RB of the matching circuit 2A.

Note that the parasitic resistance $R_{LT}$ includes parasitic resistances existing in the circuit $I_{RB}$ during measurement of the output-terminal-side AC resistance RB but not being illustrated in the drawing, such as a resistance from the branching point B1 to the load capacitor 22.

In the matching circuit 2A of the first deposition unit 75, the input-terminal-side AC resistance RA and the output-terminal side AC resistance RB are adjusted to be less than prescribed upper limits suitable for operation of the first deposition unit 75. The AC resistances $RA_1$ and $RB_1$ measured after the reassembly of the apparatus previously disassembled for the purpose of delivery, after performance of plasma processes, or after adjustment work such as overhaul, parts replacement, and assembly with alignment, are maintained at such values that the absolute value $|\Delta RA|$ of the difference $\Delta RA$ between $RA_0$ and $RA_1$ in the matching circuit is less than 0.5 times $RA_0$ and the absolute value $|\Delta RB|$ of the difference $\Delta RB$ between $RB_0$ and an $RB_1$ in the matching circuit is less than 0.5 times $RB_0$. Corrective action will be performed when at least one of $|\Delta RA|$ and $|\Delta RB|$ is not less than these upper limits.

Examples of Methods for optimizing the AC resistances RA and RB are:

A. Adjusting the shape, i.e., the length and the width, of the copper plates constituting the conductors R1 and R2.

B. Adjusting the state of assembly of the copper plates constituting the conductors R1 and R2.

C. Plating the copper plates constituting the conductors R1 and R2 with silver.

In the plasma processing apparatus 71 of this embodiment after the reassembly of the apparatus previously disassembled for the purpose of delivery, after performance of plasma processes, or after adjustment work such as overhaul, parts replacement, and assembly with alignment, the absolute value |ΔRA| of the difference ΔRA between $RA_0$ and $RA_1$ in the matching circuit is less than 0.5 times $RA_0$ and the absolute value |ΔRB| of the difference ΔRB between $RB_0$ and an $RB_1$ in the matching circuit is less than 0.5 times $RB_0$. Consequently, even when an event such as those described above which would affect radiofrequency characteristics occurs at a certain time, a variation in the radiofrequency characteristics can be eliminated after that time. Thus, radiofrequency characteristics such as AC resistance, capacitance, and impedance of the first deposition unit 75 can be maintained within the required level, and the effective power consumed in the plasma processing chamber can be made substantially uniform over time.

In the plasma processing apparatus 71 of this embodiment, the second deposition unit 76 and the third deposition unit 77 have substantially the same structure as that of the first deposition unit 75. The AC resistances RA and RB as the radiofrequency characteristics of the second deposition unit 76 and the third deposition unit 77 are also set as in the above description.

More specifically, in the first, second, and third deposition units 75, 76, and 77, the AC resistances RA and RB are measured at a power frequency $f_e$ of 40.68 MHz.

The AC resistances RA and RB are the radiofrequency characteristics mainly determined by the mechanical structure of the circuit and are different among different plasma processing units.

By setting the AC resistances RA and RB in the matching circuit 2A of the first deposition unit 75 as above, a power loss due to resistance which affects the effective power consumption in the plasma generation space between the plasma excitation electrode 4 and the susceptor electrode 8 can be optimized. Here, an impedance Z (Ω) and an inductance X are given by equations (11A) below:

$$Z=R+jX$$

$$X=f(\omega, L, C) \quad (11A)$$

wherein j which stands for $j^2=-1$ is the imaginary unit and ω which stands for $\omega=2\pi f_e$ wherein $f_e$ is a power frequency is an angular frequency. The impedance X is expressed by a function of ω, L, and C.

$$R=Re(Z) \quad (11B)$$

As shown in equation (11B) above, because the real part of the impedance Z is an AC resistance R, the power loss at the matching circuit 2A located at a position closer to the radiofrequency generator 1 than are the electrodes 4 and 8 can be optimized by adjusting the AC resistance RA and RB in the matching circuit 2A. As a result, the resistance R which significantly affects the voltage drop and yields a decrease in plasma generating energy can be optimized, and the state of the first deposition unit 75 can be maintained to be uniform over time.

Next, a variation <RA> in the input-terminal-side AC resistance RA among a plurality of plasma processing units 75, 76 and 77 is defined by equation (14A) below relative to the maximum value $RA_{max}$ and the minimum value $RA_{min}$ selected from among an AC resistance $RA_{75}$ in the first deposition unit 75, an AC resistance $RA_{76}$ in the second deposition unit 76, and an AC resistance $RA_{77}$ in the third deposition unit 77:

$$<RA>=(RA_{max}-RA_{min})/(RA_{max}+RA_{min}) \quad (14A)$$

The value <RA> defined by equation (14A) is then adjusted to be less than 0.5. In adjusting the input-terminal-side AC resistance RA, the above-described Methods A to C can be applied.

Next, a variation <RB> in the output-terminal-side AC resistance RB among a plurality of plasma processing units 75, 76 and 77 is defined as equation (14B) below relative to the maximum value $RB_{max}$ and the minimum value $RB_{min}$ selected from an AC resistance $RB_{75}$ in the first deposition unit 75, an AC resistance $RB_{76}$ in the second deposition unit 76, and an AC resistance $RB_{77}$ in the third deposition unit 77:

$$<RB>=(RB_{max}-RB_{min})/(RB_{max}+RB_{min}) \quad (14B)$$

The value <RB> defined by equation (14B) is then adjusted to be less than 0.5. In adjusting the output-terminal-side AC resistance RB, the above-described Methods A to C for optimizing the AC resistance can be applied.

In these processing units 75, 76, and 77, the substrate 16 is placed on the susceptor electrode 8, and the radiofrequency generator 1 supplies a radiofrequency power to both the plasma excitation electrode 4 and the susceptor electrode 8 while a reactive gas is fed into the plasma processing chamber 60 from the gas feeding tube 17 via the holes 7 to generate a plasma for forming an amorphous silicon layer, a silicon oxide layer, or a silicon nitride layer on the substrate 16.

Figure 6:
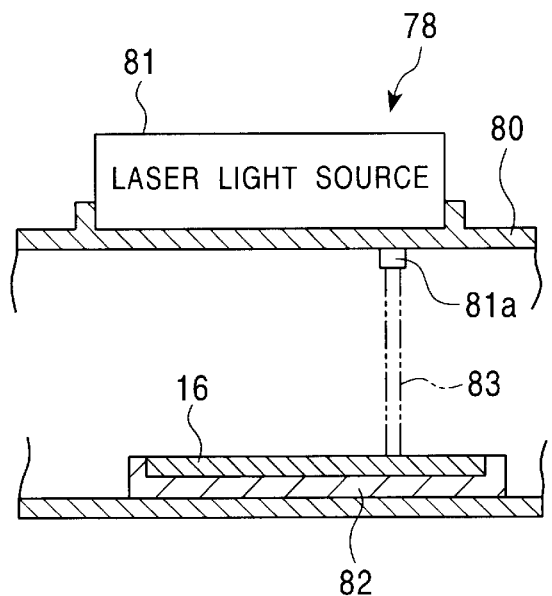
FIG. 6 is a vertical sectional view of a laser annealing unit shown in FIG. 1.

Referring to FIG. 6, the laser annealing unit 78 is provided with a laser light source 81 on the upper wall 80 and a stage 82 for receiving the substrate 16 to be treated on the bottom wall of the chamber. The stage 82 is horizontally movable in the orthogonal X and Y directions. Spot laser light 83 (shown by chain lines) is emitted from an aperture 81a of a laser light source 81, while the stage 82 supporting the substrate 16 horizontally moves in the X and Y directions so that the laser light 83 scans the entire surface of the substrate 16. Examples of the laser light sources 81 are gas lasers using halogen gases, such as XeCl, ArF, ArCl, and XeF.

The laser annealing unit 78 may be of any configuration as long as the spot laser beam from the laser light source Also, in this case, gas lasers using halogen gases, such as XeCl, ArF, ArCl, and XeF can be used as laser light sources. Alternatively, other laser light sources such as a YAG laser may be used depending on the type of the layer to be annealed. Laser annealing may be pulsed laser annealing or continuously oscillating laser annealing. The annealing chamber may be of, for example, a multistage electrical furnace type.

Figure 7:
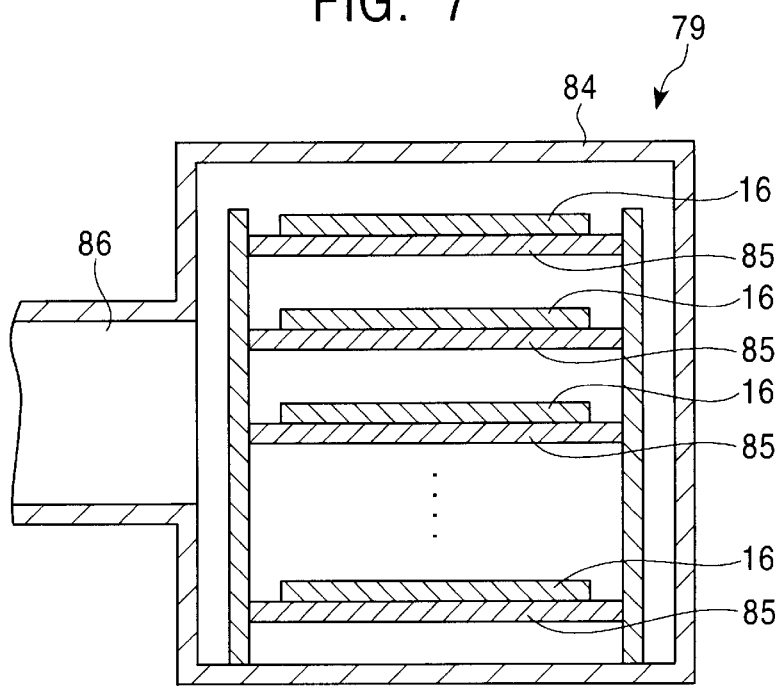
FIG. 7 is a vertical sectional view of a annealing unit shown in FIG. 1.

As shown in FIG. 7, the annealing unit 79 is of a multistage electrical furnace type. In the annealing unit 79, a plurality of substrates 16 is placed on heaters 85 which are vertically arranged in the chamber. These heaters 85 are energized to heat the substrates 16. A gate valve 86 is provided between the annealing unit 79 and the transfer chamber 72.

With reference to FIG. 1, the loading chamber 73 and the unloading chamber 74 are provided with a loading cassette and an unloading cassette, respectively, which are detachable from these chambers. The loading cassette can accommodate a plurality of unprocessed substrates 16 whereas the unloading cassette can accommodate a plurality of processed substrates 16. A transfer robot 87 as means for transferring the substrates 16 is placed in the transfer chamber 72 which is surrounded by the processing units, the loading chamber 73, and the unloading chamber 74. The transfer robot 87 is provided with an arm 88 thereon. The arm 88 has an extendable and retractable link mechanism and can rotate and vertically move. The substrate 16 is supported and transferred with the end of the arm 88.

In this plasma processing apparatus 71, the operations of the components are automatically controlled by a control section, whereas various processing conditions, such as layer deposition conditions, annealing conditions, and heating conditions, and process sequences are set by an operator. In operating the plasma processing apparatus 71, untreated substrates 16 are loaded into the loading cassette, and are transferred from the loading cassette to each processing unit by the transfer robot 87 based on the starting operation by the operator. After the substrates 16 are automatically and sequentially processed in each unit, the substrates 16 are placed in the unloading cassette by the transfer robot 87.

In each of the first to third deposition units 75 to 77 of the plasma processing apparatus 71 of this embodiment after the reassembly of the apparatus previously disassembled for the purpose of delivery, after performance of plasma processes, or after adjustment work such as overhaul, parts replacement, and assembly with alignment, the absolute value $|\Delta RA|$ of the difference $\Delta RA$ between $RA_0$ and $RA_1$ in the matching circuit is less than 0.5 times $RA_0$ and the absolute value $|\Delta RB|$ of the difference $\Delta RB$ between $RB_0$ and an $RB_1$ in the matching circuit is less than 0.5 times $RB_0$. Consequently, when an event, such as above which would affect radiofrequency characteristics occurs at a certain time, the radiofrequency characteristics can be maintained at the same level before and after the event. Thus, radiofrequency characteristics such as AC resistance, capacitance, and impedance of the plasma processing units 75 to 77 can be maintained to be less than prescribed upper limits, and the effective power consumed in these plasma processing units can be made substantially uniform over time.

Moreover, even when an event such as those described above which would affect the radiofrequency characteristics occurs at a certain time, substantially the same plasma process results can be obtained by applying the same process recipe to the first, second, and third deposition units 75, 76, and 77, and the layers formed in these units have substantially the same layer characteristics such as layer thickness, isolation voltage, and etching rate, before and after that time. More particularly, $|\Delta RA|$ less than 0.5 times $RA_0$ and $|\Delta RB|$ less than 0.5 times $RB_0$ will give a variation in the layer thickness in the range of ±7% despite the time interval, i.e., despite disassembly, transfer, and reassembly of the apparatus, regardless of the number of times the apparatus is operated, and despite the performance of adjustment work.

Thus, the overall radiofrequency characteristics of the deposition units 75 to 77 including matching circuits 2A which have never been considered before can be adjusted, and plasmas can be stably generated. The plasma processing apparatus having such plasma processing units will operate stably and uniformly over time.

Also, process conditions can be determined without examining the correlation between the external parameters and the inspection results obtained through a conventional inspection method requiring a step of inspecting the actually treated substrates using an enormous amount of data.

In the first to third deposition units 75 to 77, a variation defined by equation (10A) between the maximum value and minimum value among the values of the input-terminal-side AC resistances RA measured at the point PR3 of the matching circuits 2A and a variation defined by equation (10B) between the maximum value and minimum value among the values of the output-terminal-side AC resistances RB measured at the point PR of the matching circuits 2A are set to be less than 0.5. Thus, differences in radiofrequency characteristics among the first, second, and third deposition units 75, 76, and 77 can be minimized, and the state of the first, second, and third deposition units 75, 76, and 77 can be maintained within a predetermined range indicated by the impedance characteristics. As a result, the effective power consumed in the plasma space can be adjusted to be substantially the same over time among the first, second, and third deposition units 75, 76, and 77.

Moreover, substantially the same plasma process results can be obtained by applying the same process recipe to the first, second, and third deposition units 75, 76, and 77 and the layers formed in these units have substantially the same layer characteristics such as layer thickness, isolation voltage, and etching rate. More particularly, an <RA> and <RB> less than 0.5 among these units will give a variation in the layer thickness in the range of ±7%.

Accordingly, the variation in the planar uniformity of the plasma processing due to the mechanical difference in the plasma processing units can be minimized. When the present embodiment is applied to a deposition process as above, the variation in planar uniformity of the layer thickness distribution due to the mechanical difference among different deposition units can be minimized.

In a deposition process such as a plasma enhanced CVD process or a sputtering process, the variation among the first, second, and third deposition units 75 to 77 in improvements in the conditions of the deposited layers, i.e., the layer characteristics such as the isolation voltage, resistance against etchants, and the density (hardness) of the deposited layers can be minimized.

The density of the deposited layer can be expressed in terms of resistance against a BHF solution as an etchant, for example.

Thus, the overall radiofrequency characteristics of the plasma processing apparatus 71 which have not been considered before can be adjusted, and stable plasma generation can be achieved. The plasma processing units 75 to 77 thereby achieve stable and uniform operation.

Also, the process conditions can be determined without examining the correlation between the external parameters and the inspection results obtained through a conventional inspection method requiring a step of inspecting the actually treated substrates using an enormous amount of data.

Compared to the conventional inspection method requiring the inspection of deposited substrates, the time required for adjusting the plasma processing units 75 to 77 to minimize process variation and to constantly achieve the same process results by using the same process recipe can be significantly reduced by measuring AC resistances RA and RB in the matching circuit 2A which directly supplies electric power to the plasma generating space. Moreover, the plasma processing apparatus 71 can be directly evaluated in situ within a shorter period of time, instead of by a two-step process of first evaluating the treated substrate and then evaluating the operation of the plasma processing apparatus. When the conventional inspection method requiring layer deposition on substrates is performed to determine the process recipe upon the installation of the plasma processing apparatus of this embodiment, such an inspection may be performed in only one of the plasma processing units since the plasma processing units 75 to 77 have the same radiofrequency characteristics. In the maintenance of the plasma processing apparatus, actual layer deposition is not required because the radiofrequency characteristics of the plasma processing units are controlled within the predetermined range. Thus, the plasma processing units, which have been inspected independently according to the conventional art, can be inspected simultaneously.

Thus, the inspection method of this embodiment does not require the production line to be stopped for days or weeks to validate and evaluate the operation of the plasma processing apparatus, and the productivity of the manufacturing line can be increased thereby. Moreover, the cost of substrates for inspection, the cost of processing the substrates for inspection, and the labor cost for workers involved with the adjustment can be reduced.

The overall radiofrequency characteristics of the plasma processing units 75 to 77, which have not been considered before, can be optimized by adjusting the AC resistances RA and RB in the matching circuit 2A, the plasma processing units 75 to 77 thus achieving stable operations. Moreover, power with a frequency higher than a frequency conventionally employed, i.e., about 13.56 MHz, can be effectively introduced from the radiofrequency generator 1 to the plasma generating space between the plasma excitation electrode 4 and the susceptor electrode 8. When power with the same frequency conventionally used is supplied, the effective power consumed in the plasma generating space can be increased compared to conventional plasma processing apparatuses.

Since the power is effectively introduced to the plasma generating space, undesirable spreading of plasma can be inhibited and uniformity in plasma process in the planar direction of the workpiece can be achieved. In a deposition process, uniformity in the planar distribution of deposited layers can be achieved.

Moreover, since the effective power consumed in the plasma generating space is increased, deposition characteristics, i.e., isolation voltage of deposited layers, resistance against an etchant, and density (hardness) of deposited layers, can be improved in a deposition process such as a plasma-enhanced CVD and sputtering.

The density of the deposited layer can be expressed in terms of resistance against a BHF solution as an etchant, for example.

As a result, the processing rate can be improved by increasing the plasma excitation frequency. In a plasma-enhanced CVD process, the deposition rate can be improved.

Figure 8:
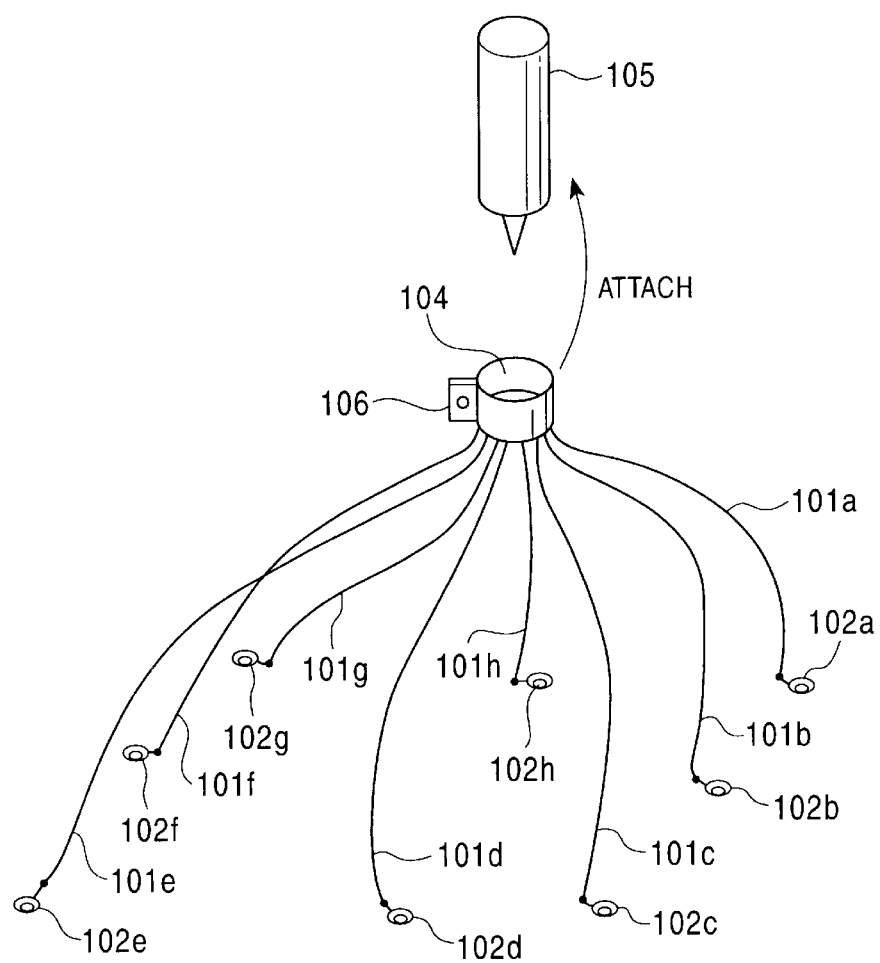
FIG. 8 is a perspective view of a probe of an impedance meter.

The impedance characteristics of the plasma processing units 75 to 77 can also be measured by using a fixture shown in FIG. 8 comprising a plurality of conductive wires 101a to 101h, each having the same impedance, and a probe attachment 104 to which one end of each of the plurality of conductive wires 101a to 101h is attached.

The probe attachment 104 is formed, for example, by shaping a 50 mm×10 mm×0.5 mm copper plate into a clamping portion 106 and a ring portion. The diameter of the ring portion is determined so that the ring portion is attachable to the circumference of the probe 105. One end of each of the conductive wires 101a to 101h is soldered to the probe attachment 104 to be electrically connected thereto.

Terminals (attachments) 102a to 102h which are attachable to and detachable from an object to be measured are installed at the other ends of the conductive wires 101a to 101h.

Figure 9:
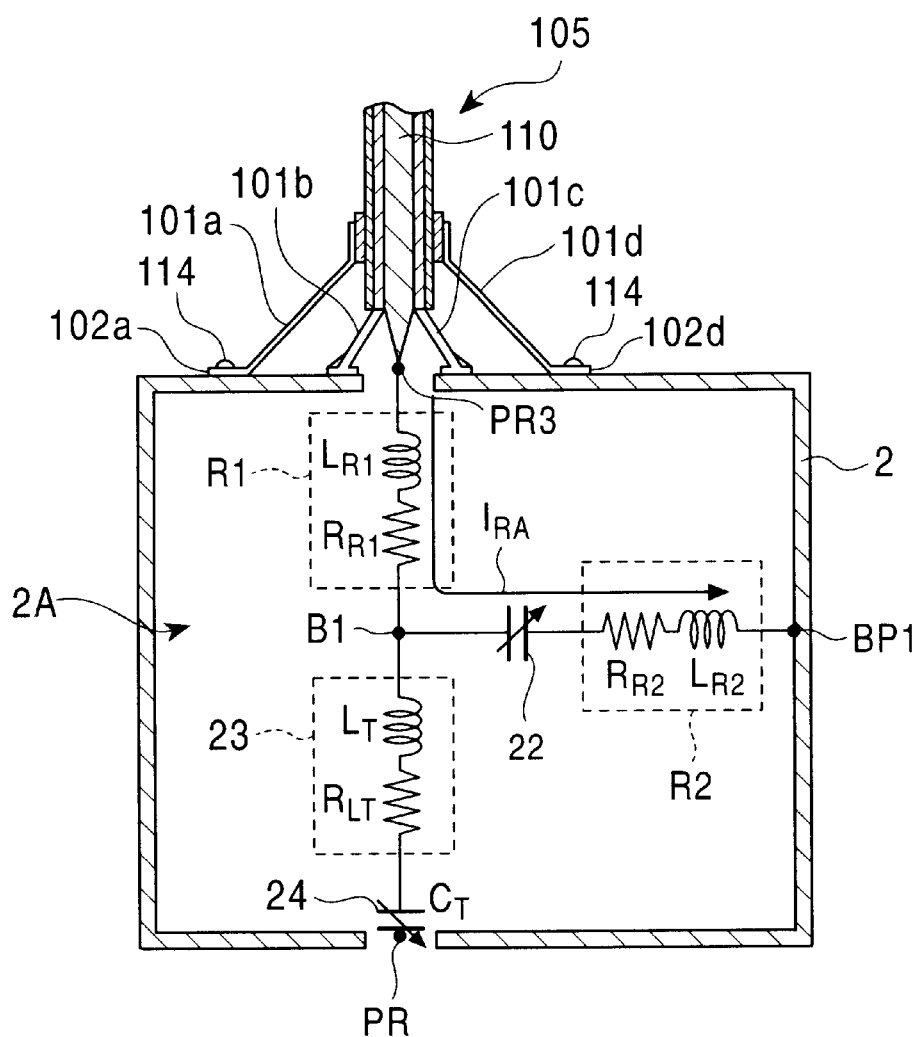
FIG. 9 is a schematic diagram showing the connections of the probe of the impedance meter shown in FIG. 8.

In using this fixture, the probe 105 is inserted into the ring portion of the probe attachment 104, and the probe 105 and the probe attachment 104 are clamped by the clamping portion 106. The conductive wires 101a to 101h are detachably screwed to the measured object in a substantially symmetrical manner about a point through the terminals 102a to 102h, as shown in FIG. 9.

The conductive wires 101a to 101h may be made of, for example, aluminum, copper, silver, or gold, or may be plated with silver or gold having a thickness of 50 $\mu$m or more.

The method for measuring impedance using this fixture is now explained with reference to FIG. 9.

First, in measuring the input-terminal-side AC resistance RA, the radiofrequency generator 1 and the feed plate 3 are detached from the matching box 2. The conductive line 110 of the probe 105 of the fixture is then connected to the point PR3. The terminals 102a to 102h connected to the conductive wires 101a to 101h of the fixture are screwed to the matching box 2 in a substantially symmetrical manner about the point PR3 using screws 114. After the fixture is set as above, a measuring signal is supplied to the conductive line 110 to measure the impedance of the paths in the matching circuit 2A of each of the plasma processing units 75 to 77.

In this manner, a uniform current flows to the measuring object regardless of the size of the measuring object or the distance between two points to be measured. Also, by using this fixture, the residual impedance which affects the measurement of the impedance can be eliminated. Thus, the impedance measurement can be performed more accurately.

In measuring the output-terminal-side AC resistance RB of the matching circuit 2A, the conductive line 110 of the fixture is connected to the point PR, and the terminals 102a to 102h connected to the conductive wires 101a to 101h of the fixture are screwed to the matching box 2 in a substantially symmetrical manner about the point PR using screws 114, as in the above.

The plasma processing apparatus of this embodiment may be of a single chamber type instead of a multi chamber type. Also, the substrate 16 may be placed on the plasma excitation electrode 4 instead of the susceptor electrode 8 in order to perform reactive ion etching (RIE).

Second Embodiment

A second embodiment of a plasma processing apparatus will now be described with reference to the drawings.

Figure 10:
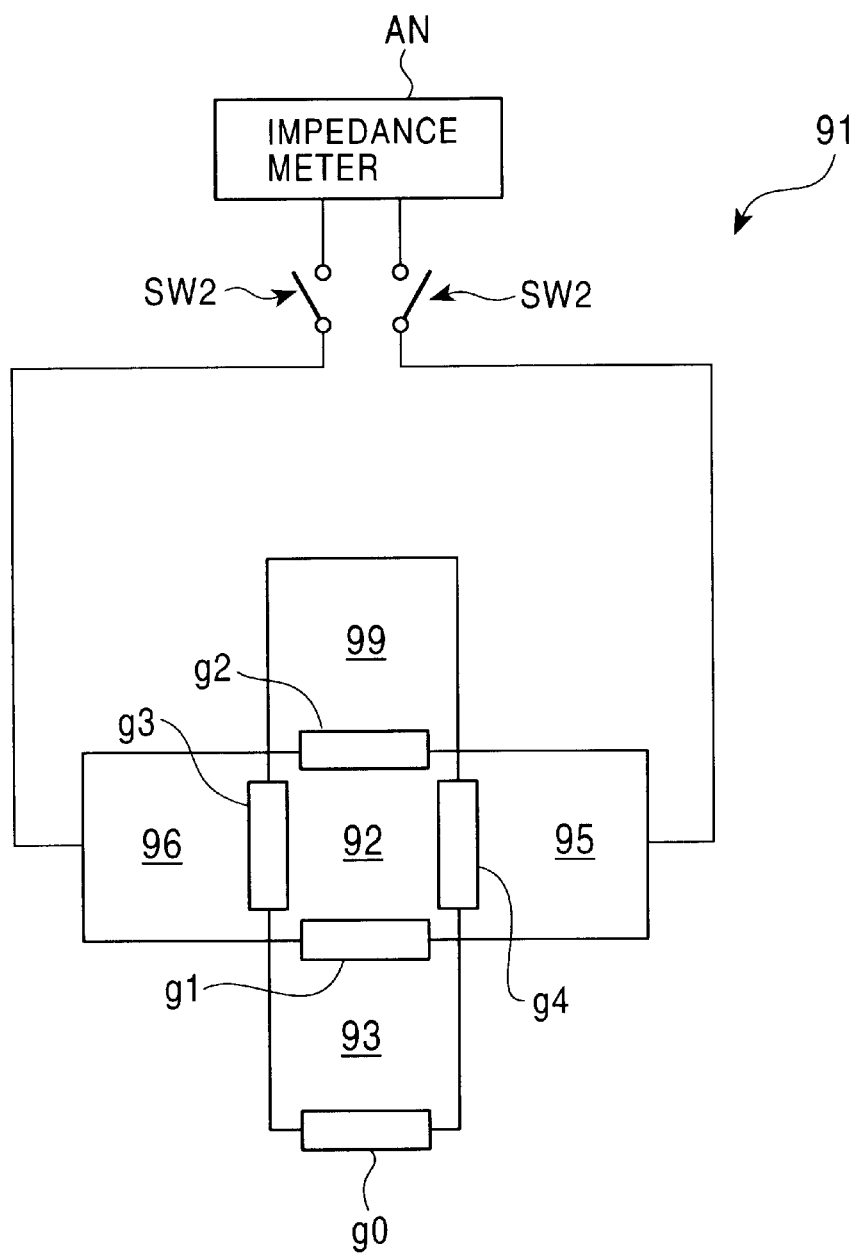
FIG. 10 is a schematic diagram showing the overall structure of a plasma processing apparatus according to a second embodiment of the present invention.

FIG. 10 is a cross-sectional view showing an overall structure of a plasma processing apparatus 91 of the second embodiment. The plasma processing apparatus 91 has a load-lock chamber 93, an annealing unit 99, and plasma processing units 95 and 96 which are provided around a substantially square transfer chamber (waiting chamber) 92. The transfer chamber 92 contains a transfer robot for transferring substrates and has gates g1, g2, g3, and g4 at the interfaces with the units. The transfer chamber 92, the annealing unit 99, and the plasma processing units 95 and 96 are evacuated to a high vacuum by individual high-vacuum pumps. The load-lock chamber 93 is evacuated to a low vacuum by a low-vacuum pump.

The components of the plasma processing apparatus 91 of this embodiment correspond to those of the plasma processing apparatus 71 of the first embodiment shown in FIGS. 1 to 7. That is, the transfer chamber 92 corresponds to the transfer chamber 72, the annealing unit 99 corresponds to the annealing unit 79, and the load-lock chamber 93 corresponds to the loading chamber 73 and the unloading chamber 74. The components having the same configurations are not described.

The plasma processing units 95 and 96 correspond to the plasma processing units 75 and 76 in the first embodiment shown in FIGS. 1 to 5. The plasma processing units 95 and 96 have substantially the same structure and may perform either different types of processes to deposit different types of layers or the same processes using the same process recipe.

The plasma processing units 95 and 96 are connected to an impedance meter AN via switches SW2, etc., described below.

The structure of the plasma processing unit 95 will be described as an example.

Figure 11:
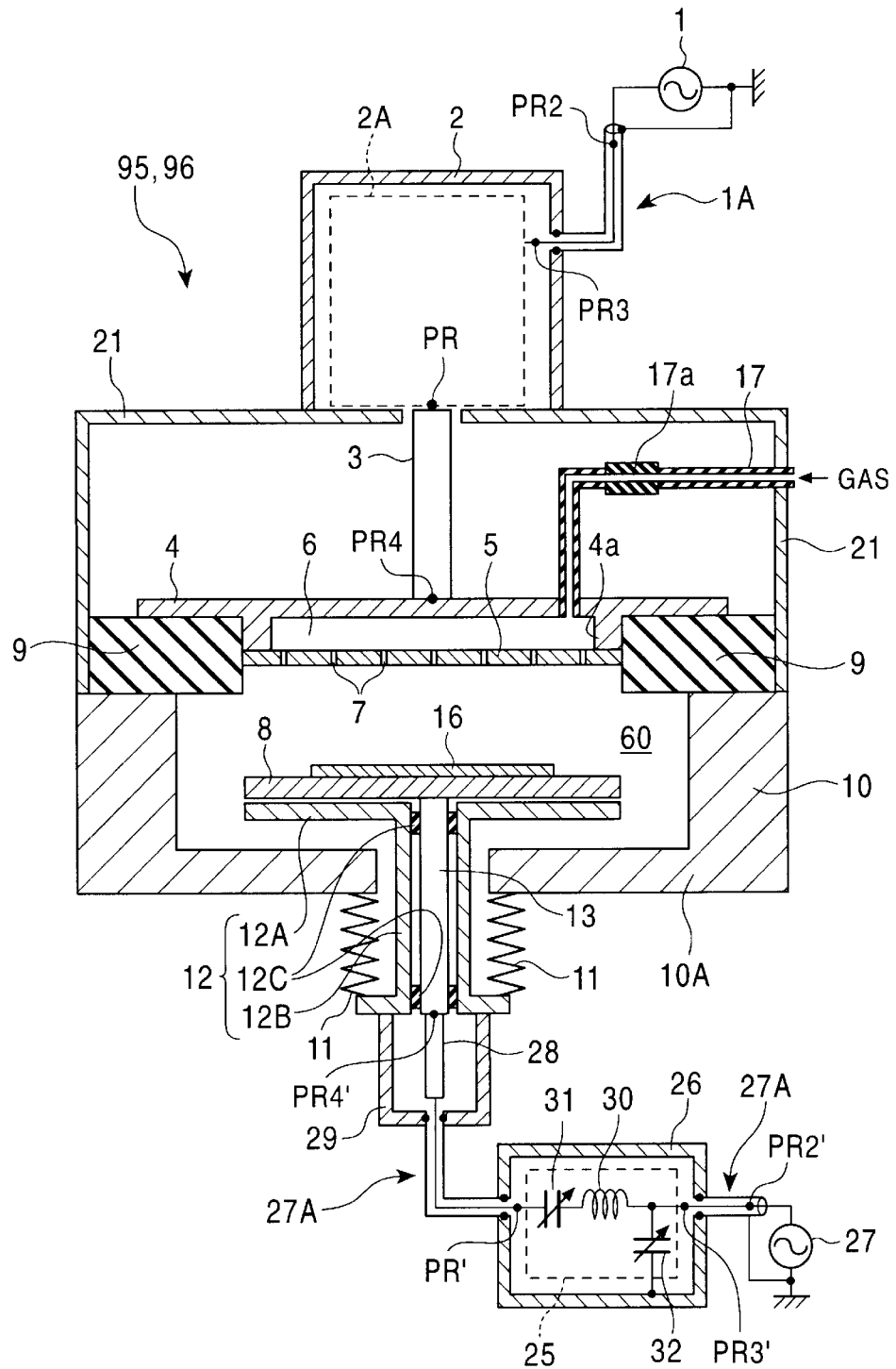
FIG. 11 is a cross sectional view of a plasma processing unit shown in FIG. 10.
Figure 12:
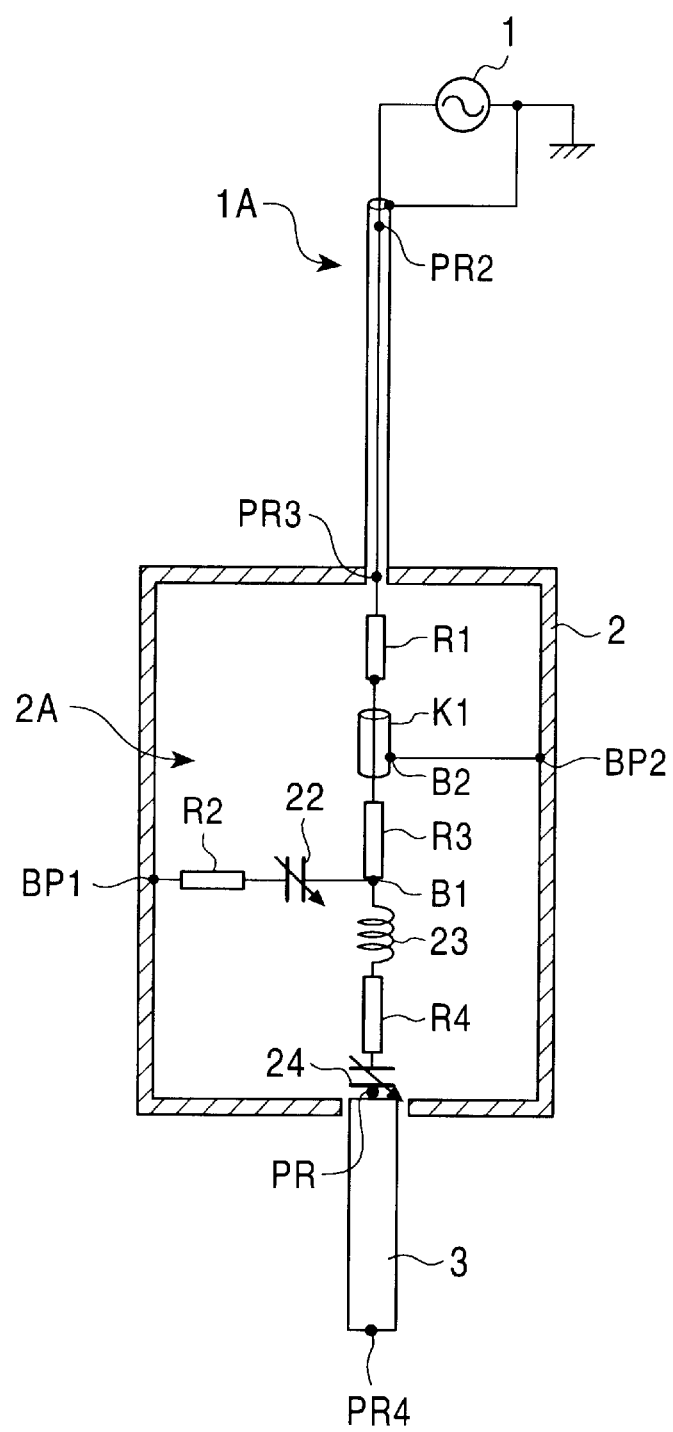
FIG. 12 is a schematic diagram of a matching circuit of the plasma processing unit shown in FIG. 11.
Figure 13:
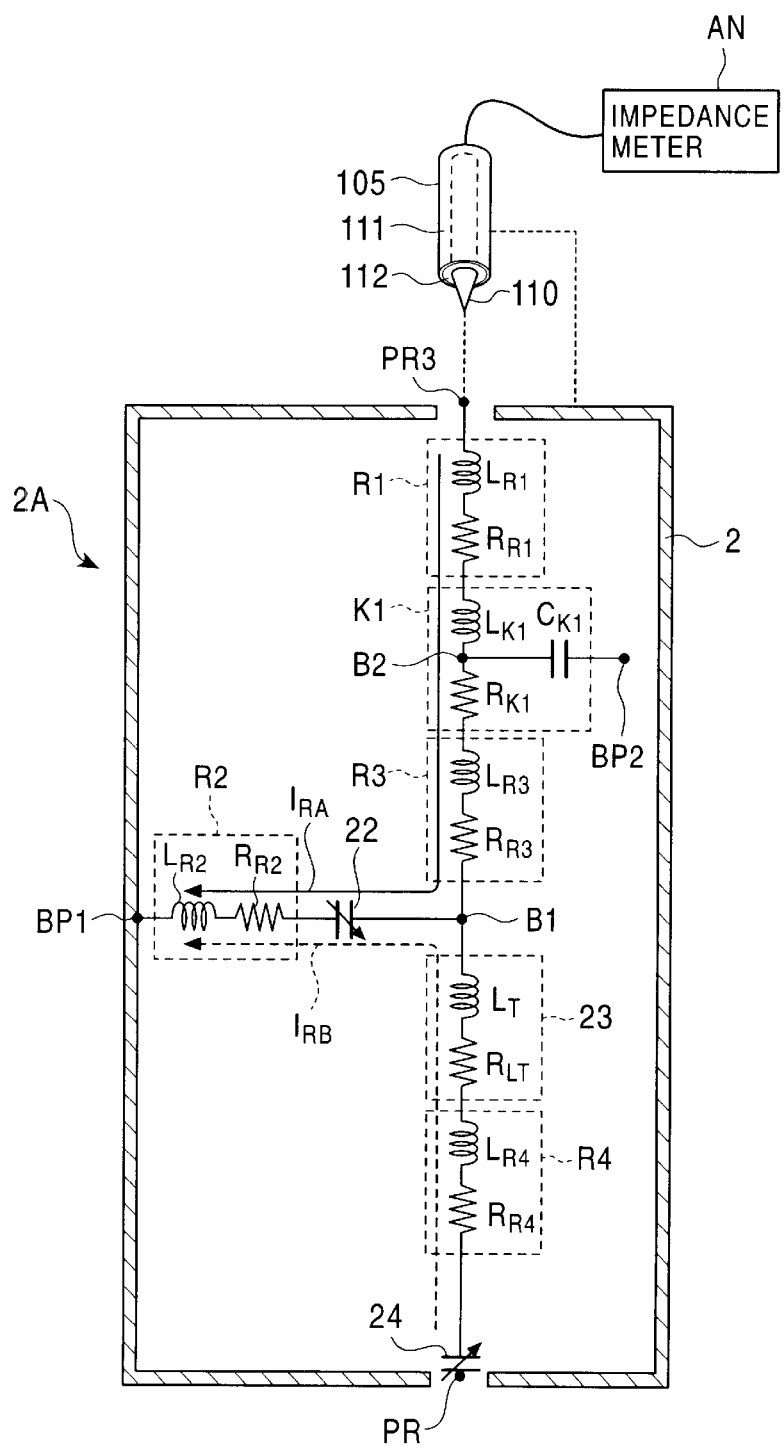
FIG. 13 is a schematic circuit diagram for describing parasitic resistances in the matching circuit shown in FIG. 12.

FIG. 11 is a cross-sectional view showing an overall structure of the plasma processing unit 95 of this embodiment. FIG. 12 is a cross-sectional view showing a matching circuit 2A in FIG. 11, and FIG. 13 is a schematic circuit diagram for describing parasitic resistances in the matching circuit 2A in FIG. 12.

The plasma processing unit 95 is of a dual-frequency-excitation type and differs from the plasma processing unit 75 of the first embodiment shown in FIGS. 2 to 5 in that power is also supplied to the susceptor electrode 8 side. The configuration of the passive elements in the matching circuit 2A and the settings of the AC resistances RA and RB are also different. Other corresponding components are represented by the same reference numerals and the descriptions thereof are omitted.

The matching circuit 2A of each of the plasma processing units 95 and 96 is adjusted such that the absolute value $|\Delta RA|$ of the difference $\Delta RA$ between the AC resistance $RA_0$ at a time $t_0$ when the plasma processing units are reassembled and the AC resistance $RA_1$ at a later time $t_1$ in use is less than 0.5 times the AC resistance $RA_0$ and that the absolute value $|\Delta RB|$ of the difference $\Delta RB$ between the AC resistance $RB_0$ at the time $t_0$ and the AC resistance $RB_1$ at the later time $t_1$ in use is less than 0.5 times the AC resistance $RB_0$ wherein the AC resistances $RA_0$ and $RA_1$ are measured from the input terminal side and the AC resistances $RB_0$ and $RB_1$ are measured from the output terminal side. Furthermore, a variation <RA> between the maximum AC resistance $RA_{0max}$ and the minimum AC resistance $RA_{0min}$ defined by equation (14A) and a variation <RB> between the maximum AC resistance $RB_{0max}$ and the minimum AC resistance $RB_{0min}$ defined by equation (14B) are controlled to be less than an upper limit when the plasma processing apparatus is designed and manufactured.

Referring to FIGS. 11 and 12, the plasma processing unit 95 has a susceptor shield 12 provided under the susceptor electrode 8. Insulators 12C composed of an electrically insulating material are provided around a shaft 13 and between the susceptor electrode 8 and the susceptor shield 12 to electrically isolate the susceptor electrode 8 from the susceptor shield 12. The insulators 12C also maintain a high vacuum in the plasma processing chamber 60. The susceptor electrode 8 and the susceptor shield 12 can be moved vertically by the bellows 11 to adjust the distance between the plasma excitation electrodes 4 and the susceptor electrode 8. The susceptor electrode 8 is connected to a second radiofrequency generator 27 via a feed plate 28 connected to the bottom end of the shaft 13 and a matching circuit 25 housed in a matching box 26 at the susceptor electrode side.

The feed plate 28 is covered by a chassis 29 connected to the bottom end of a cylindrical support 12B of the susceptor shield 12. The chassis 29 is connected to the matching box 26 by a shielding line of a feed line 27A as a coaxial cable and is grounded along with the matching box 26. Thus, the susceptor shield 12, the chassis 29, and the matching box 26 have the same DC potential.

The matching circuit 25 matches impedances of the second radiofrequency generator 27 and the susceptor electrode 8. Referring to FIGS. 11 and 12, the matching circuit 25 has, as passive elements, a tuning coil 30 and a tuning capacitor 31 which are connected in series between the second radiofrequency generator 27 and the feed plate 28, and a load capacitor 32 is connected in parallel with the tuning coil 30 and the tuning capacitor 31. One end of the load capacitor 32 is connected to the matching box 26. In short, the matching circuit 25 has substantially the same structure as that of the matching circuit 2A. The matching box 26 and the end of the load capacitor 32 are set to a ground potential through the shielding line of the feed line 27A. Alternatively, another tuning coil may be connected in series to the tuning coil 30, and another load capacitor may be connected in parallel to the load capacitor 32.

The feed plate 28 is identical to the feed plate 3. The input end of the feed plate 28 is screwed to the matching circuit 25, and the output end is screwed to the shaft 13.

Referring to FIGS. 11 to 13, the matching circuit 2A is provided between the radiofrequency generator 1 and the feed plate 3 and has passive elements, e.g., an inductance coil 23, a tuning capacitor 24 comprising an air variable capacitor, and a load capacitor 22 comprising a vacuum variable capacitor. The matching circuit 2A also includes a coaxial cable K1 and conductors R1 to R4 made of copper plates for connecting these passive elements.

The conductor R1, the coaxial cable K1, the conductor R3, the inductance coil 23, the conductor R4, and the tuning capacitor 24 are connected in series from the input terminal side toward the output terminal side while the load capacitor 22 is connected to these elements in parallel at a branching point B1 located between the conductor R3 and the inductance coil 23. One end of the load capacitor 22 is connected to the matching box 2 (ground potential portion) at a connection point BP1 through the conductor R2. The shielding line of the coaxial cable K1 is connected to the matching box 2 (ground potential portion) via a branching point B2 at a connection point BP2.

Among the passive elements constituting the matching circuit 2A, the tuning capacitor 24 is located at the last stage, and the output terminal of the tuning capacitor 24 functions as the output terminal of the matching circuit 2A. The tuning capacitor 24 is connected to the plasma excitation electrode 4 through the feed plate 3.

In the plasma processing unit 95 of this embodiment, a substrate 16 to be treated is placed on the susceptor electrode 8, radiofrequency voltages are applied to the plasma excitation electrode 4 from the first radiofrequency generator 1 and to the susceptor electrode 8 from the second radiofrequency generator 27, while a reactive gas is fed into the plasma processing chamber 60 through the gas feeding tube 17 and the shower holes 7 to generate a plasma, and plasma processing such as deposition or the like is performed on the substrate 16. During the process, radiofrequency power of approximately 13.56 MHz or more, for example, a radiofrequency power of 13.56 MHz, 27.12 MHz, 40.68 MHz, or the like, is supplied from the first radiofrequency generator 1. The second radiofrequency generator 27 may supply either the same radiofrequency power as does the first radiofrequency generator 1 or a radiofrequency power of a different frequency, e.g., 1.6 MHz.

The AC resistances RA and RB in the matching circuit 2A of the plasma processing unit 95 of this embodiment are measured and defined as in the first embodiment. More specifically, the AC resistances RA and RB of this embodiment are measured and defined as shown in FIGS. 11 to 14.

Figure 14:
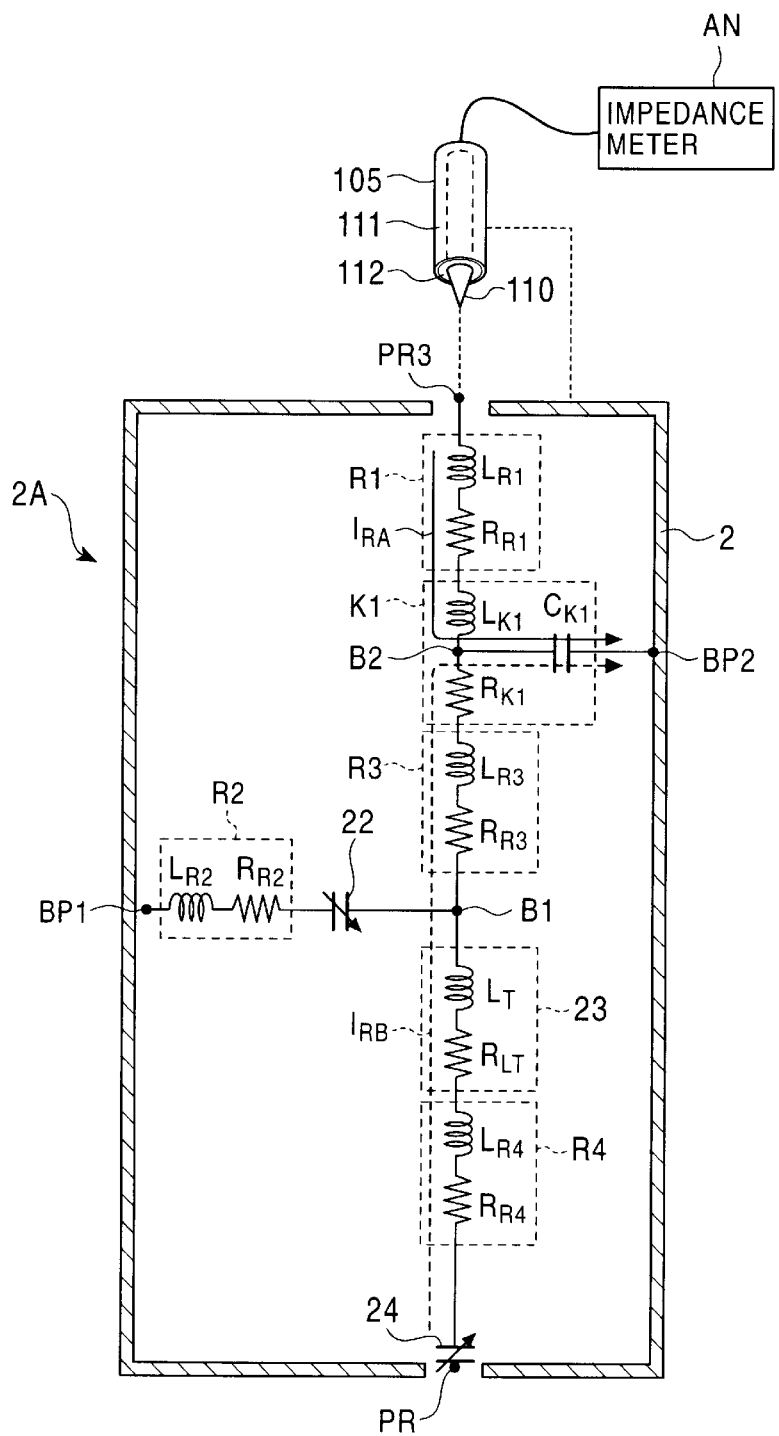
FIG. 14 is a schematic circuit diagram for describing parasitic resistances in the matching circuit shown in FIG. 12.

The measured region of the matching circuit 2A in this embodiment is the same as in the first embodiment. That is, the matching circuit 2A is disconnected from the plasma processing unit at a point PR3 corresponding to the input terminal of the passive element located at the first stage of the matching circuit 2A and at a point PR corresponding to the output terminal of the passive element located at the last stage of the matching circuit 2A in the measuring mode. More particularly, as shown in FIGS. 12 to 14, the feed line 1A is disconnected from the matching circuit 2A while the feed plate 3 is disconnected from the matching circuit 2A at the point PR by removing screws which connect the output terminal of the matching circuit 2A to the feed plate 3.

Referring to FIG. 13, in measuring the AC resistance RA at the input terminal side in the above measured region, the connection point BP2 is detached from the matching box 2, and the probe 105 of the impedance meter (radiofrequency measuring instrument) AN is connected to both the point PR3 and a ground position (ground potential portion) of the matching box 2 as shown by broken lines in FIG. 13, as in the first embodiment. The frequency oscillated by the impedance meter AN is set at the power frequency $f_e$, i.e., about 40.68 MHz, to measure the vector quantity (Z, θ) of the impedance in the above measured region of the matching circuit 2A. The real part in the complex expression of the impedance is calculated therefrom and defined as an input-terminal-side AC resistance $RA_{BP1}$.

As indicated by an arrow $I_{RA}$ in FIG. 13, the radiofrequency factors contributing to the input-terminal-side AC resistance RA of the matching circuit 2A lying in the circuit from the point PR3 to the connection point BP1 via the branching point B1 are as follows:

Parasitic resistance $R_{R1}$ in the conductor R1
Inductance $L_{R1}$ in the conductor R1
Parasitic resistance $R_{K1}$ in the coaxial cable K1
Inductance $L_{K1}$ in the coaxial cable K1
Parasitic resistance $R_{R3}$ in the conductor R3
Inductance $L_{R3}$ in the conductor R3
Capacitance $C_L$ of the load capacitor 22
Parasitic resistance $R_{R2}$ in the conductor R2
Inductance $L_{R2}$ in the conductor R2

Among these radiofrequency factors, the parasitic resistance $R_{R1}$ in the conductor R1, the parasitic resistance $R_{K1}$ in the coaxial cable K1, the parasitic resistance $R_{R3}$ in the conductor R3, and the parasitic resistance $R_{R2}$ in the conductor R2 are measured as the input-terminal-side AC resistance $RA_{BP1}$ of the matching circuit 2A.

In measuring the input-terminal-side AC resistance $RA_{BP1}$, the parasitic resistance $R_{R1}$ includes resistance of the coaxial cable K1 up to the branching point B2, and the parasitic resistance $R_{R3}$ includes the resistance from the branching point B1 to the load capacitor 22. These parasitic resistances also include parasitic resistances not illustrated in the circuit indicated by the arrow $I_{RA}$.

Next, as shown in FIG. 14, the connection point BP1 is disconnected from the matching box 2 and the connection point BP2 is connected to the matching box 2 to measure an input-terminal-side AC resistance $RA_{BP2}$. The probe 105 of the impedance meter is connected to the point PR and to the ground position (ground potential portion) of the matching box 2, and the frequency oscillated by the impedance meter AN is set at the power frequency $f_e$, i.e., about 40.68 MHz, to measure the vector quantity (Z, θ) of the impedance in the above measured region of the matching circuit 2A. The real part in the complex expression of the impedance is calculated therefrom and defined as the input-terminal-side AC resistance $RA_{BP2}$.

As indicated by an arrow $I_{RA}$ in FIG. 14, the radiofrequency factors contributing to the input-terminal-side AC resistance $RA_{BP2}$ of the matching circuit 2A lying in the circuit from the point PR3 to the connection point BP2 via the branching point B1 are as follows:

Parasitic resistance $R_{R1}$ in the conductor R1
Inductance $L_{R1}$ in the conductor R1
Parasitic resistance $R_{K1}$ in the coaxial cable K1
Inductance $L_{K1}$ in the coaxial cable K1
Capacitance $C_{K1}$ in the coaxial cable K1 wherein the capacitance $C_{K1}$ is generated between the coaxial cable K1 and the shielding line thereof.

Among these radiofrequency factors, the parasitic resistance $R_{R1}$ in the conductor R1 and the parasitic resistance $R_{K1}$ in the coaxial cable K1 are measured as the input-terminal-side AC resistance $RA_{BP2}$ of the matching circuit 2A.

In FIG. 14, the parasitic resistance $R_{K1}$ in the coaxial cable K1 is illustrated as if it is positioned at the side closer to the point PR than is the branching point B2. In the actual measurement of the input-terminal-side AC resistance $RA_{BP2}$, however, the parasitic resistance $R_{K1}$ includes the resistance of the coaxial cable K1, the resistance existing at the connection point BP2 side, and the parasitic resistance not illustrated in the circuit shown by the arrow $I_{RA}$.

Similarly, the output-terminal-side AC resistance RB of the matching circuit 2A is measured as follows. As shown in FIG. 13, while the connection point BP2 is detached from the matching box 2, the probe 105 of the impedance meter AN is attached to a ground position (ground potential portion) of the matching box 2 and to the point PR3, as in the first embodiment. The frequency oscillated by the impedance meter AN is then set at the power frequency $f_e$, i.e., about 40.68 MHz, to measure the vector quantity (Z, θ) of the impedance in the matching circuit 2A. The real part of the complex expression of the impedance is calculated therefrom and defined as the output-terminal-side AC resistance $RB_{BP1}$.

As indicated by an arrow $I_{RB}$ in FIG. 13, the radiofrequency factors contributing to the output-terminal-side AC resistance $RB_{BP1}$ of the matching circuit 2A lying on the path from the point PR to the connection point BP1 with the matching box 2 which is a ground potential portion via the branching point B1 are as follows:

Capacitance $C_T$ of the tuning capacitor 24
Parasitic resistance $R_{R4}$ in the conductor R4
Inductance $L_{R4}$ in the conductor R4
Parasitic resistance $R_{LT}$ in the inductance coil 23
Inductance $L_T$ in the inductance coil 23
Capacitance $C_L$ of the load capacitor 22
Parasitic resistance $R_{R2}$ in the conductor R2
Inductance $L_{R2}$ in the conductor R2

Among these radiofrequency factors, the parasitic resistance $R_{R4}$ in the conductor R4, the parasitic resistance $R_{LT}$ in the inductance coil 23, and the parasitic resistance $R_{R2}$ in the conductor R2 are measured as the output-terminal-side AC resistance $RB_{BP1}$ in the matching circuit 2A.

In the measuring the output-terminal-side AC resistance $RB_{BP1}$, the parasitic resistance $R_{LT}$ includes parasitic resistances not illustrated in the circuit indicated by the arrow $I_{RB}$ such as the resistance from the branching point B1 to the load capacitor 22.

Next, referring to FIG. 14, in measuring the output-terminal-side AC resistance $RB_{BP2}$, the connection point BP1 is detached from the matching box 2 while the connection point BP2 is connected to the matching box 2. The probe 105 of the impedance meter AN is connected to the point PR and to the matching circuit 2A (ground potential portion). The frequency oscillated from the impedance meter AN is then set at the power frequency $f_e$ (for example, about 40.68 MHz) to measure the vector quantity (Z, θ) of the impedance in the above measured region of the matching circuit 2A. The real part in the complex expression of the impedance is calculated therefrom and defined as the output-terminal-side AC resistance $RB_{BP2}$.

As indicated by an arrow $I_{RB}$ in FIG. 14, the radiofrequency factors contributing to the output-terminal-side AC resistance $RB_{BP2}$ of the matching circuit 2A lying on the path from the point PR to the connection point BP2 with the matching box 2 (ground potential portion) via the branching point B2 are as follows:

- Capacitance $C_T$ of the tuning capacitor 24
- Parasitic resistance $R_{R4}$ in the conductor R4
- Inductance $L_{R4}$ in the conductor R4
- Parasitic resistance $R_{LT}$ in the inductance coil 23
- Inductance $L_T$ in the inductance coil 23
- Parasitic resistance $R_{R3}$ in the conductor R3
- Inductance $L_{R3}$ in the conductor R3
- Parasitic resistance $R_{K1}$ in the coaxial cable K1
- Inductance $L_{K1}$ in the coaxial cable K1
- Capacitance $C_{K1}$ in the coaxial cable K1.

Among these radiofrequency factors, the parasitic resistance $R_{R4}$ in the conductor R4, the parasitic resistance $R_{LT}$ in the inductance coil 23, the parasitic resistance $R_{R3}$ in the conductor R3, and the parasitic resistance $R_{K1}$ in the coaxial cable K1 are measured as the output-terminal-side AC resistance $RB_{BP2}$, as shown in FIG. 14.

The input- and output-terminal-side AC resistances RA and RB in the matching circuit 2A of the plasma processing unit 95 are set to be less than an upper limit suitable for the operation of the plasma processing unit 95. In particular, the input-terminal-side AC resistance $RA_{BP1}$, the input-terminal-side AC resistance $RA_{BP2}$, the output-terminal-side AC resistance $RB_{BP1}$, and the output-terminal-side AC resistance $RB_{BP2}$ are each set to be less than an upper limit described below.

Examples for optimizing the AC resistances RA and RB are Methods A to D below:

A. Adjusting the size, i.e., the length and the width, of copper plates constituting the conductors R1 to R4;

B. Adjusting the state of assembly of the copper plates constituting the conductors R1 to R4;

C. Adjusting the size, i.e., the length and the width, of the coaxial cable K1; and D. Plating the copper plates constituting the conductors R1 to R4 with silver.

In the plasma processing apparatus 91 of this embodiment, the plasma processing units 95 and 96 have substantially the same structure. The AC resistances RA and RB, more specifically, $RA_{BP1}$, $RA_{BP2}$, $RB_{BP1}$, and $RB_{BP2}$ of the plasma processing unit 96 are also set as in the plasma processing unit 95.

The power frequency $f_e$ in the plasma processing units 95 and 96 is set at 40.68 MHz to measure the AC resistances RA and RB.

The AC resistances RA and RB, however, are radiofrequency characteristics mainly determined by the mechanical structure and would be different between processing units.

Regarding the input-terminal-side AC resistance RA, a variation $<RA_{BP1}>$ in the input-terminal-side AC resistances $RA_{BP1-95}$ and $RA_{BP1-96}$ of the plasma processing units 95 and 96, respectively, is defined by equation (14A'):

$$<RA_{BP1}> = (RA_{BP1-max} - RA_{BP1-min})/(RA_{BP1-max} + RA_{BP1-min}) \quad (14A')$$

wherein $RA_{BP1-max}$ and $RA_{BP1-min}$ are the maximum and minimum, respectively, between the input-terminal-side AC resistances $RA_{BP1-95}$ and $RA_{BP1-96}$.

Similarly, a variation $<RA_{BP2}>$ in the input-terminal-side AC resistances $RA_{BP2-95}$ and $RA_{BP2-96}$ of the plasma processing units 95 and 96, respectively, is defined by equation (14A''):

$$<RA_{BP2}> = (RA_{BP2-max} - RA_{BP2-min})/(RA_{BP2-max} + RA_{BP2-min}) \quad (14A'')$$

wherein $RA_{BP2-max}$ and $RA_{BP2-min}$ are the maximum and minimum, respectively, between the input-terminal-side AC resistances $RA_{BP2-95}$ and $RA_{BP2-96}$.

Then, the variation $<RA_{BP1}>$ in the input-terminal-side AC resistance $RA_{BP1}$ and the variation $<RA_{BP2}>$ in the input-terminal-side AC resistance $RA_{BP2}$ are compared and the larger one is defined as the variation $<RA>$ of the input-terminal-side AC resistance RA. The values of the variations expressed by equations (14A') and (14A'') are then each set at a value less than 0.4. In short, both the variations $<RA_{BP1}>$ and $<RA_{BP2}>$ corresponding to the connection point BP1 and BP2, respectively, are set at a value less than 0.4.

The variation $<RA>$ of the input-terminal-side AC resistance RA may be optimized by any one of Methods A to D described above.

Regarding the output-terminal-side AC resistance RB, a variation $<RB_{BP1}>$ in the output-terminal-side AC resistances $RB_{BP1-95}$ and $RB_{BP1-96}$ of the plasma processing units 95 and 96 is defined by equation (14B'):

$$<RB_{BP1}> = (RB_{BP1-max} - RB_{BP1-min})/(RB_{BP1-max} + RB_{BP1-min}) \quad (14B')$$

wherein $RB_{BP1-max}$ and $RB_{BP1-min}$ are the maximum and minimum, respectively, between the output-terminal-side AC resistances $RB_{BP1-95}$ and $RB_{BP1-96}$.

Similarly, a variation $<RB_{BP2}>$ in the output-terminal-side AC resistances $RB_{BP2-95}$ and $RB_{BP2-96}$ of the plasma processing units 95 and 96 is defined by equation (14B''):

$$<RB_{BP2}> = (RB_{BP2-max} - RB_{BP2-min})/(RB_{BP2-max} + RB_{BP2-min}) \quad (14B'')$$

wherein $RB_{BP2-max}$ and $RB_{BP2-min}$ are the maximum and minimum, respectively, between the output-terminal-side AC resistances $RB_{BP2-95}$ and $RB_{BP2-96}$.

Then, the variation $<RB_{BP1}>$ in the output-terminal-side AC resistance $RB_{BP1}$ and the variation $<RB_{BP2}>$ in the output-terminal-side AC resistance $RB_{BP2}$ are compared and the larger one is defined as the variation $<RB>$ of the output-terminal-side AC resistance RB. The values of the variations expressed by equations (14B') and (14B'') are then each set at a value less than 0.4. In short, both the variations $<RB_{BP1}>$ and $<RB_{BP2}>$ corresponding to the connection point BP1 and BP2, respectively, are set at a value less than 0.4.

The variation $<RB>$ of the input-terminal-side AC resistance RB may be optimized by any one of Methods A to D described above.

In the matching circuit 2A of each of the plasma processing units 95 and 96 of this embodiment, the input-terminal-side AC resistances $RA_{BP1-0}$ and $RA_{BP2-0}$ and the output-terminal-side AC resistances $RB_{BP1-0}$ and $RB_{BP2-0}$ which are set at a time $t_0$ are controlled during operation of the plasma processing units 95 and 96 such that the plasma processing units 95 and 96 operate under optimized conditions. That is, at a later time $t_1$ when the plasma processing units are reassembled at a customer site, are used for plasma processing, and are subjected to adjustment works, such as overhaul, parts replacement, and assembly with alignment, the absolute value $|\Delta RA_{BP1}|$ of the difference $\Delta RA_{BP1}$ between the input-terminal-side AC resistances $RA_{BP1\text{-}0}$ and $RA_{BP1\text{-}1}$ is maintained to be less than 0.4 times the input-terminal-side AC resistance $RA_{BP1\text{-}0}$, the absolute value $|\Delta RA_{BP2}|$ of the difference $\Delta RA_{BP2}$ between the input-terminal-side AC resistances $RA_{BP2\text{-}0}$ and $RA_{BP2\text{-}1}$ is maintained to be less than 0.4 times the input-terminal-side AC resistance $RA_{BP2\text{-}0}$, the absolute value $|\Delta RB_{BP1}|$ of the difference $\Delta RB_{BP1}$ between the output-terminal-side AC resistances $RB_{BP1\text{-}0}$ and $RB_{BP1\text{-}1}$ is maintained to be less than 0.4 times the output-terminal-side AC resistance $RB_{BP1\text{-}0}$, and the absolute value $|\Delta RB_{BP2}|$ of the difference $\Delta RB_{BP2}$ between the output-terminal-side AC resistances $RB_{BP2\text{-}0}$ and $RB_{BP2\text{-}1}$ maintained set to be less than 0.4 times the output-terminal-side AC resistance $RB_{BP2\text{-}0}$, wherein the input-terminal-side AC resistances $RA_{BP1\text{-}0}$ and $RA_{BP2\text{-}0}$ and the output-terminal-side AC resistances $RB_{BP1\text{-}0}$ and $RB_{BP2\text{-}0}$ are measured at the later time $t_1$. When any one of the absolute values $|\Delta RA_{BP1}|$, $|\Delta RA_{BP2}|$, $|\Delta RB_{BP1}|$, and $|\Delta RB_{BP1}|$ exceeds the above value, a corrective action is performed.

In the corrective action, the AC resistances $RA_{BP1}$, $RA_{BP2}$, $RB_{BP1}$, and $RB_{BP2}$ may be corrected by any one of Methods A to D described above.

In the plasma processing apparatus 91, a gate g0 is opened to transfer the substrate 16 into the load-lock chamber 93. The gate g0 is closed to evacuate the load-lock chamber 93 with a low-vacuum pump. The gates g1 and g2 are opened to transfer the substrate 16 from the load-lock chamber 93 to the annealing unit 99 by a transfer arm of a transfer robot in the transfer chamber 92. The gates g1 and g2 are closed to evacuate the transfer chamber 92 and the annealing unit 99 using a high-vacuum pump. After the substrate 16 is annealed, the gates g2 and g4 are opened to transfer the annealed substrate 16 to the plasma processing unit 95 with the transfer arm of the transfer robot. After the substrate 16 is processed in the plasma processing unit 95, the gates g3 and g4 are opened to transfer the substrate 16 to the plasma processing unit 96 by the transfer arm of the transfer robot in the transfer chamber 92. After the substrate 16 is processed in the plasma processing unit 96, the gates g1 and g3 are opened to transfer the substrate 16 to the load-lock chamber 93 with the transfer arm of the transfer robot in the transfer chamber 92.

For example, the operations of the processing chamber units are automatically controlled by a control section, whereas processing conditions such as layer deposition conditions and process sequences are set by an operator. In the operation of the plasma processing apparatus 91, untreated substrates 16 are placed on the loading cassette, and then are transferred into each processing chamber by the transfer robot 87 based on the starting operation by the operator. After the substrate 16 is automatically and sequentially processed in each chamber, the substrate 16 is placed onto the unloading cassette by the transfer robot 87.

In these plasma processing units 95 and 96, the substrate 16 is placed on the susceptor electrode 8, as in the first embodiment. The radiofrequency generator 1 applies a radiofrequency voltage to the plasma excitation electrode 4, and the second radiofrequency generator 27 applies a radiofrequency voltage to the susceptor electrode 8 while a reactive gas is fed into the plasma processing chamber 60 from the gas feeding tube 17 via the holes 7 in the shower plate 6 to generate a plasma for forming an amorphous silicon layer, a silicon oxide layer, or a silicon nitride layer on the substrate 16.

The plasma processing apparatus 91 exhibits the same advantages as in the first embodiment. Moreover, all the absolute values $|\Delta RA_{BP1}|$, $|\Delta RA_{BP2}|$, $|\Delta RB_{BP1}|$, and $|\Delta RB_{BP1}|$ are controlled to be less than the predetermined value even after the plasma processing units 95 and 96 are reassembled, are used, and are subjected to an adjustment work. Thus, the difference in the radiofrequency characteristics can be always minimized, even when a phenomenon affecting the radiofrequency characteristics occurs. Moreover, the difference in the radiofrequency characteristics between the plasma processing units 95 and 96 is minimized at the time $t_0$; hence, the plasma processing units 95 and 96 can be maintained at a level which is lower than an upper limit indicated by the impedance characteristics, such as DC resistance, capacitance, and impedance. As a result, the effective power consumption in the plasma spaces is maintained at substantially the same level at all times. In detail, the variation in layer thickness under the same deposition conditions can be controlled within ±3% for these plasma processing units 95 and 96, regardless of passage of time, namely, disassembly, transfer, reassembly, repeated operation, and adjustment.

In the plasma processing apparatus 91 of this embodiment, the variations in the input-terminal-side AC resistance RA and the output-terminal-side AC resistance RB in the matching circuit 2A of each of the plasma processing units 95 and 96 are set to be less than 0.4. Thus, differences in radiofrequency characteristics between the plasma processing units 95 and 96 can be minimized. Since these plasma processing units 95 and 96 are maintained within a predetermined control level by impedance characteristics at all times, these units consumes substantially the same effective electrical power.

As a result, substantially the same plasma process results can be achieved by applying the same process recipe to the plasma processing units 95 and 96 regardless of passage of time. When deposition processes are repeated several times in these plasma chambers, substantially uniform layer characteristics, such as the layer thickness, the isolation voltage, and the etching rate can be achieved. More specifically, the variation in the thickness of the layers deposited using the same process recipe can be maintained within ±3% by setting the variation to a value less than 0.4.

When a plurality of connection points BP1 and BP2 is provided as in this embodiment, an input-terminal-side AC resistance $RA_{BP1}$ and an output-terminal-side AC resistance $RB_{BP1}$ are measured while the connection point BP1 is connected to the matching box 2 and the connection point BP2 is disconnected from the matching box 2. Furthermore, an input-terminal-side AC resistance $RA_{BP2}$ and an output-terminal-side AC resistance $RB_{BP2}$ are measured while the connection point BP1 is disconnected from the matching box 2 and the connection point BP2 is connected to the matching box 2(by switching the connection point). In short, the connections are switched between the connection points BP1 and BP2 to define the different measured regions, and the input-terminal-side AC resistance $RA_{BP1}$, input-terminal-side AC resistance $RA_{BP2}$, output-terminal-side AC resistance $RB_{BP1}$, and output-terminal-side AC resistance $RB_{BP2}$ of the plasma processing units 95 and 96 are individually measured for the corresponding measured regions. The variations <RA> and <RB> in the AC resistance defined by equations (14A'), (14A"), (14B'), and (14B") are then optimized. Thus, the plasma spaces of the plasma processing units 95 and 96 consume substantially the same effective power.

According to the plasma processing apparatus 91 and the inspection method therefor of this embodiment, both the input-terminal-side AC resistances RA and the output-terminal-side AC resistances RB of the matching circuits 2A of the plasma processing units 95 and 96 are simultaneously adjusted at the time $t_0$ and the later time $t_1$. Thus, the parasitic resistances in the matching circuit 2A having a plurality of branching points B1 and B2 can be adjusted and the difference between the units can be minimized. Accordingly, the impedance characteristics of the plasma processing units 95 and 96 can be efficiently measured.

The input- and output-terminal-side AC resistances RA and RB are set for the plasma excitation electrode 4 in this embodiment. The input- and output-terminal-side AC resistances RA and RB may be set in relation to the matching circuit 25 for the susceptor electrode 8. In such a case, the output-terminal-side AC resistance RB in the matching circuit 25 is measured at a point PR', and the input-terminal-side AC resistance RA of the matching circuit 25 is measured at a point PR3', as shown in FIGS. 11 and 12.

Moreover, this embodiment can be applied to an inductive coupled plasma (ICP) excitation type plasma processing apparatus, a radial line slot antenna (RLSA) type plasma processing apparatus, and a reactive ion etching (RIE) type processing apparatus, instead of the parallel plate type plasma processing apparatus.

A target material may be installed instead of the electrodes 4 and 8 to perform a sputtering process as a plasma treatment.

Third Embodiment

A third embodiment of a plasma processing apparatus will now be explained with reference to the drawings.

Figure 15:
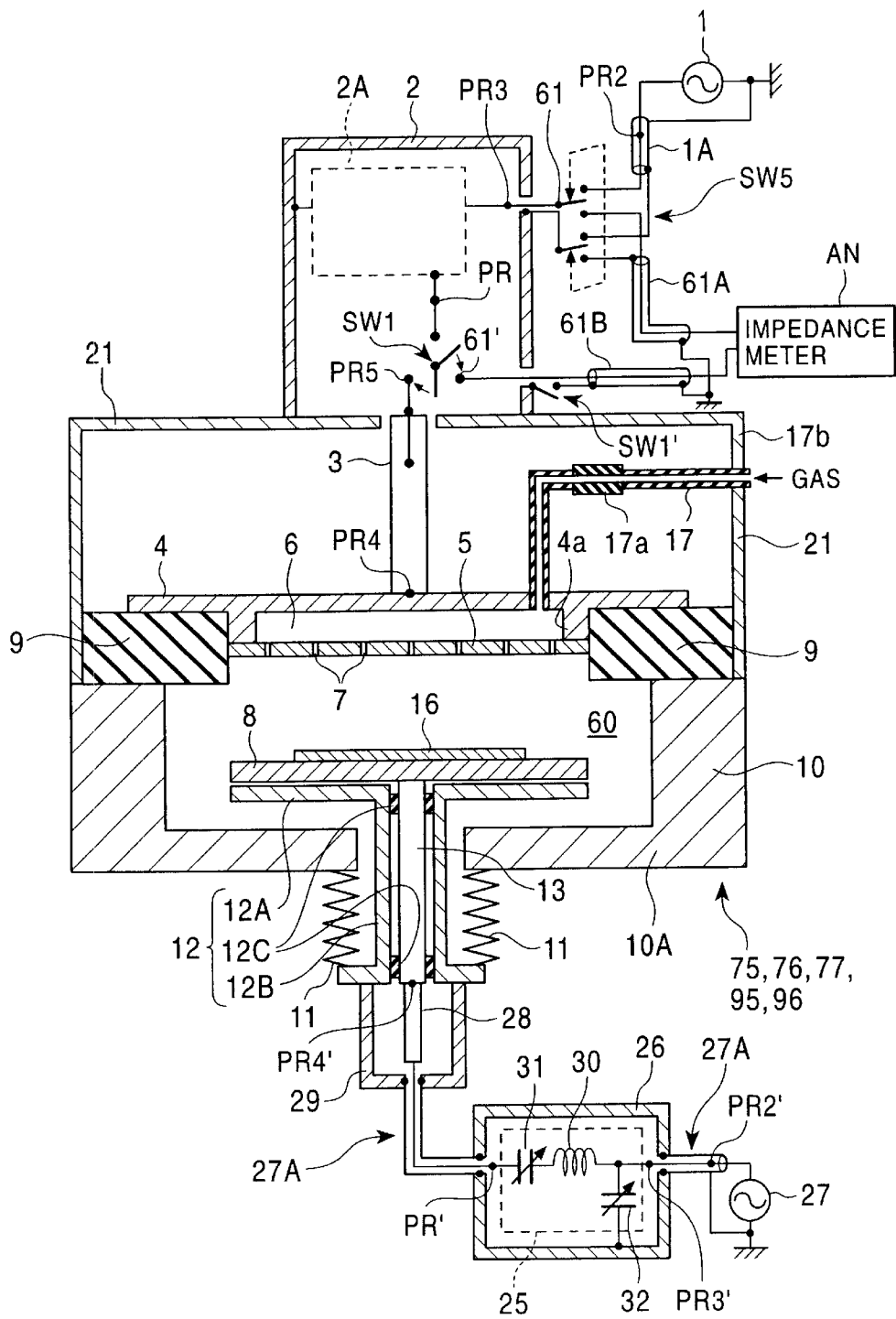
FIG. 15 is a schematic diagram showing an overall structure of a plasma processing unit according to a third embodiment of the present invention.

FIG. 15 is a schematic diagram showing an overall structure of a plasma processing unit of this embodiment.

The structure of the plasma processing apparatus of this embodiment has substantially the same configuration as that of the first embodiment and second embodiment. The plasma processing apparatus of this embodiment differs from the first and the second embodiment in the configuration of the matching circuit 2A and switches. Similar components are represented by the same reference numerals and the explanations thereof are omitted.

The plasma processing units 75, 76, 77, 95 and 96 of this embodiment are of a duel-frequency excitation type as in the second embodiment. Referring to FIG. 15, in each of the plasma processing units 75, 76, 77, 95 and 96, the input-terminal-side AC resistance RA as a radiofrequency characteristic is measured at a point PR2 which corresponds to the input terminal of the radiofrequency supplier (feed line) 1A connected to the radiofrequency generator 1.

Figure 16:
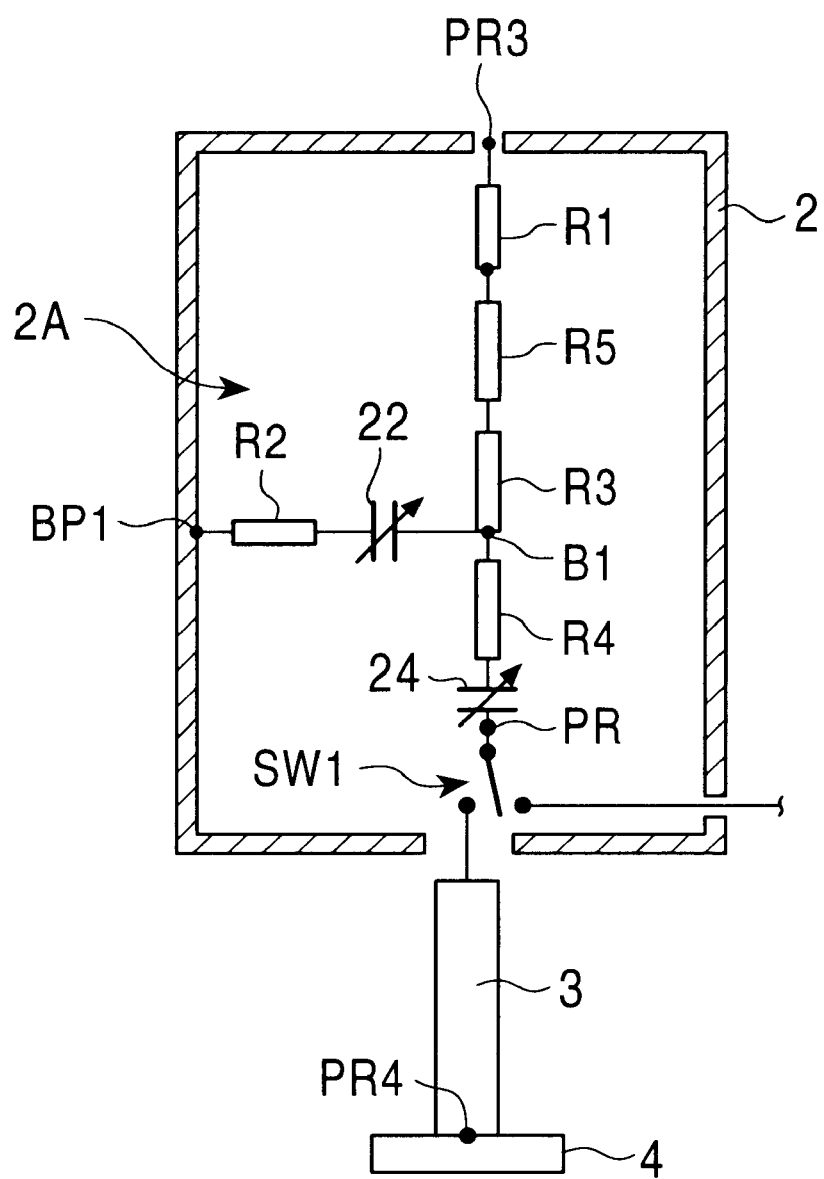
FIG. 16 is a schematic diagram showing a matching circuit of the plasma processing unit shown in FIG. 15.
Figure 17:
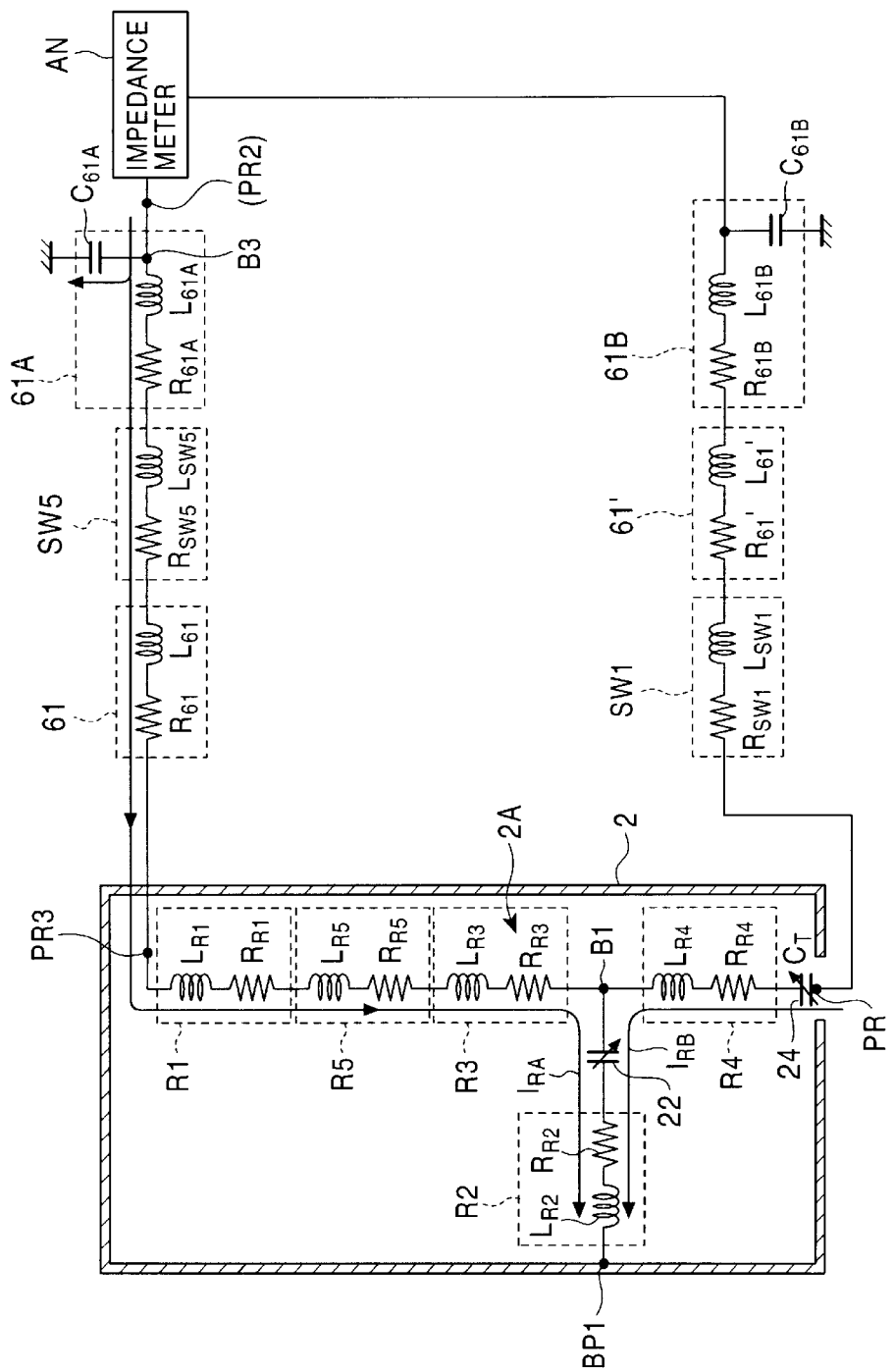
FIG. 17 is a schematic circuit diagram describing parasitic resistances in the matching circuit shown in FIG. 16.

FIG. 16 is a schematic diagram of the matching circuit 2A in FIG. 15. FIG. 17 is a schematic circuit diagram for describing parasitic resistances in the matching circuit 2A in FIG. 16.

Referring to FIGS. 15 to 17, the matching circuit 2A is provided between the radiofrequency generator 1 and the feed plate 3 and has passive elements, namely, the tuning capacitor 24 comprising the air variable capacitor and the load capacitor 22 comprising the vacuum variable capacitor. The matching circuit 2A also includes the conductors R1 to R4, and a conductor R5 for connecting these passive elements. The conductors R1 to R5 are each formed of a copper plate.

The conductors R1, R5, R3, and R4 and the tuning capacitor 24 are connected in series from the input-terminal-side toward the output-terminal-side of the matching circuit 2A. The load capacitor 22 is connected in parallel to these elements at the branching point B1 located between the conductors R3 and R4. One end of the load capacitor 22 is connected to the matching box 2 (ground potential portion) through the conductor R2 at the connection point BP1.

The tuning capacitor 24 is located at the last stage of the passive elements constituting the matching circuit 2A. The output terminal of the tuning capacitor 24 thus corresponds to the output terminal of the matching circuit 2A, and the tuning capacitor 24 is connected to the plasma excitation electrode 4 through the feed plate 3.

Referring to FIGS. 15 to 17, the point PR3 of the matching circuit 2A in this embodiment is connected to a measuring terminal 61 for measuring the input-terminal-side AC resistance RA, a connecting line (coaxial cable) 61A for connecting the measuring terminal 61 to the impedance meter AN, and a switch SW5 for switching the connection between the feed line 1A for plasma generation and the impedance meter AN for the measurement of the radiofrequency characteristics. Thus, the point PR3 is connected to the switch SW5 through the measuring terminal 61. The feed line 1A and the connecting line 61A are also connected to the switch SW5. The switch SW5, the feed line 1A, and the connecting line 61A are connected such that, the matching box 2 has the ground potential during both plasma generation and radiofrequency characteristic measurement.

The impedance between the point PR3 and the point PR2 and the impedance between the point PR3 and the impedance meter AN via the connecting line 61A are equal to each other, in this embodiment. More particularly, the feed line 1A and the connecting line 61A have the same length. Moreover, the impedances between the impedance meter AN and the plasma processing units 75, 76, 77, 95, and 96 are equal to each other. In this embodiment, the radiofrequency characteristics, such as impedance and particularly the input-terminal-side AC resistance RA, can be measured by operating the switch SW5 without detaching/attaching the matching circuit 2A from/to the impedance meter AN.

Referring to FIGS. 15 to 17, a measuring terminal 61' for measuring the output-terminal-side AC resistance RB, a connecting line (coaxial cable) 61B for connecting the measuring terminal 61' to the impedance meter AN, and switches SW1 and SW1' are provided in the vicinity of the point PR. The switches SW1 and SW1' connects the matching circuit 2A to the impedance meter AN during the radiofrequency measurement and connects the matching circuit 2A to the feed plate 3 during the plasma generation. The point PR, the measuring terminal 61', and an output line extending to the feed plate 3 are connected to the switch SW1. The switch SW1' is connected to the matching box 2 and to the ground potential portion via the shielding line of the connecting line 61B. The switches SW1 and SW1' and the connecting line 61B are arranged such that the matching box 2 has the ground potential during both plasma generation and radiofrequency characteristics measurement.

The connecting lines 61B for the plasma processing units 75, 76, 77, 95, and 96 have the same length so that the impedances between the impedance meter AN and the plasma processing units are equal to each other. The radiofrequency characteristics, such as impedance and particularly the output-terminal-side AC resistance RB, can be readily measured by operating the switches SW1 and SW1' without detaching/attaching the matching circuit 2A from/to the impedance meter AN.

In each of the plasma processing units 75, 76, 77, 95, and 96 of this embodiment, the AC resistances RA and RB as radiofrequency characteristics of the matching circuits 2A are measured and defined as in the first and second embodiments.

Referring to FIG. 17, in measuring the input-terminal-side AC resistance RA, the switches SW1 and SW1' are operated to disconnect the matching circuit 2A from the plasma processing unit at the point PR, while the switch SW5 is operated to connect the matching circuit 2A to the impedance meter AN. The frequency oscillated by the impedance meter AN is set to, for example, about 40.68 MHz which is the power frequency $f_e$, and the vector quantity $(Z, \theta)$ of the impedance in the above measured region of the matching circuit 2A is measured to calculate the real part in the complex expression of the impedance which is defined as the AC resistance.

As indicated by an arrow $I_{RA}$ in FIG. 17, the radiofrequency factors contributing to the input-terminal-side AC resistance RA in the matching circuit 2A lying on the path extending from a point (PR2), which is equivalent to the point PR2 located at the radiofrequency generator 1 side, to the ground potential portion such as the matching box 2 via the branching points B3 and B1 are as follows:

Parasitic resistance $R_{61A}$ in the connecting line 61A
Inductance $L_{61A}$ in the connecting line 61A
Capacitance $C_{61A}$ in the connecting line 61A
Parasitic resistance $R_{SW5}$ in the switch SW5
Inductance $L_{SW5}$ in the switch SW5
Parasitic resistance $R_{61}$ in the measuring terminal 61
Inductance $L_{61}$ in the measuring terminal 61
Parasitic resistance $R_{R1}$ in the conductor R1
Inductance $L_{R1}$ in the conductor R1
Parasitic resistance $R_{R5}$ in the conductor R5
Inductance $L_{R5}$ in the conductor R5
Parasitic resistance $R_{R3}$ in the conductor R3
Inductance $L_{R3}$ in the conductor R3
Capacitance $C_L$ of the load capacitor 22
Parasitic resistance $R_{R2}$ in the conductor R2
Inductance $L_{R2}$ in the conductor R2 wherein the capacitance $C_{61A}$ of the connecting line 61A is generated between the connecting line 61A and the shielding line thereof.

Among these radiofrequency factors, the parasitic resistance $R_{61A}$ in the connecting line 61A, the parasitic resistance $R_{SW5}$ in the switch SW5, the parasitic resistance $R_{61}$ in the measuring terminal 61, the parasitic resistance $R_{R1}$ in the conductor R1, the parasitic resistance $R_{R5}$ in the conductor R5, the parasitic resistance $R_{R3}$ in the conductor R3, and the parasitic resistance $R_{R2}$ in the conductor R2 are measured as the input-terminal-side AC resistance RA in the matching circuit 2A, as shown in FIG. 17.

In measuring the input-terminal-side AC resistance RA, the parasitic resistance $R_{R3}$ represents resistances from the branching point B1 to the load capacitor 22 including parasitic resistances not shown in the circuit $I_{RA}$.

Similarly, in measuring the output-terminal-side AC resistance RB, the switch SW5 is operated to disconnect the matching circuit 2A from the radiofrequency generator 1 at the point PR3, and the switches SW1 and SW1' are operated to connect the point PR of the matching circuit 2A to the impedance meter AN. Meanwhile, the matching box 2 is connected to the grounded portion of the impedance meter AN, the frequency oscillated by the impedance meter AN is set to, for example, about 40.68 MHz which is the power frequency $f_e$, and the vector quantity $(Z, \theta)$ of the impedance in the above measured region of the matching circuit 2A is measured. The real part in the complex expression of impedance is calculated therefrom and is defined as the AC resistance.

As indicated by an arrow $I_{RB}$ in FIG. 17, the radiofrequency factors contributing to the output-terminal-side AC resistance RB in the matching circuit 2A lying on the path extending from the point PR to the connection point BP1 as the ground potential portion via the branching point B1 are as follows:

Parasitic resistance $R_{SW1}$ in the switch SW1
Inductance $L_{SW1}$ in the switch SW1
Capacitance $C_T$ of the tuning capacitor 24
Parasitic resistance $R_{R4}$ in the conductor R4
Inductance $L_{R4}$ in the conductor R4
Capacitance $C_L$ of the load capacitor 22
Parasitic resistance $R_{R2}$ in the conductor R2
Inductance $L_{R2}$ in the conductor R2

Among these radiofrequency factors, the parasitic resistance $R_{R4}$ in the conductor R4 and the parasitic resistance $R_{R2}$ in the conductor R2 are measured as the output-terminal-side AC resistance RB in the matching circuit 2A, as shown in FIG. 17.

In the measuring the output-terminal-side AC resistance RB, the parasitic resistance $R_{R4}$ includes parasitic resistances on the circuit indicated by the arrow $I_{RB}$ not illustrated in the drawing, such as resistance from the branching point B1 to the load capacitor 22.

The following radiofrequency factors contribute to the output-terminal-side AC resistance RB in the matching circuit 2A during the measurement as shown in FIG. 17, but are negligible when the radiofrequency power is supplied to the plasma processing chamber from the radiofrequency generator 1.

Parasitic resistance $R_{61B}$ in the connecting line 61B
Inductance $L_{61B}$ in the connecting line 61B
Capacitance $C_{61B}$ in the connecting line 61B
Parasitic resistance $R_{61'}$ in the measuring terminal 61'
Inductance $L_{61'}$ in the measuring terminal 61'

An operation is performed to eliminate the contribution from these factors after the measurement of the output-terminal-side AC resistance RB.

In the matching circuit 2A of the plasma processing unit of this embodiment, the input- and output-terminal-side AC resistances RA and RB, respectively, are maintained to a value which is less than an upper limit suitable for the operation of the plasma processing unit and variations among different plasma processing units defined by equations (14A) and (14B) are adjusted as in the first and second embodiments.

The plasma processing apparatus of this embodiment exhibits the same advantages as in the first and second embodiments. Moreover, the feed line 1A is included in the measured region of the matching circuit 2A; hence, the adjustment including the parasitic resistance in the component which supplies electrical power can be more precisely achieved. Thus, the differences in radiofrequency characteristics between the time $t_0$ and the later time $t_1$ can be further reduced. Even when a phenomenon affecting the radiofrequency characteristics occurs, the difference in the radiofrequency characteristics can be minimized. Since the plasma processing units 95 and 96 can be maintained at a level which is lower than an upper limit indicated by the impedance characteristics, such as DC resistance, capacitance, and impedance, the effective power consumption in the plasma spaces is maintained at substantially the same level at all times. Accordingly, further uniformity in plasma processing using the same process recipe is achieved compared with a case not including the feed line 1A.

In the plasma processing apparatus of this embodiment, the measuring terminals 61 and 61' and the switches SW5, SW1, and SW1' are provided, and the impedance from the point PR3 to the point PR2 is equal to the impedance from the point PR3 to the impedance meter AN via the connecting line 61A. Thus, radiofrequency characteristics, namely the input-terminal-side AC resistance RA and the output-terminal-side AC resistance RB, of each plasma processing unit can be measured without detaching/attaching the matching circuit 2A from/to the radiofrequency generator 1 and the feed plate 3 and without detaching/attaching the probe 105 for impedance measuring. Only by operating the switches SW5, SW1, and SW1', the plasma processing apparatus can be switched between the operation mode and the measuring mode.

Moreover, in this embodiment, the lengths of the connecting lines 61A of the plasma processing units 75, 76, 77, 95 and 96 are set to be equal to each other so that the impedances between the impedance meter AN and the plasma processing units 75, 76, 77, 95, and 96 are the same. Thus, by operating the switch SW5, the input-terminal-side AC resistances RA as the radiofrequency characteristics of the plurality of plasma processing units can be sequentially and rapidly measured.

Furthermore, the connecting lines 61B of these plasma processing units have the same length; hence, the impedances between the impedance meter AN and the plasma processing units are equal to each other. Thus, the output-terminal-side AC resistances RB of the plurality of plasma processing units can be sequentially and rapidly measured by operating the switches SW1 and SW1'.

Fourth Embodiment

A plasma processing apparatus, a plasma processing system, a performance validation method therefor, and an inspection method therefor according to a fourth embodiment of the present invention will now be explained with reference to the drawings.

Figure 18:
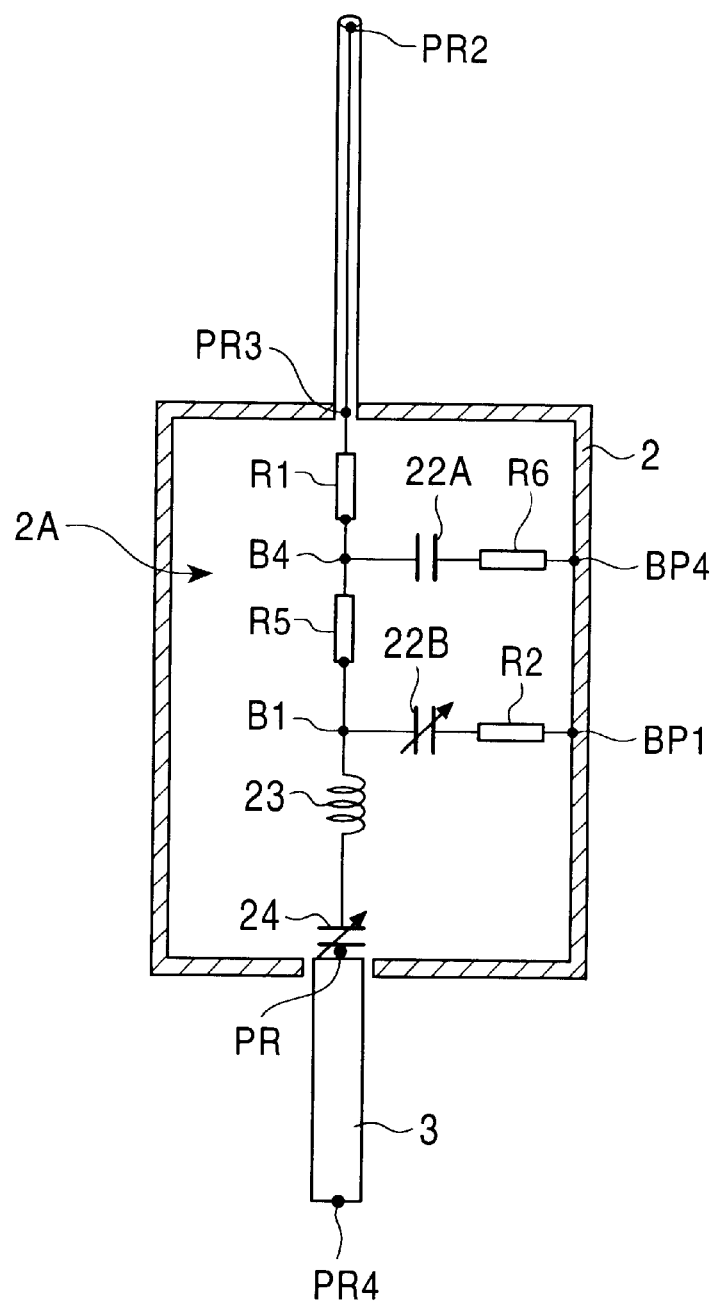
FIG. 18 is a schematic diagram showing a matching circuit of a plasma processing unit according to a fourth embodiment of a plasma processing apparatus.

FIG. 18 is a diagram showing an overall structure of a matching circuit in a plasma processing unit of a plasma processing apparatus of this embodiment.

The structure of the plasma processing apparatus of this embodiment is substantially the same as that according to the first to third embodiments shown in FIGS. 1 to 17. The plasma processing apparatus of this embodiment differs from those of the first to third embodiments in the configuration of the matching circuit 2A in the plasma processing unit and the measured region of the matching circuit 2A. Like components are represented by the same reference numerals and the explanations thereof are omitted.

Referring to FIG. 18, in each of the plasma processing units 75, 76, 77, 95, and 96, the input-terminal-side AC resistance RA is measured at the point PR2 and the output-terminal-side AC resistance RB is measured at the point PR4 which is located at the electrode-4-side and corresponds to the output terminal of the radiofrequency feeder (feed plate) 3 connected to the matching circuit 2A, as in the third embodiment.

As in the first and second embodiment, the input terminal of the matching circuit 2A is directly connected to the feed line 1A without the switch SW5.

Figure 19:
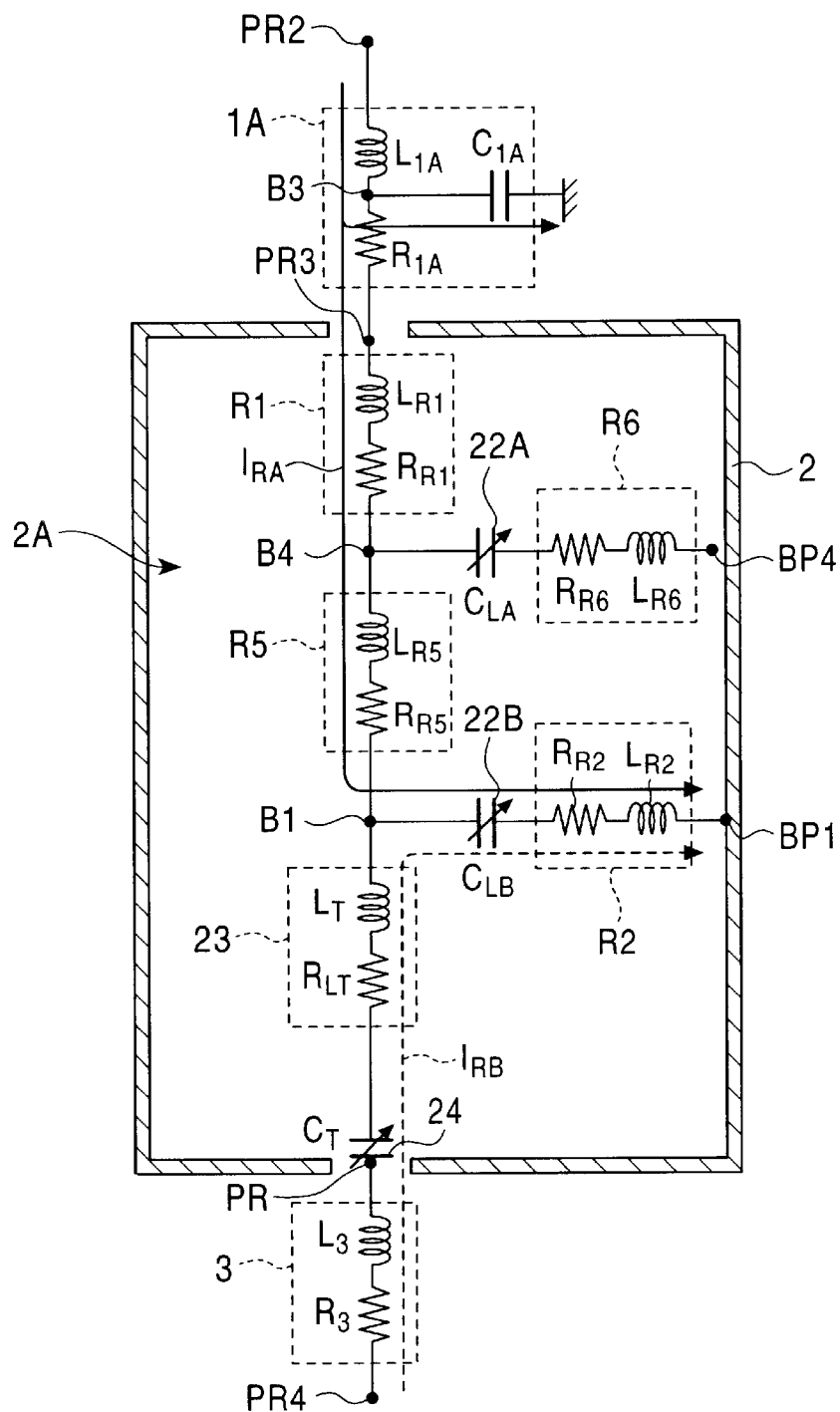
FIG. 19 is a schematic circuit diagram describing parasitic resistances in the matching circuit shown in FIG. 18.
Figure 20:
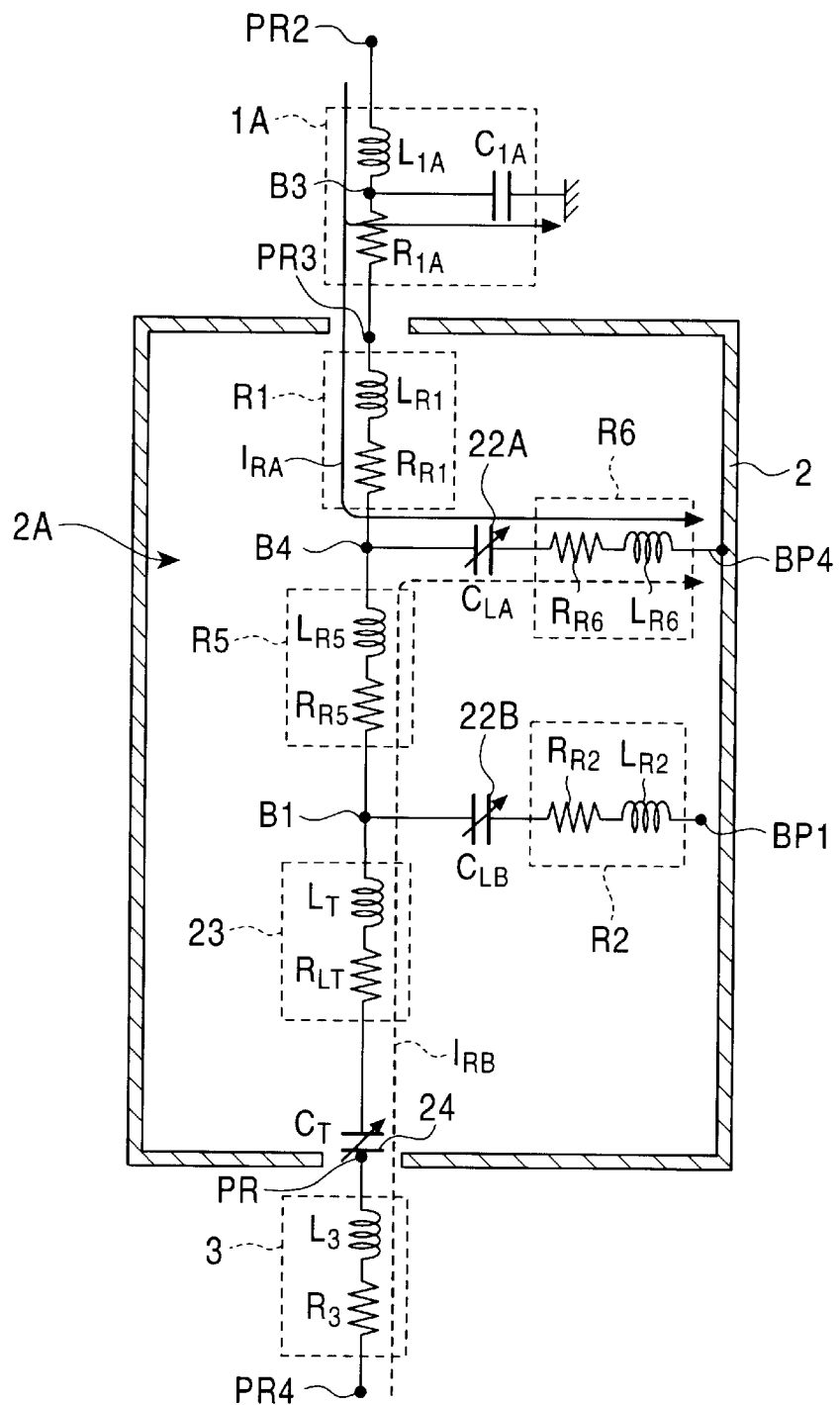
FIG. 20 is a schematic circuit diagram describing parasitic resistances in the matching circuit shown in FIG. 18.

FIGS. 19 and 20 are schematic circuits diagram for explaining parasitic resistance in the matching circuit 2A shown in FIG. 18.

The matching circuit 2A is connected between the radiofrequency generator 1 and the feed plate 3, as shown in FIGS. 18 to 20, and includes as the passive elements the inductance coil 23, the tuning capacitor 24 comprising the air-variable capacitor, and load capacitors 22A and 22B each comprising a vacuum-variable capacitor. The matching circuit 2A also includes the conductors R1, R2, and R5 and a conductor R6 for connecting these passive elements. The conductors R1, R2, R5, and R6 are made of copper plates.

The conductors R1 and R5, the inductance coil 23, and the tuning capacitor 24 are connected in series from the input-terminal-side to the output-terminal-side of the matching circuit 2A. The load capacitor 22A is connected to these elements in parallel at a branching point B4 disposed between the conductors R1 and R5, and the load capacitor 22B is connected to these elements in parallel at the branching point B1 disposed between the conductor R5 and the inductance coil 23. One end of the load capacitor 22A is connected to the matching box 2 (ground potential portion) at a connection point BP4 via the conductor R6. One end of the load capacitor 22B is connected to the matching box 2 (ground potential portion) at the connection point BP1 via the conductor R2.

The tuning capacitor 24 is located at the last stage of the matching circuit 2A among the passive elements constituting the matching circuit 2A. The output terminal of the tuning capacitor 24 functions as the output terminal of the matching circuit 2A. The tuning capacitor 24 is connected to the plasma excitation electrode 4 via the feed plate 3.

The AC resistances RA and RB as the radiofrequency characteristics in the matching circuit 2A of each of the plasma processing units 75, 76, 77, 95, and 96 are measured and defined as in the first to third embodiments. Specifically, the AC resistances RA and RB are measured and defined as shown in FIGS. 18 to 20 in this embodiment.

In order to define the measured region of the matching circuit 2A of this embodiment, the matching circuit 2A is separated from the plasma processing unit at the point PR4 which corresponds to the output terminal of the radiofrequency feeder (feed plate) 3, as shown in FIG. 18. In other words, the matching circuit 2A and the feed plate 3 connected to the matching circuit 2A are separated from the plasma processing chamber 60. Meanwhile, the matching circuit 2A and the feed line 1A connected to the input terminal of the matching circuit 2A are separated from the radiofrequency generator 1.

In this embodiment, the input-terminal-side AC resistance RA in the above-described measured region is measured at the point PR2, as shown in FIG. 18.

Referring to FIG. 19, in measuring the input-terminal-side AC resistance RA, the connection point BP4 is first detached from the matching box 2, and the probe 105 of the impedance meter AN is connected to a ground position of the matching box 2 (ground potential portion) and to the point PR2, as in the first and second embodiments. The shielding line of the feed line 1A is grounded. The frequency oscillated by the impedance meter AN is then set at about 40.68 MHz which is equal to the power frequency $f_e$, for example, to measure the vector quantity (Z, θ) of the impedance in the above measured region of the matching circuit 2A. The real part in the complex expression of the impedance is calculated therefrom and is defined as the input-terminal-side AC resistance $RA_{BP1}$.

The radiofrequency factors contributing to the input-terminal-side AC resistance $RA_{BP1}$ of the matching circuit 2A lying in the circuit indicated by an arrow $I_{RA}$ in FIG. 19 extending from the point PR2 to the connection point BP1 on the matching box 2 which is a ground potential portion via the branching point B1 are as follows:

Parasitic resistance $R_{1A}$ in the feed line 1A
Inductance $L_{1A}$ in the feed line 1A
Capacitance $C_{1A}$ of the feed line 1A
Parasitic resistance $R_{R1}$ in the conductor R1

Inductance $L_{R1}$ in the conductor R1
Parasitic resistance $R_{R5}$ in the conductor R5
Inductance $L_{R5}$ in the conductor R5
Capacitance $C_{LB}$ of the load capacitor 22B
Parasitic resistance $R_{R2}$ in the conductor R2
Inductance $L_{R2}$ in the conductor R2
wherein the capacitance $C_{1A}$ of the feed line 1A is the capacitance generated with the shielding line.

Among these radiofrequency factors, the parasitic resistance $R_{1A}$ in the feed line 1A, the parasitic resistance $R_{R1}$ in the conductor R1, the parasitic resistance $R_{R5}$ in the conductor R5, and the parasitic resistance $R_{R2}$ in the conductor R2 are measured as the input-terminal-side AC resistance $RA_{BP1}$ of the matching circuit 2A, as shown in FIG. 19.

Next, as shown in FIG. 20, the connection point BP1 is disconnected from the matching box 2 while connecting the connection point BP4 to the matching box 2 to measure the input-terminal-side AC resistance $RA_{BP2}$. As in the above, the probe 105 of the impedance meter AN is connected to the point PR2 and to a ground position on the matching box 2 (ground potential portion), and the frequency oscillated by the impedance meter AN is set at a power frequency $f_e$, i.e., about 40.68 MHz, for example, to measure the vector quantity (Z, θ) of the impedance in the above measured region of the matching circuit 2A. The real part of the complex expression of the impedance is calculated therefrom and defined as the input-terminal-side AC resistance $RA_{BP2}$.

The radiofrequency factors contributing to the input-terminal-side AC resistance $RA_{BP2}$ of the matching circuit 2A lying in the circuit indicated by the arrow $I_{RA}$ in FIG. 20 extending from the point PR3 to the connection point BP4 via the branching point B4 are as follows:
   Parasitic resistance $R_{1A}$ in the feed line 1A
   Inductance $L_{1A}$ in the feed line 1A
   Capacitance $C_{1A}$ in the feed line 1A
   Parasitic resistance $R_{R1}$ in the conductor R1
   Inductance $L_{R1}$ in the conductor R1
   Capacitance $C_{LA}$ in the load capacitor 22A
   Parasitic resistance $R_{R6}$ in the conductor R6
   Inductance $L_{R6}$ in the conductor R6

Among these radiofrequency factors, the parasitic resistance $R_{1A}$ in the feed line 1A, the parasitic resistance $R_{R1}$ in the conductor R1, and the parasitic resistance $R_{R6}$ in the conductor R6 are measured as the input-terminal-side AC resistance $RA_{BP2}$ of the matching circuit 2A, as shown in FIG. 20.

In measuring the output-terminal-side AC resistance RB of the matching circuit 2A, the connection point BP4 is first detached from the matching box 2 and then the output-terminal-side AC resistance RB is measured at the point PR4, as shown in FIG. 19. The probe 105 of the impedance meter AN is attached to the point PR4 and to a ground position on the matching box 2 (ground potential portion). The frequency oscillated by the impedance meter AN is then set at a power frequency $f_e$, i.e., about 40.68 MHz, for example, to measure the vector quantity (Z, θ) of the impedance in the above measured region of the matching circuit 2A. The real part of the complex expression of the impedance is calculated therefrom and defined as the output-terminal-side AC resistance $RB_{BP1}$.

Referring to FIG. 19, the radiofrequency factors contributing to the output-terminal-side AC resistance $RB_{BP1}$ of the matching circuit 2A lying on the path indicated by an arrow $I_{RB}$ extending from the point PR4 to the connection point BP1 on the matching box 2 which is a ground potential portion, via the branching point B1 are as follows:
   Parasitic resistance $R_3$ in the feed plate 3;
   Inductance $L_3$ in the feed plate 3;
   Capacitance $C_T$ of the tuning capacitor 24;
   Parasitic resistance $R_{LT}$ in the inductance coil 23;
   Inductance $L_T$ in the inductance coil 23;
   Capacitance $C_{LB}$ of the load capacitor 22B;
   Parasitic resistance $R_{R2}$ in the conductor R2; and
   Inductance $L_{R2}$ in the conductor R2.

Among these radiofrequency factors, the parasitic resistance $R_{R4}$ in the conductor R4, the parasitic resistance $R_{LT}$ in the inductance coil 23, and the parasitic resistance $R_{R2}$ in the conductor R2 are measured as the output-terminal-side AC resistance $RB_{BP1}$ in the matching circuit 2A, as shown in FIG. 19.

Next, referring to FIG. 20, in measuring the output-terminal-side AC resistance $RB_{BP2}$, the connection point BP1 is detached from the matching box 2 and the connection point BP4 is connected to the matching box 2. The probe 105 of the impedance meter AN is connected to the point PR4 and to a ground position on the matching box 2 (ground potential portion). The frequency oscillated from the impedance meter AN is then set at a power frequency $f_e$, i.e., about 40.68 MHz, for example, to measure the vector quantity (Z, θ) of the impedance in the above measured region of the matching circuit 2A. The real part in the complex expression of the impedance is calculated therefrom and defined as the output-terminal-side AC resistance $RB_{BP2}$.

The radiofrequency factors contributing to the output-terminal-side AC resistance $RB_{BP2}$ of the matching circuit 2A lying on the path indicated by an arrow $I_{RB}$ in FIG. 20 extending from the point PR4 to the connection point BP4 on the matching box 2 which is a ground potential portion, via the branching point B1 are as follows:
   Parasitic resistance $R_3$ in the feed plate 3;
   Inductance $L_3$ in the feed plate 3;
   Capacitance $C_T$ of the tuning capacitor 24;
   Parasitic resistance $R_{LT}$ in the inductance coil 23;
   Inductance $L_T$ in the inductance coil 23;
   Parasitic resistance $R_{R5}$ in the conductor R5;
   Inductance $L_{R5}$ in the conductor R5;
   Capacitance $C_{LA}$ of the load capacitor 22A;
   Parasitic resistance $R_{R6}$ in the conductor R6; and
   Inductance $L_{R6}$ in the conductor R6.

Among these radiofrequency factors, the parasitic resistance $R_3$ in the feed plate 3, the parasitic resistance $R_{LT}$ in the inductance coil 23, the parasitic resistance $R_{R5}$ in the conductor R5, and the parasitic resistance $R_{R6}$ in the conductor R6 are measured as the output-terminal-side AC resistance $RB_{BP2}$, as shown in FIG. 20.

In the matching circuit 2A of the plasma processing unit of this embodiment, the AC resistances RA and RB as the radiofrequency characteristics are set to a value suitable for the operation of the plasma processing unit, as in the second embodiment. More specifically, the input-terminal-side AC resistance $RA_{BP1}$, the input-terminal-side AC resistance $RA_{BP2}$, the output-terminal-side AC resistance $RB_{BP1}$, and the output-terminal-side AC resistance $RB_{BP2}$ are each set at a value suitable for the operation of the plasma processing unit. Meanwhile, the variations <RA> and <RB> among a plurality of plasma processing units defined by equations (14A'), (14A"), (14B'), and (14B") are adjusted so that the effective power consumed in the plasma spaces of these units can be made substantially the same.

In the matching circuit 2A of this embodiment, the input-terminal-side AC resistances $RA_{BP1\text{-}0}$ and $RA_{BP2\text{-}0}$ and the output-terminal-side AC resistance $RB_{BP1\text{-}0}$ and $RA_{BP2\text{-}0}$ measured as above, i.e., measured at a time $t_0$, are set at values suitable for the operation of the plasma processing unit. Even after disassembly, transfer, and reassembly of the apparatus, after performance of plasma processes, or after adjustment work such as overhaul, parts replacement, and assembly with alignment, $RA_{BP1\text{-}1}$, $RA_{BP2\text{-}1}$, $RB_{BP1\text{-}1}$, and $RA_{BP2\text{-}1}$ measured at that time, i.e., at a time $t_1$, are maintained at such values that the absolute value of the difference $\Delta RA_{BP1}$ between $RA_{BP1\text{-}0}$ and $RA_{BP1\text{-}1}$ is less than 0.4 times $RA_{BP1\text{-}0}$, the absolute value of the difference $\Delta RA_{BP2}$ between $RA_{BP2\text{-}0}$ and $RA_{BP2\text{-}1}$ is less than 0.4 times $RA_{BP2\text{-}0}$, the absolute value of the difference $\Delta RB_{BP1}$ between $RB_{BP1\text{-}0}$ and $RB_{BP1\text{-}1}$ is less than 0.4 times $RB_{BP1\text{-}0}$, and the absolute value of the difference $\Delta RB_{BP2}$ between $RB_{BP2\text{-}0}$ and $RB_{BP2\text{-}1}$ is less than 0.4 times $RB_{BP2\text{-}0}$. When any one of $\Delta RA_{BP1}$, $\Delta RA_{BP2}$, $\Delta RB_{BP1}$, and $\Delta RB_{BP2}$ does not satisfy the above condition, corrective action will be performed.

In order to adjust $RA_{BP1\text{-}1}$, $RA_{BP2\text{-}1}$, $RB_{BP1\text{-}1}$, and $RA_{BP2\text{-}1}$ Methods A to D above can be employed, for example.

The plasma processing apparatus and the inspection method therefor of this embodiment have the same advantages as in the first to third embodiments. In addition, since the feed plate 3 is included in the measured region of the matching circuit 2A, parasitic resistance existing in the component which supplies power to the electrode can be included in the measurement. Thus, the radiofrequency characteristics of the plasma processing unit can be more precisely determined compared to the case in which the feed plate 3 is not included in the measured region. Moreover, the difference in the radiofrequency characteristics before and after the occurrence of an event which may affect the radiofrequency characteristics, i.e., disassembly, transfer, and reassembly of the plasma processing apparatus, performance of the plasma processes, and adjustment work such as overhaul, parts replacement, and assembly with alignment, can be further securely eliminated. Thus, the plasma processing units 75, 76, 77, 95 and 96 can be maintained at the satisfactory level indicated by the AC resistances RA and RB, capacitance, and impedance characteristics regardless of the time lapse. Effective power consumed in the plasma space can be made substantially uniform over time, and substantially the same plasma process results can be achieved compared to the case in which the feed plate 3 is not included in the measured region.

In each of the above described embodiments, the upper limit may be 0.5 or 0.4 times the relevant value at the time $t_0$. Also, the measuring point may be selected from among the points PR, PR2, PR3, and PR4.

Moreover, a switch or switches similar to the switches SW1, SW1', and SW5, and a measuring terminal similar to the measuring terminals 61 and 61' for switching between the impedance meter AN and the radiofrequency generator 1 may be provided at the point PR in each of the above-described embodiments.

Furthermore, these measuring points, switches, and the measuring terminals may be set in relation to the matching circuit 25.

Fifth Embodiment

A performance management system for a plasma processing apparatus in accordance with a fifth embodiment will now be described with reference to the drawings.

Figure 21:
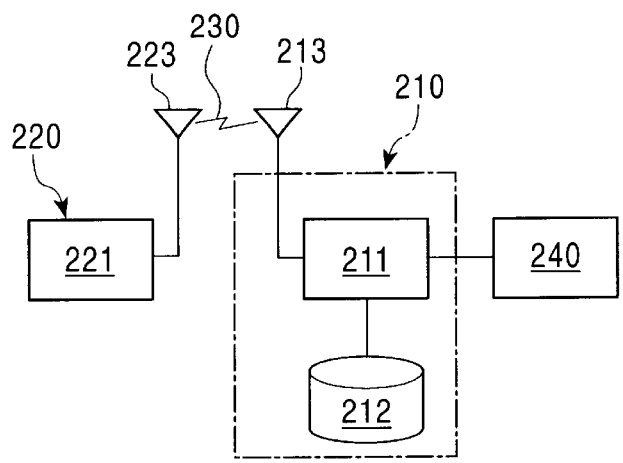
FIG. 21 is a block diagram of a performance management system for a plasma processing system in accordance with a fifth embodiment of the present invention.
Figure 22:
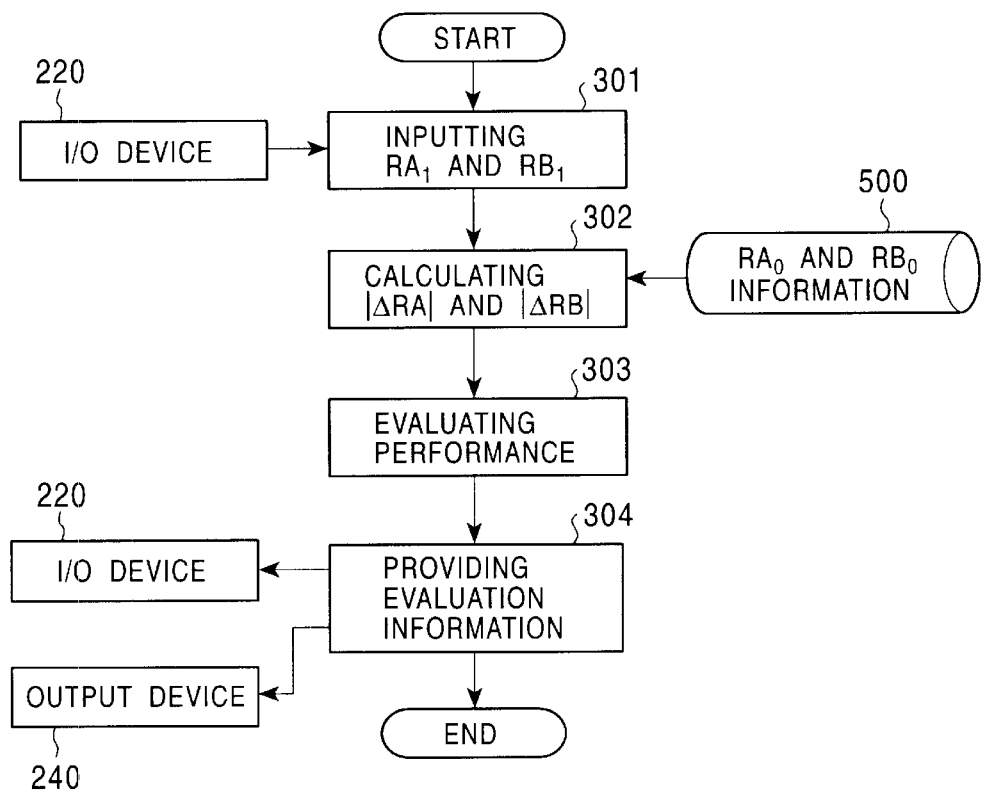
FIG. 22 is a flowchart illustrating a method for providing evaluation information which is prepared by the performance management system shown in FIG. 21.

FIG. 21 is a block diagram of a performance management system for a plasma processing apparatus of this embodiment, and FIG. 22 is a flowchart illustrating a method for providing evaluation information which is prepared by this performance management system.

The performance management system shown in FIG. 21 includes a server 210, a customer I/O device 220 at a customer site, a communication line 230 for linking the server 210 and the customer I/O device 220, and an output device 240 at a delivery site, the output device 240 being linked to the server 210.

The server 210 is controlled at a delivery site, for example, by a manufacturer, a distributor, or a maintenance company of the plasma processing apparatus. Thus, the server 210 is preferably placed at the delivery site. The server 210 is preferably provided with a high-speed computer for simultaneously providing services to a plurality of customer I/O devices 220 and a high-capacity memory unit for storing information regarding a variety of services and plasma processing apparatuses at customer sites. Examples of such machines are large computers and high-performance workstations.

The server 210 includes a computer 211, a memory unit 212 linked to the computer 211, and a transmitter/receiver 213 linked to the communication line 230. The memory unit 212 stores the input-terminal-side AC resistance $RA_0$ and the output-terminal-side AC resistance $RB_0$ at the time $t_0$ as radiofrequency characteristics. The server 210 has an output device 240 at the delivery site.

The customer I/O device 220 at the customer site is used by the customer and a maintenance engineer visiting the customer. The customer I/O device 220 is placed at the customer site or is brought to the customer site. Any type of the customer I/O device 220 may be used without limitation as long as the device can perform transmitting/receiving of signals to/from the server 210 via the communication line 230. Examples of such devices are personal computers, dedicated terminals, and telephones.

The customer I/O device 220 includes a body 221 and a transmitter/receiver 223 linked to the communication line 230.

The communication line 230 may be of any form which can perform transmitting/receiving of signals between the server 210 and the customer I/O device 220 which are distant from each other. Examples of communication lines 230 are communication media, such as cables, optical fiber lines, satellite circuits, telephone lines, and the Internet.

Referring to FIG. 21, the operation of this embodiment will now be described according to the flowchart shown in FIG. 22. A user or customer at a delivery site or a maintenance engineer who visits the customer of the performance management system measures the AC resistance $RA_1$ and the AC resistance $RB_1$ at the later time $t_1$ for each of the plasma processing apparatuses according to the embodiments shown in FIGS. 1 to 20 which are installed or in use at the customer site and inputs these values through the customer I/O device 220 (Step 301). The input AC resistances $RA_1$ and $RB_1$ are transmitted to the server 210 via the communication line 230.

The server 210 calls up information 500 of the AC resistances $RA_0$ and $RB_0$ at the time $t_0$ as reference radiofrequency characteristics of the corresponding plasma processing apparatus which are stored in the memory unit 212 to calculate the absolute value $|\Delta RA|$ of the difference $\Delta RA$ between the AC resistances $RA_0$ and $RA_1$ and the absolute value $|\Delta RB|$ of the difference $\Delta RB$ between the AC resistances $RB_0$ and $RB_1$ (Step 302).

The AC resistances $RA_0$ and $RB_0$ as the references are determined at the delivery site before disassembling the plasma processing apparatus for transporting to the customer. The AC resistances $RA_0$ and $RB_0$ are set to a predetermined value for matching circuits 2A of a plurality of plasma processing units so that these plasma processing units operate in an optimized state. Moreover, the variations <RA> and <RB> are set for these plasma processing units according to equations (14A) and (14B). As a result, these plasma processing units consume substantially the same effective power in the plasma spaces.

The server 210 compares the absolute value $|\Delta RA|$ and the absolute value $|\Delta RB|$ calculated in Step 302 with AC resistance $RA_0$ and the AC resistance $RB_0$, respectively, to evaluate the performance of the plasma processing apparatus. When the absolute value $|\Delta RA|$ is less than 0.5 times the AC resistance $RA_0$ and when the absolute value $|\Delta RB|$ is less than 0.5 times the AC resistance $RB_0$, the server 210 determines that the plasma processing apparatus maintains a required level of performance. When either the absolute value $|\Delta RA|$ or $|\Delta RB|$ is not less than 0.5 times the AC resistance $RA_0$ or the AC resistance $RB_0$, respectively, the server 210 determines that the plasma processing apparatus does not maintain the required level of performance (Step 303).

Next, the server 210 provides the results of the performance evaluation to both the customer I/O device 220 and the output device 240 at the delivery site (Step 304).

The server 210 transmits print, display, or sound alarm signals to the customer I/O device 220. When the server 210 determines that the required level of performance is maintained, the server 210 outputs, for example, a message "this apparatus still exhibits a required level of performance sufficient for practical use." When the server 210 determines that the required level of performance is not maintained, the server 210 outputs, for example, a message "Please adjust this apparatus according to the manual included because the performance may not be maintained at the required level." These messages may be output for the customer or the maintenance engineer by printing, by display on a screen, or by voice.

Also, the server 210 transmits print, display, or sound alarm signals to the output device 240 when the server 210 determines that the required level of performance is not maintained. The output device 240 outputs a maintenance command by printing or displaying a message or providing a signal or alarm. It is preferable that the identification number of the plasma processing chamber be received from the customer I/O device 220 and be output from the output device 240 so that the apparatus requiring the maintenance can be specified at the delivery site. Alternatively, the serial number or phone number of the customer I/O device 220 may be used to determine the identification number of the plasma processing chamber and to output the results from the output device 240.

As a result, the customer or the maintenance engineer who visits the customer can rapidly evaluate the plasma processing apparatus without actually inspecting the substrates used for layer deposition in this apparatus.

Moreover, the plasma processing apparatus can be directly evaluated in situ in a short period of time, instead of a two-stage evaluation, i.e., processing of the substrates and confirmation and evaluation of the operation of the plasma processing units 75, 76, 77, 95, and 96 based on the evaluation of the processed substrates. If an inspection process by layer deposition on the substrates is employed in a plasma processing apparatus having a plurality of plasma processing chambers, these plasma processing chambers can be simultaneously evaluated.

Since substrates with deposited layers are not used for checking, the performance management system for the plasma processing apparatus does not require shutdown of the production line for several days to several weeks, thereby improving productivity of the production line. The production line, therefore, has high productivity with reduced expenses for substrates used in the inspection, processing of these substrates, and labor during the inspection operations.

The manufacturer and so on at the delivery site can immediately identify the problems of the plasma processing apparatus at the customer site by the maintenance command, thus providing a satisfactory repair service.

When the server 210 provides the evaluation information to both the customer I/O device 220 and the output device 240 at the delivery site as in this embodiment, the predetermined value provided for the customer I/O device 220 may be different from the predetermined value provided for the output device 240. For example, the predetermined values for the customer I/O device 220 are set at 0.5 times the AC resistances $RA_0$ and $RB_0$ to transmit a signal indicating that the required level of performance is not maintained when either the absolute value $|\Delta RA|$ or $|\Delta RB|$ is not less than 0.5 times the AC resistance $RA_0$ or $RB_0$, respectively. On the other hand, the predetermined values for the output device 240 are set at 0.4 times the AC resistances $RA_0$ and $RB_0$ to output a maintenance command when either the absolute value $|\Delta RA|$ or $|\Delta RB|$ is not less than 0.4 times the AC resistance $RA_0$ or $RB_0$, respectively. By outputting the maintenance command based on such an evaluation standard at the delivery site which is more severe than that at the customer site, the maintenance engineer can provide maintenance service before the performance of the plasma processing apparatus significantly varies, namely, preventive service.

Sixth Embodiment

Another performance management system for a plasma processing apparatus in accordance with a sixth embodiment will now be described with reference to the drawings.

Figure 23:
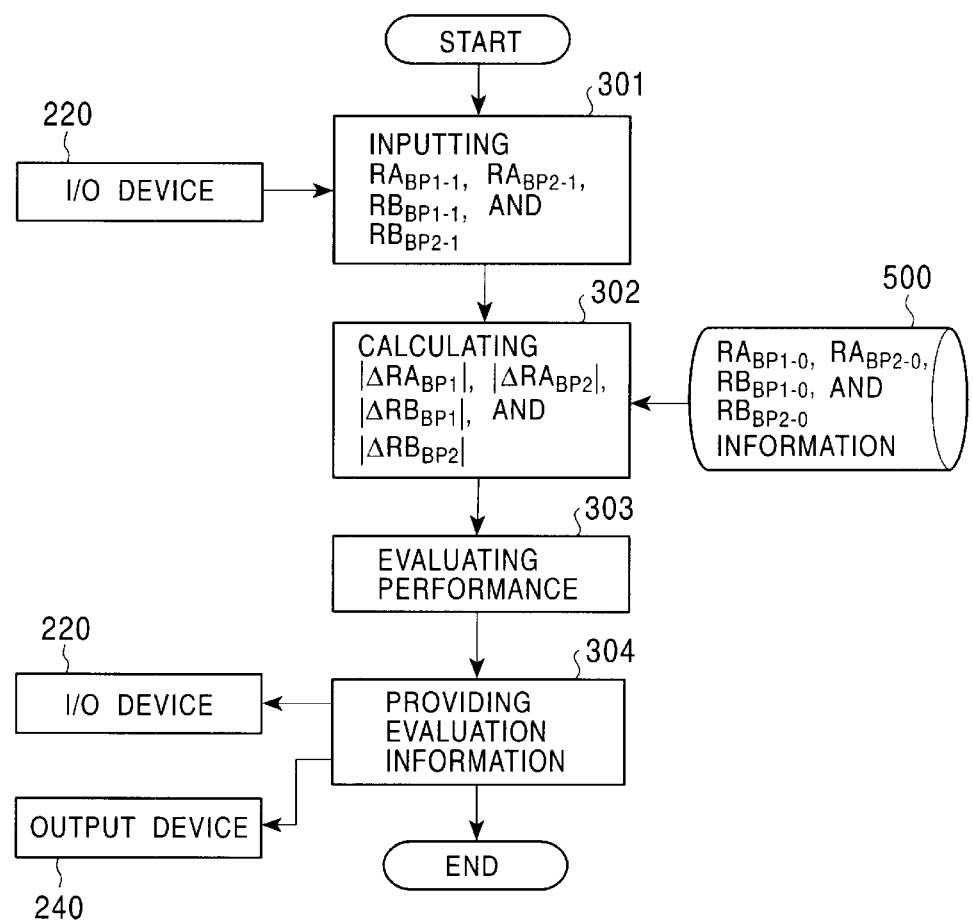
FIG. 23 is a flowchart illustrating another method for providing evaluation information which is prepared by the performance management system in accordance with a sixth embodiment.

FIG. 23 is a flowchart illustrating a method for providing evaluation information which is prepared by this performance management system. In the drawing, the components shown in FIG. 22 are referred to with the same reference numerals and the description thereof is omitted.

In this embodiment, the matching circuit 2A has a plurality of connection points as in the plasma processing apparatuses according to the second embodiment with reference to FIGS. 11 to 14 and the fourth embodiment with reference to FIGS. 18 to 20. The description will be focussed to the calculation according to these connection points.

The server 210 includes a computer 211, a memory unit 212 linked to the computer 211, and a transmitter/receiver 213 linked to the communication line 230. The memory unit 212 stores the input-terminal-side AC resistances $RA_{BP1-0}$ and $RA_{BP1-1}$ and the output-terminal-side AC resistances $RB_{BP1-0}$ and $RB_{BP1-1}$ at the time $t_0$ as radiofrequency characteristics. The server 210 has an output device 240 at the delivery site.

Referring to FIG. 21, the operation of this embodiment will now be described according to the flowchart shown in FIG. 23. A user or customer at a delivery site or a maintenance engineer who visits the customer of the performance management system measures the input-terminal-side AC resistances $RA_{BP1-1}$ and $RA_{BP2-1}$ and the output-terminal-side AC resistances $RB_{BP1-1}$ and $RB_{BP2-1}$ at the later time $t_1$ for each of the plasma processing apparatuses according to the second embodiment shown in FIGS. 11 to 14 and the fourth embodiment shown in FIGS. 18 to 20 which are installed or in use at the customer site and inputs these values through the customer I/O device 220 (Step 301). The input AC resistances $RA_{BP1-1}$, $RA_{BP2-1}$, $RB_{BP1-1}$, and $RB_{BP2-1}$ are transmitted to the server 210 via the communication line 230.

The server 210 calls up information 500 of the input-terminal-side AC resistances $RA_{BP1-0}$ and $RA_{BP2-0}$ and the output-terminal-side AC resistances $RB_{BP1-0}$ and $RB_{BP2-0}$ at the time $t_0$ as reference radiofrequency characteristics of the corresponding plasma processing apparatus from the memory unit 212 to calculate the absolute value $|\Delta RA_{BP1}|$ of the difference $\Delta RA_{BP1}$ between the input-terminal-side AC resistances $RA_{BP1-0}$ and $RA_{BP1-1}$, the absolute value $|\Delta RA_{BP2}|$ of the difference $\Delta RA_{BP2}$ between the input-terminal-side AC resistances $RA_{BP2-0}$ and $RA_{BP2-1}$, the absolute value $|\Delta RB_{BP1}|$ of the difference $\Delta RB_{BP1}$ between the output-terminal-side AC resistances $RB_{BP1-0}$ and $RB_{BP1-1}$, and the absolute value $|\Delta RB_{BP2}|$ of the difference $\Delta RB_{BP2}$ between the output-terminal-side AC resistances $RB_{BP2-0}$ and $RB_{BP2-1}$ (Step 302).

The AC resistances $RA_{BP1-0}$, $RA_{BP2-0}$, $RB_{BP1-0}$, and $RB_{BP2-0}$ as the references are determined at the delivery site before disassembling the plasma processing apparatus for transporting to the customer. The AC resistances $RA_{BP1-0}$, $RA_{BP2-0}$, $RB_{BP1-0}$, and $RB_{BP2-0}$ are set to a predetermined value for matching circuits 2A of a plurality of plasma processing units so that these plasma processing units operate in an optimized state. Moreover, the variations <RA> and <RB> are set for these plasma processing units according to equations (14A'), (14A"), (14B'), and (14B"). As a result, these plasma processing units consume substantially the same effective power in the plasma spaces.

The server 210 compares the absolute values $|\Delta RA_{BP1}|$, $|\Delta RA_{BP2}|$, $|\Delta RB_{BP1}|$, and $|\Delta RB_{BP2}|$ calculated in Step 302 with AC resistances $RA_{BP1-0}$, $RA_{BP2-0}$, $RB_{BP1-0}$, and $RB_{BP2-0}$, respectively, from the information 500 to evaluate the performance of the plasma processing apparatus. When the absolute value $|\Delta RA_{BP1}|$ is less than 0.5 times the AC resistance $RA_{BP1-0}$ when the absolute value $|\Delta RA_{BP2}|$ is less than 0.5 times the AC resistance $RA_{BP2-0}$, when the absolute value $|\Delta RB_{BP1}|$ is less than 0.5 times the AC resistance $RB_{BP1-0}$, and when the absolute value $|\Delta RB_{BP2}|$ is less than 0.5 times the AC resistance $RB_{BP2-0}$, the server 210 determines that the plasma processing apparatus maintains a required level of performance. When any one of the absolute value $|\Delta RA_{BP1}|$, $|\Delta RA_{BP2}|$, $|\Delta RB_{BP1}|$, and $|\Delta RB_{BP2}|$ is not less than 0.5 times the AC resistance $RA_{BP1-0}$, $RA_{BP2-0}$, $RB_{BP1-0}$, or $RB_{BP2-0}$, respectively, the server 210 determines that the plasma processing apparatus does not maintain the required level of performance (Step 303).

Next, the server 210 provides the results of the performance evaluation to both the customer I/O device 220 and the output device 240 at the delivery site (Step 304). The subsequent steps are the same as those in the second embodiment.

The performance management system of this embodiment is suited for a plasma processing apparatus having a matching circuit 2A including a plurality of connection points. When the matching circuit 2A includes only one connection point, this system determines whether or not the plasma processing apparatus satisfies a required level of performance based on the four references $|\Delta RA_{BP1}|$, $|\Delta RA_{BP2}|$, $|\Delta RB_{BP1}|$, and $|\Delta RB_{BP2}|$. In this case, the plasma chamber units can be more precisely evaluated compared with determination based on the two references $|\Delta RA|$ and $|\Delta RB|$.

Seventh Embodiment

Another performance management system for a plasma processing apparatus in accordance with a seventh embodiment will now be described with reference to the drawings.

Figure 24:
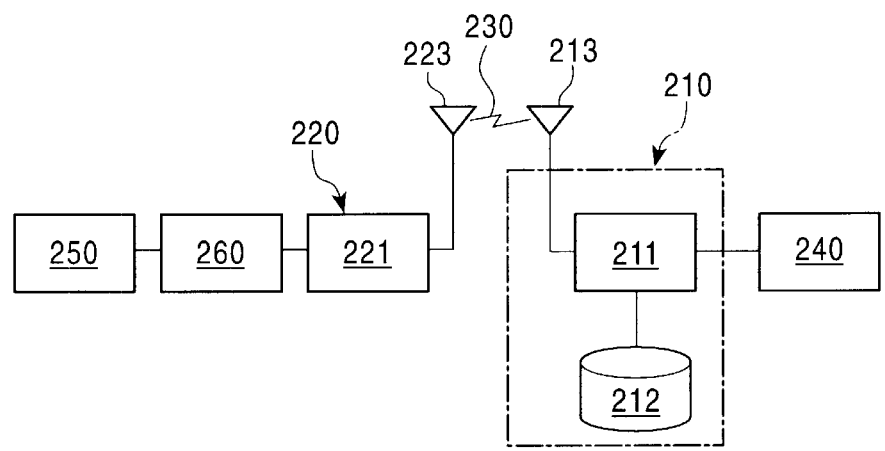
FIG. 24 is a block diagram of a performance management system for a plasma processing system in accordance with a seventh embodiment of the present invention.
Figure 25:
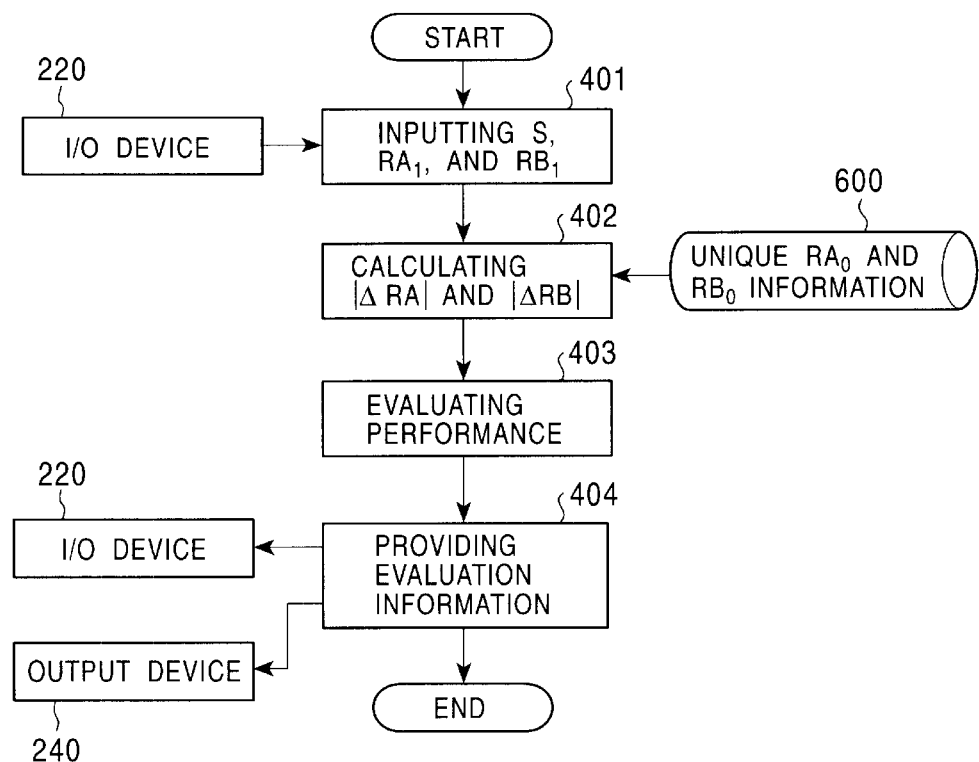
FIG. 25 is a flowchart illustrating processing for providing performance information from a server in the performance validation system of the plasma processing apparatus in accordance with the present invention.

FIG. 24 is a block diagram of a performance management system for a plasma processing apparatus of this embodiment, and FIG. 25 is a flowchart illustrating a method for providing evaluation information which is prepared by this performance management system. In these drawings, the components shown in FIGS. 21 and 22 are referred to with the same reference numerals and the description thereof is omitted.

The performance management system shown in FIG. 24 includes a server 210, a customer I/O device 220, a communication line 230 linking the server 210 and the customer I/O device 220, and an output device 240 at a delivery site, the output device 240 being linked to the server 210. The performance management system further includes a plasma processing apparatus 250 having the same configuration as that in the third embodiment shown in FIGS. 15 to 17 and an impedance meter 260 connected to the plasma processing apparatus 250 for measuring the radiofrequency characteristics.

In this embodiment, the output terminal of the impedance meter 260 is connected to the customer I/O device 220 so that the input-terminal-side AC resistance RA and the output-terminal-side AC resistance RB as the radiofrequency characteristics of the plasma processing apparatus 250 are measured by the impedance meter 260 and are directly transmitted to the server 210 via the customer I/O device 220 and the communication line 230 without input by an operator. The customer I/O device 220 is programmed so as to read the results measured by the impedance meter 260 in response to the input of an identification number S of a plasma processing unit.

The procedure in this embodiment will now be described based on the flowchart shown in FIG. 25, with reference to FIG. 24.

A user of this performance management system, for example, a customer or a maintenance engineer who visits the customer connects the impedance meter 260 to the customer I/O device 220, and inputs the identification number S of the plasma processing chamber which is installed or in use at the customer site from the customer I/O device 220. The input-terminal-side AC resistance $RA_1$ and the output-terminal-side AC resistance $RB_1$ at the later time $t_1$ as radiofrequency characteristics of the plasma processing unit are automatically input into the customer I/O device 220 from the impedance meter 260 according to the program stored in the customer I/O device 220 (Step 401).

The identification number S, the AC resistance $RA_1$, and the AC resistance $RB_1$ are transmitted to the server 210 via the communication line 230.

The server 210 then calls up information 500, stored in a memory device 212, on the peculiar AC resistances $RA_0$ and $RA_0$ at the time $t_0$ of the plasma processing unit corresponding to the identification number S, and calculates the absolute value $|\Delta RA|$ of the differences $\Delta RA$ between the AC resistance $RA_0$ and the AC resistance $RA_1$ and the absolute value $|\Delta RB|$ of the differences $\Delta RB$ between the AC resistance $RB_0$ and the AC resistance $RB_1$ (Step 402).

Herein, the peculiar AC resistances $RA_0$ and $RB_0$ of the plasma processing units are designed and measured when these chambers are manufactured, and are stored in connection with the respective identification numbers S in the memory unit 212.

The server 210 compares the absolute values $|\Delta RA|$ and $|\Delta RA|$ calculated in Step 402 with the AC resistances $RA_0$ and $RB_0$, respectively, from the information 600 to evaluate the performance of the plasma processing apparatus. When the absolute value $|\Delta RA|$ is less than 0.5 times the AC resistance $RA_0$ and when the absolute value $|\Delta RB|$ is less than 0.5 times the AC resistance $RB_0$, the server 210 determines that the plasma processing apparatus maintains a required level of performance. When either the absolute value $|\Delta RA|$ or $|\Delta RB|$ is not less than 0.5 times the AC resistance $RA_0$ or the AC resistance $RB_0$, respectively, the server 210 determines that the plasma processing apparatus does not maintain the required level of performance (Step 403).

Next, the server 210 provides the results of the performance evaluation to both the customer I/O device 220 and the output device 240 at the delivery site (Step 404).

The server 210 transmits print, display, or sound alarm signals to the customer I/O device 220. When the server 210 determines that the required level of performance is maintained, the server 210 outputs, for example, a message "this apparatus still exhibits a required level of performance sufficient for practical use." When the server 210 determines that the required level of performance is not maintained, the server 210 outputs, for example, a message "Please adjust this apparatus according to the manual included because the performance may not be maintained at the required level." These messages may be output for the customer or the maintenance engineer by printing, by display on a screen, or by voice.

Also, the server 210 transmits print, display, or sound alarm signals to the output device 240 when the server 210 determines that the required level of performance is not maintained. The output device 240 outputs a maintenance command by printing or displaying a message or providing a signal or alarm. It is preferable that the identification number of the plasma processing chamber be received from the customer I/O device 220 and be output from the output device 240 so that the apparatus requiring the maintenance can be specified at the delivery site. Alternatively, the serial number or phone number of the customer I/O device 220 may be used to determine the identification number of the plasma processing chamber and to output the results from the output device 240.

The performance management system for the plasma processing apparatus of this embodiment exhibits the same advantages as those in the fifth embodiment. Since the observed values are stored in connection with the identification numbers S of the plasma processing units, the plasma processing units can be more precisely controlled. The manufacturer and so on at the delivery site can immediately specify the relevant plasma processing apparatus or the relevant plasma processing unit.

In this embodiment, the output terminal of the impedance meter 260 is connected to the customer I/O device 220 to directly transmit the input-terminal-side AC resistance RA and the output-terminal-side AC resistance RB which are measured by the impedance meter 260 via the customer I/O device 220 and the communication line 230 to the server 210. The customer I/O device 220 is programmed so as to read the results measured by the impedance meter 260 in response to the input of an identification number S of a plasma processing unit. Thus, the input-terminal-side AC resistance $RA_1$ and the output-terminal-side AC resistance $RB_1$ at the later time $t_1$ as radiofrequency characteristics of the plasma processing unit are automatically input into the customer I/O device 220 from the impedance meter 260. Accordingly, the operator of the plasma processing apparatus can evaluate whether or not the plasma processing apparatus maintains the required level of performance only by monitoring the message on the maintenance of the apparatus.

In a plasma processing apparatus or system having a plurality of plasma processing units, the same radiofrequency characteristics are preferably set for these plasma processing units such that substantially the same film characteristics are achieved using the same process recipe under the same operating conditions. Although the plasma processing chambers preferably have the same peculiar AC resistances $RA_0$ and $RB_0$, these plasma processing chambers may have different values depending on various factors at the customer site etc.

Eighth Embodiment

Another performance management system for a plasma processing apparatus in accordance with an eighth embodiment will now be described with reference to the drawings.

The system configuration of the performance management system in this embodiment is also shown in FIG. 24 for the fifth embodiment. The configuration in this embodiment differs from that in the seventh embodiment in that the server 210 stores maintenance engineer information 601 which includes performance levels, such as fault levels, which correspond to predetermined ranges, and maintenance engineer's names which are registered in response to the fault levels. Table 1 shows an example of the maintenance engineer information 601.

TABLE 1

| Maintenance engineer Information | | |
|---|---|---|
| C | Performance Level | Maintenance Engineer |
| C ≧ 0.7 | Fault level 1 | Engineer A, Engineer B |
| 0.7 > C ≧ 0.6 | Fault level 2 | Engineer C, Engineer D |
| 0.6 > C ≧ 0.5 | Fault level 3 | Engineer E, Engineer F |
| 0.5 > C ≧ 0.4 | Good | Engineer G |
| 0.4 > C | Best | — |

Figure 26:
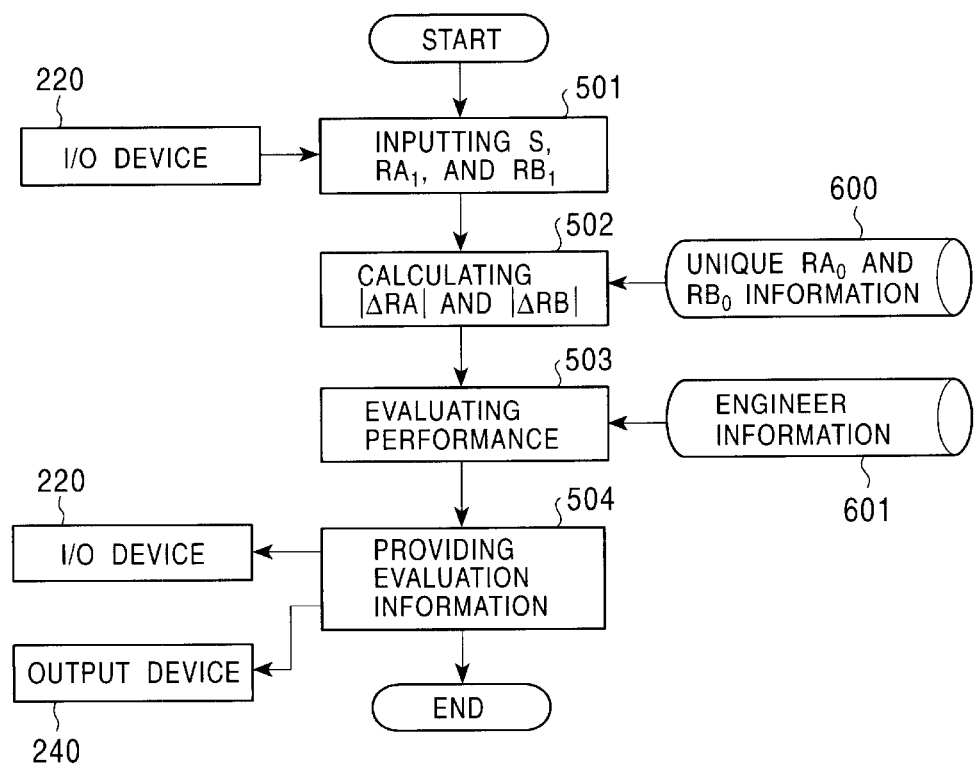
FIG. 26 is a flowchart illustrating another method for providing evaluation information which is prepared by the performance management system in accordance with a seventh embodiment.

The procedure in this embodiment will now be described based on the flowchart shown in FIG. 26, with reference to FIG. 24. The description regarding Steps 501 and 502 in the flowchart shown in FIG. 26 are omitted because these steps are the same as Steps 401 and 402, respectively, in FIG. 25.

The server 210 calculates the absolute values $|\Delta RA|$ and $|\Delta RB|$ in Step 502 and evaluates the performance level of the plasma processing apparatus with reference to the engineer information 601. When the server 210 determines that the apparatus is in any one of the fault levels 1 to 3, the server 210 calls up the maintenance engineer's names contained in the engineer information 601 (Step 503).

In Table 1, alphabet C means the level of the absolute value $|\Delta RA|$ to the predetermined value and represents the coefficient represented by equations (20A) and (20B):

$$C \times RA_0 \text{ for } |\Delta RA| \tag{20A}$$

$$C \times RB_0 \text{ for } |\Delta RB| \tag{20B}$$

The server 210 provides the resulting performance level to both the customer I/O device 220 and the output device 240 at the delivery site (Step 504).

In detail, the server 210 transmits the performance level (fault level) in the form of print or display on a screen or as voice signals.

When the performance level is at the "best", the customer I/O device 220 outputs a message "this apparatus still exhibits a required level of performance sufficient for practical use." When the performance level is "good", the customer I/O device 220 outputs a message "although this apparatus still maintains the required level of performance, you should inspect the apparatus soon." When the performance level is any one of the fault levels 1 to 3, the customer I/O device 220 outputs a message "this apparatus is in fault level 2. Please request adjustment to your maintenance engineer to restore the performance to the original state".

Furthermore, the server 210 outputs the performance level, the maintenance engineer's names corresponding to the performance level, and a maintenance command through the output device 240.

In such a case, specific engineers are assigned to the fault level. For example, Engineer A and Engineer B are assigned to fault level 1 as shown in Table 1. Preferably, this engineer information is output only through the output device 240 at the delivery site.

According to the performance management system for the plasma processing apparatus of this embodiment, the maintenance command is output with the fault level and the maintenance engineer's names corresponding to the fault level at the delivery site.

Thus, the fault level of the plasma processing apparatus at a distant place can be identified at the delivery site in order to send a maintenance engineer having skill which is suitable for the fault level, thus providing rapid and adequate maintenance services with an efficient engineer distribution. Accordingly, the maintenance system after installation becomes rationalized.

This performance management system can be applied to any plasma processing apparatus.

Next, a performance validation system of a plasma processing apparatus according to a modification of this embodiment will be described below with reference to the drawings. In the following description, a person who distributes and maintains the plasma processing apparatus is referred to as a "maintenance engineer".

Figure 27:
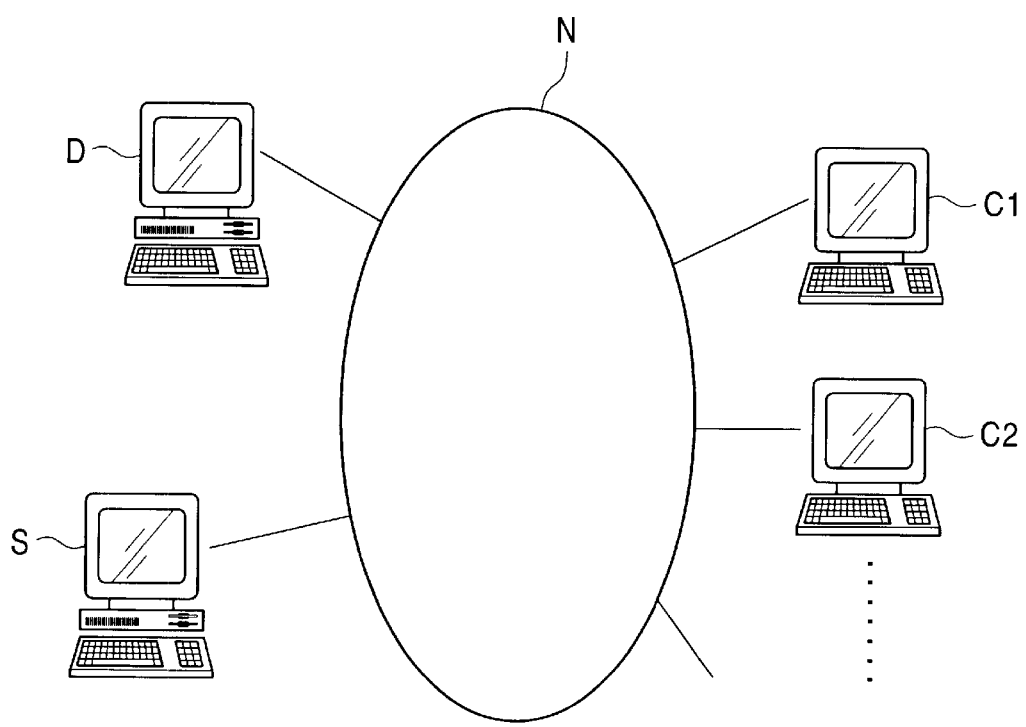
FIG. 27 is a block diagram of a performance management system for a plasma processing system in accordance with the present invention.

FIG. 27 is a diagram illustrating the configuration of the performance validation system of the plasma processing apparatus according to the present invention.

Referring to FIG. 24, the performance validation system comprises a customer terminal (client terminal) C1, an engineer terminal (client terminal) C2, a server computer (hereinafter simply referred to as "server") S which functions as operational performance information providing means, a database computer (hereinafter simply referred to as "database") D which stores information, and a public line N. The customer terminal C1 and the engineer terminal C2, the server S, and the database D are linked to one another via the public line N.

The terminals C1 and C2 have a function to communicate with the server S using a widespread Internet communication protocol, such as TCP/IP or the like. The customer terminal C1 functions as a customer-side information terminal for validating the state of the performance of a plasma processing apparatus having one or more plasma processing units which the customer purchased from the maintenance engineer, via the public line N. The customer terminal C1 also has a function to view an information web page which is a "plasma chamber CN performance information page" stored in the server S. The engineer terminal C2 which allows the maintenance engineer to upload "first series resonant frequency $f_0$ information" which partially constitutes the "performance information" and to receive e-mail sent from the customer through the customer terminal C1.

Herein, the structure of the plasma processing apparatus or the plasma processing system to be evaluated is identical to any one of the structures according to the above-described embodiments. The structure of the plasma processing apparatus including the number of chambers can be set as desired.

Communication with the server S is achieved through a modem when the public line N is an analog line or through a dedicated terminal adapter or the like when the public line N is a digital line such as an integrated services digital network (ISDN).

The server S is a computer that provides performance information. The server S transmits the performance information to the customer terminal C1 using an Internet communication protocol upon request from the customer terminal C1 requesting the display of the information. Herein, each of the customers who purchased the plasma chambers receives a "browsing password" for viewing the performance information before the plasma processing apparatus is delivered to the customer from the maintenance engineer. The password is required when the customer wants to view operation and maintenance information which is part of the performance information, and the server S sends the operation and maintenance information to the customer terminal C1 only when a registered browsing password is provided.

The above-described "performance information", details of which will be described in a later section, comprises information regarding models of the plasma processing chambers of the plasma processing apparatus or plasma processing system available from the maintenance engineer, information regarding quality and performance of each model in the form of specifications, information regarding parameters indicative of quality and performance of specific apparatuses delivered to customers, and information regarding parameters and maintenance history.

The latter two types of information among the information described above, i.e., the information regarding quality and performance of specific apparatuses and the information regarding parameters and maintenance history, are accessible only from the customers provided with "browsing passwords".

The performance information described above is provided in the form of "operation and maintenance information" and "standard performance information". The operation and maintenance information is a type of information provided from the maintenance engineer or the customer to the server S to indicate the actual state of operation and maintenance. The standard performance information is a type of information stored in the database D and functions as a catalog accessible from potential customers. The "standard performance information" is an objective description regarding the performance of the plasma processing performed in the plasma chamber and allows prediction of the deposition state when applied to deposition processes such as plasma-enhanced CVD and sputtering processes.

In this embodiment, the "standard performance information" is stored in the database D.

Upon the request from the customer terminal C1 to view the "performance information", the server S retrieves the requested "standard performance information" from the database D and transmits the information to the customer terminal C1 of the customer in the form of a "performance information page". When a request to view the "performance information" is received along with the browsing password of the customer, the server S retrieves the requested "standard performance information" from the database D as described above, prepares the "performance information" by combining the retrieved "standard performance information" and the "operation and maintenance information" provided from the maintenance engineer through the engineer terminal C2, and transmits the "performance information page" to the customer terminal C1.

The database D stores the "standard performance information", which is part of the "performance information", according to the models of the plasma chambers of the plasma processing apparatus or plasma processing system, retrieves the "standard performance information" in response to a search request from the server S, and transmits the retrieved information to the server S. Although only one server S is depicted in FIG. 27, a plurality of servers is provided in this embodiment. In this embodiment, the general purpose "standard performance information" is stored in the database D to share the "standard performance information" among these servers managed by maintenance engineers at different locations.

Figure 28:
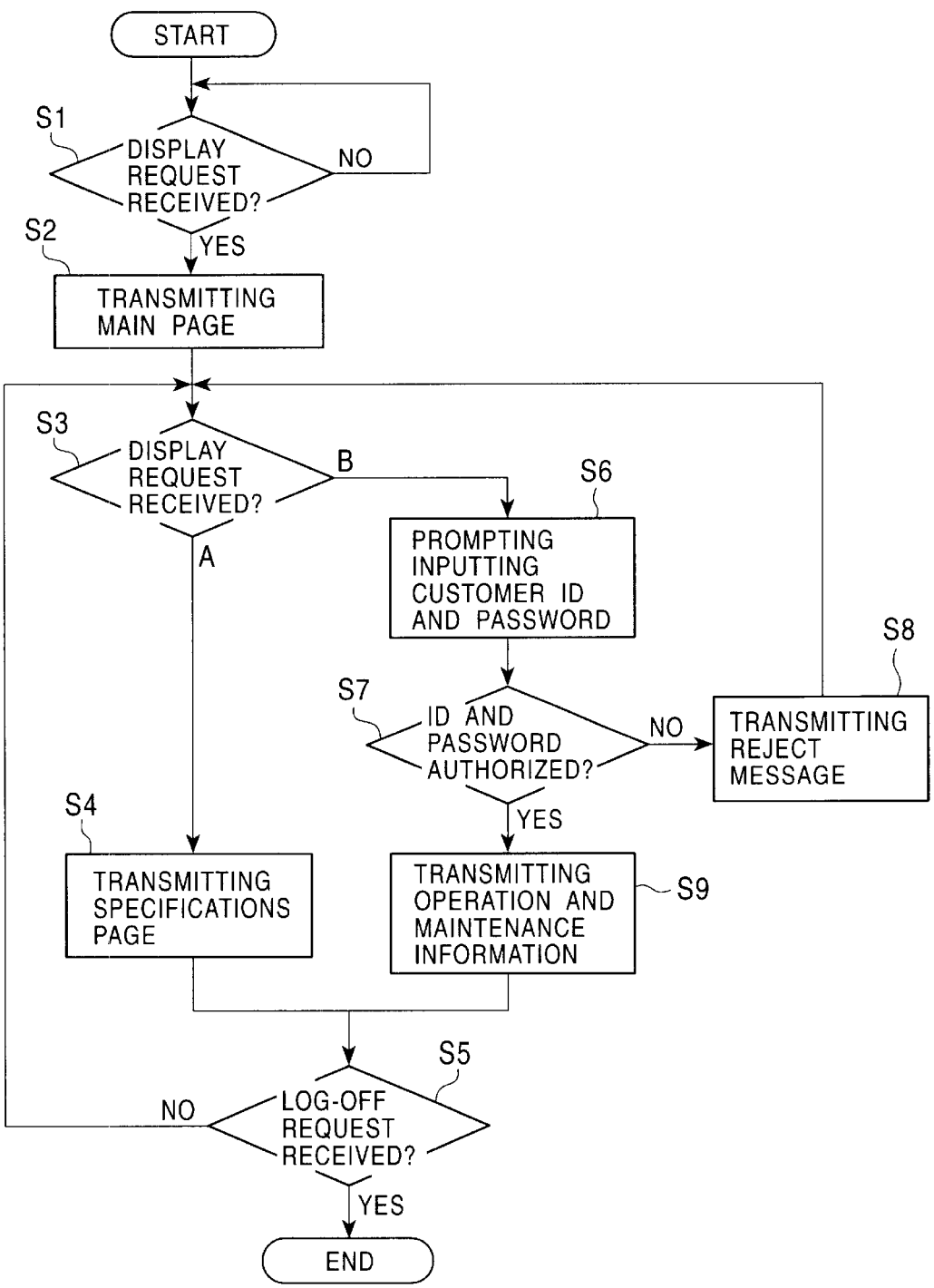
FIG. 28 is a flowchart illustrating a process of providing performance information by a server S in a performance validation system for a plasma processing apparatus of the present invention.

Next, an operation of the performance validation system for the plasma processing apparatus or the plasma processing system having the above-described configuration will be explained in detail with reference to the flowchart shown in FIG. 28. The flowchart illustrates the process of providing the "performance information" at the server S.

Generally, the maintenance engineer presents the "standard performance information" contained in the "performance information" of a model of the plasma chamber which will be sold to the customer, as a reference for purchase. The customer can understand the performance of the plasma processing unit and possible plasma processes using the plasma processing unit through this "standard performance information".

The maintenance engineer provides the "standard operation information", as the reference in use of the plasma chambers, and the "operation and maintenance information", as the parameters in the operation to the customer who purchased the plasma processing apparatus or system. The customer, i.e., the user of the plasma chambers, can validate the operation of the plasma processing units by comparing the "standard performance information" with the "operation and maintenance information" so as to understand the state of the plasma processing and to determine whether maintenance is required.

For example, a customer who is considering purchasing a new plasma processing apparatus or system from the maintenance engineer may access the server S to easily confirm the "standard performance information" of the plasma processing apparatus or system as follows.

The customer who wants to view the "performance information" requests access to the server S based on an IP address set in advance of the server S from the customer terminal C1.

Upon receiving the request for access (Step S1), the server S transmits a main page CP to the customer terminal C1 (Step S2).

Figure 29:
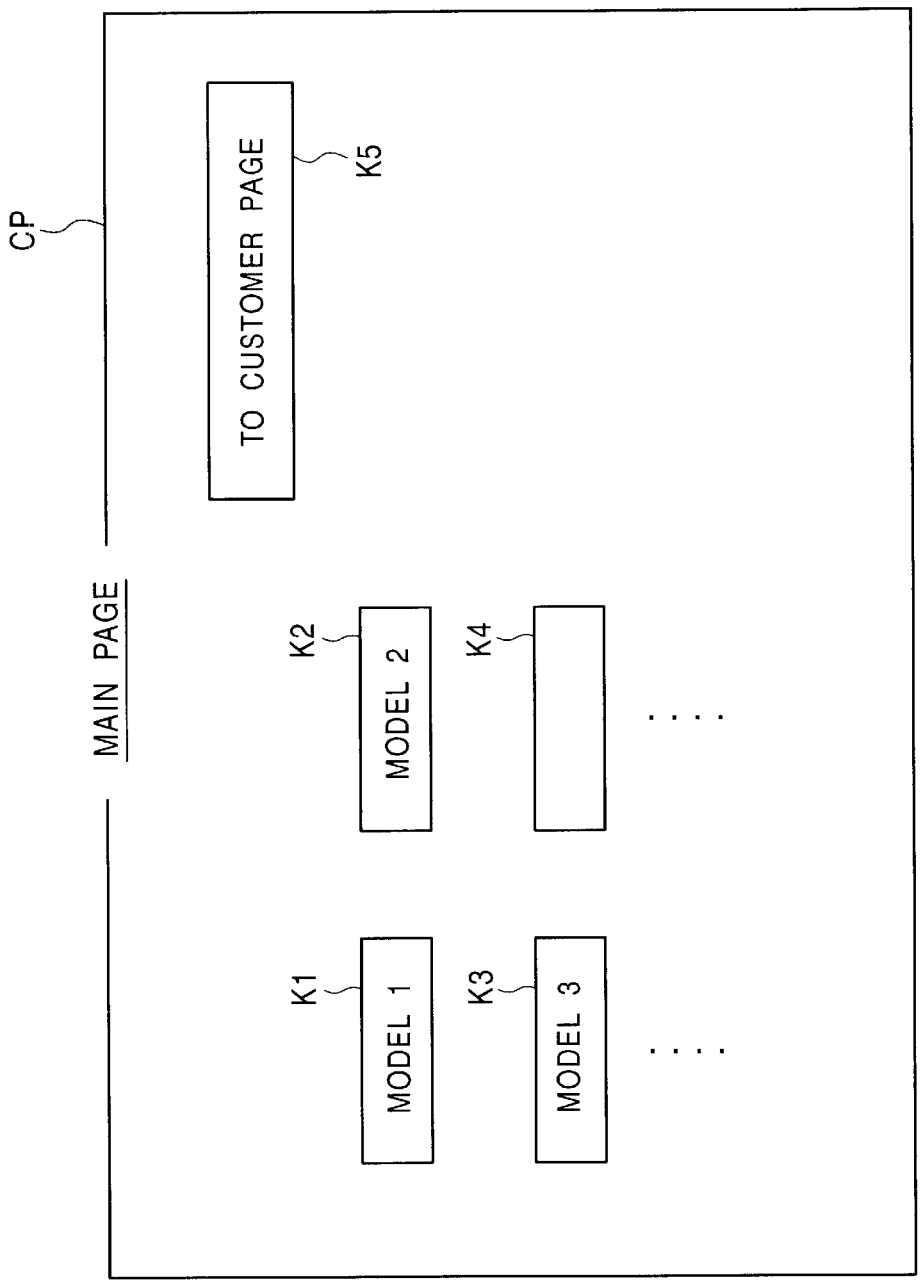
FIG. 29 shows an output form of a main page CP in accordance with the performance validation system of the plasma processing apparatus of the present invention.

FIG. 29 shows an exemplary main page CP sent from the server S to the customer terminal C1. The main page CP comprises model selection buttons K1 to K4 for displaying the "standard performance information" contained in the "performance information" according to models and a user button K5 for requesting the display of a customer page exclusive to the customer of the plasma processing apparatus.

For example, a customer may select one of the model selection buttons K1 to K4 using a pointing device (for example, a mouse) of the customer terminal C1 to specify the model of the plasma chamber. Such a selection is transmitted to the server S as a request for displaying the "standard performance information" in the "performance information".

Upon receipt of the request (Step S3), the server S transmits a subpage containing the requested information on the selected model to the customer terminal C1. That is, when display of "standard performance information" is requested by specifying a model (line A in FIG. 28), the server S retrieves data such as "vacuum performance", "gas charge/discharge performance", "temperature performance", and "electrical performance of the plasma processing chamber", and data regarding variations in these parameters affected in the plasma processing apparatus or system from the database D and transmits a specifications page CP1 shown in FIG. 30 containing these data to the customer terminal C1 (Step S4).

Figure 30:
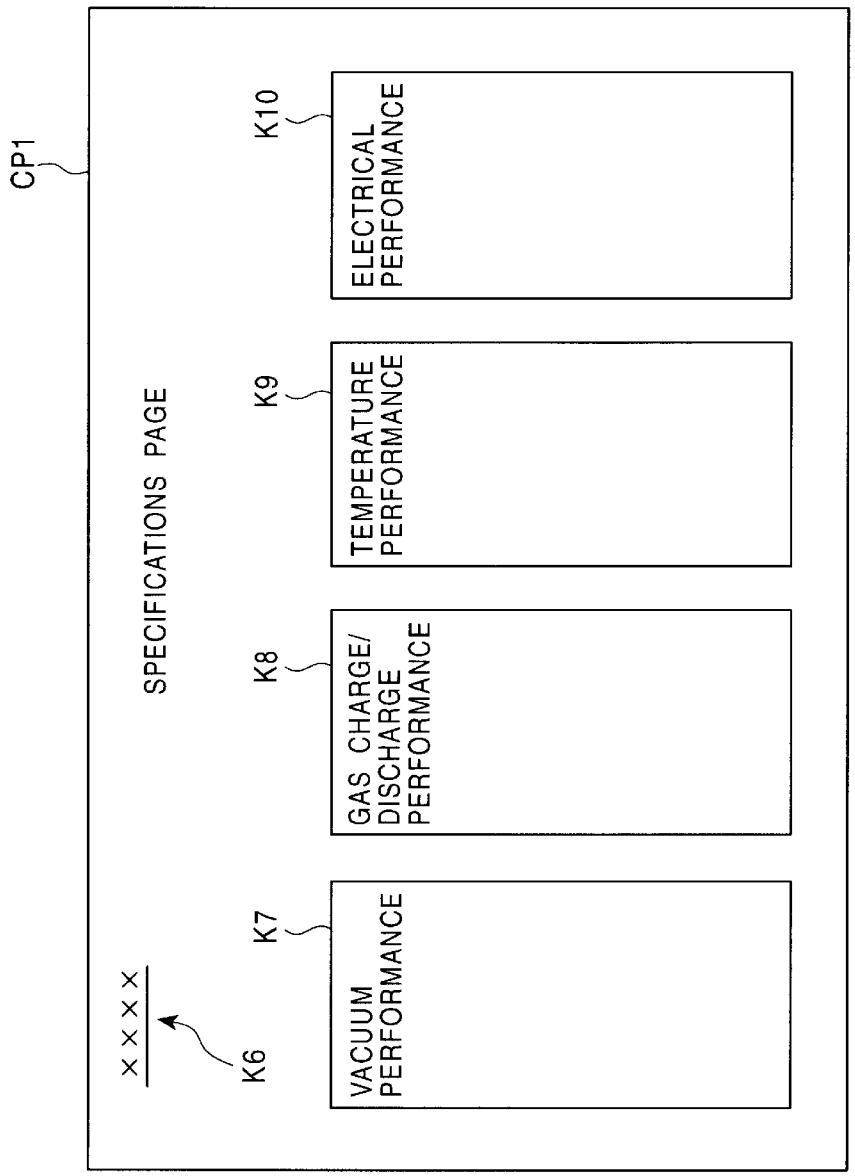
FIG. 30 shows an output form of a subpage CP1 in accordance with the performance validation system of the plasma processing apparatus of the present invention.

Referring to FIG. 30, the specifications page CP1 comprises an apparatus model section K6 indicating the selected model of the apparatus, a vacuum performance section K7, a gas charge/discharge performance section K8, a temperature performance section K9, and an electrical performance section K10 indicating the electrical performance of the plasma processing chamber. These constitute the "standard performance information" of the selected model and each contains the following descriptions.

The vacuum performance section K7 includes:

ultimate vacuum: $1 \times 10^{-4}$ Pa or less; and operational pressure: 30 to 300 Pa.

The gas supply/discharge performance section K8 includes:

maximum gas flow rates:

| | |
|---|---|
| $SiH_4$ | 100 SCCM, |
| $NH_3$ | 500 SCCM, |
| $N_2$ | 2,000 SCCM; and |
| exhaust pressure: | 20 Pa or less at a flow rate of 500 SCCM. | exhaust pressure: 20 Pa or less at a flow rate of 500 SCCM.

The temperature performance section K9 includes:

heater temperature: 200 to 350±10° C.; and chamber temperature: 60 to 80±2.0° C.

Herein, the SCCM (standard cubic centimeters per minute) represents the corrected gas flow rate at standard conditions (0° C. and 1,013 hPa) and the unit thereof is $cm^3/min$.

A variation in each of the above-described parameters P among the plasma processing units constituting the plasma processing apparatus or system is defined by relationship (10B):

$$(P_{max}-P_{min})/(P_{max}+P_{min}) \tag{10B}$$

wherein $P_{max}$ represents the maximum and $P_{min}$ represents the minimum of the particular parameter among the plasma processing units. The upper limit of the variation in the plasma processing apparatus or system is displayed for each parameter.

The electrical performance section K10 contains the set ranges of the input-terminal-side AC resistance RA, the output-terminal-side AC resistance RB, and the variations therein described in the first to fifth embodiments. The section K10 further includes a resistance $R_e$ and a reactance $X_e$ of the plasma processing chamber at the power frequency $f_e$, a plasma capacitance $C_0$ between the plasma excitation electrode 4 and the susceptor electrode 8, a loss capacitance $C_x$ between the plasma excitation electrode 4 and the components which are at ground potential of the plasma processing unit, a first series resonant frequency $f_0$ described below, and the like. Furthermore, the specification page CP1 includes a performance guarantee statement such as "we guarantee that each of the parameters is within the set range described in this page at a time of the delivery of the plasma chamber".

In this manner, the overall radiofrequency electrical characteristics of the plasma processing units and the variation in the electrical characteristics of the plasma processing units can provided to a potential purchaser as a novel reference which has never been considered before. The performance information can be printed out from the customer terminal C1 or the engineer terminal C2 so that the information can be provided in the form of a catalog or specifications describing the performance information containing the above-described detailed information. Since the set ranges of the input-terminal-side AC resistance RA and the output-terminal-side AC resistance RB, the resistance $R_e$, the reactance $X_e$, the capacitances $C_0$ and $C_x$, and the performance guarantee statement are provided to a potential purchaser through a terminal such as customer terminal C1, as a catalog or specifications, the potential purchaser can understand the performance of the plasma processing units as if the customer examines electrical components before purchasing the plasma processing apparatus or system from the maintenance engineer.

After the server S transmits the above-described subpage to the customer terminal C1, the server S waits for the request to display another subpage (Step S3) if a log-off request from the customer terminal C1 is not received (Step S5). If the server S receives the log-off request from the customer terminal C1, the server S terminates the communication with the customer terminal C1 (Step S5).

The definition of the first series resonant frequency $f_0$ will now be explained.

First, the dependence of the impedance on the frequency of the plasma processing chamber is measured. As described above, the measured range for the impedance of the plasma chamber is defied. The vector quantity (Z, θ) of the impedance of the plasma processing chamber is measured by varying the oscillating frequency. For example, the frequency is varied in the range of 1 to 100 MHz to include the power frequency $f_e$ which is set at 13.56 MHz, 27.12 MHz, 40.68 MHz, or the like.

The impedance Z and the phase θ are plotted versus the frequency to depict an impedance characteristic curve and a phase curve. The first series resonant frequency $f_0$ is then defined as the lowest frequency of the frequencies at the minima of the impedance Z, i.e., the frequency at a zero phase when the phase curve first changes from negative to positive as the frequency is elevated.

The customer who purchased the plasma processing apparatus or system from the maintenance engineer can easily check the "performance information" of the plasma processing unit or units of the plasma processing apparatus or system by accessing the server S as below.

When the customer and the maintenance engineer enter into a sales contract, a customer ID, which is unique to the individual customer and a "customer password (browsing password)" for accessing the "operation and maintenance information" of the plasma processing units constituting the plasma processing apparatus or system are provided to the customer from the maintenance engineer. The customer ID may be associated with the serial number of the purchased plasma processing apparatus or system or with the serial number of the plasma processing unit constituting the plasma processing apparatus or system. The server S transmits the "operation and maintenance information" to the customer terminal C1 when the authorized browsing password is received.

A customer who wants to access the information selects the user button K5 in the above-described main page CP to transmit the request for the display of a customer page to the server S.

Figure 31:
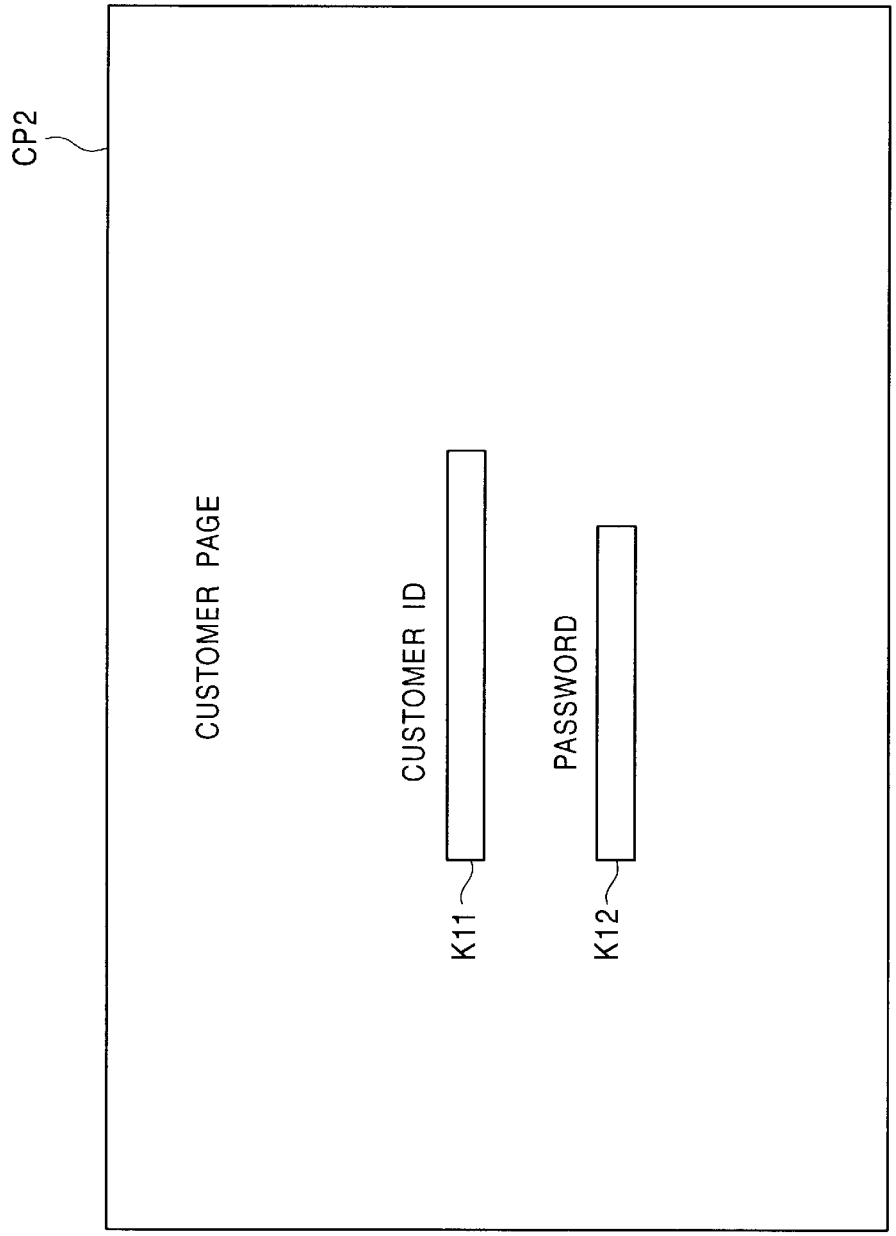
FIG. 31 shows an output form of a subpage CP2 in accordance with the performance validation system of the plasma processing apparatus of the present invention.

Upon receiving the request for the display (Step S3-B), the server S transmits a subpage prompting the customer to input the "browsing password" (Step S6). FIG. 31 shows a customer page CP2. The customer page CP2 comprises a customer ID input field K11 and a password input field K12.

The customer page CP2 prompting the customer to input the browsing password is displayed on the customer terminal C1. The customer enters the "browsing password" and the "customer ID" through the customer terminal C1 so as to allow the server S to identify the plasma processing units constituting the plasma processing apparatus or system.

At this stage, the customer enters the customer ID into the customer ID input field K11 shown in FIG. 31 and the browsing password into the password input field K12. The server S transmits the "operation and maintenance information" subpage previously associated with the "browsing password" to the customer terminal C1 (Step S9), only when the server S receives the authorized "customer ID" and "browsing password" from the customer terminal C1 (Step S7).

In other words, the "operation and maintenance information" is accessible only by the specific customer who signed the sales contract for the plasma processing apparatus or system, i.e., who has the authorized "browsing password". No third parties that can access the server S browse the "operation and maintenance information". Although the maintenance engineer often exchanges sales contracts with a plurality of customers and delivers a plurality of plasma processing units for these customers, each of the customers is provided with a "browsing password" unique to the customer, unique to the plasma processing apparatus or system, or unique to each one of the plasma processing units constituting the plasma processing apparatus or system and can individually access the "operation and maintenance information" associated with the "browsing password".

Thus, confidential information regarding the purchase of the plasma chamber to other customers can be securely prevented. Furthermore, a plurality of plasma processing apparatuses or systems and plasma processing chambers thereof can be separately identified. If the server S does not receive the authorized "browsing password" (Step S7), the server transmits a message refusing the access and prompting the customer to reenter the "browsing password" to the customer terminal C1 (Step S8). If the customer erroneously enter the "browsing password", the customer may reenter a correct password to access the "operation and maintenance information".

If the customer ID and the password are authorized (Step S7), the server S retrieves data corresponding to the requested information from the database D to transmit it to the customer terminal C1 in the form of a subpage. That is, upon a request from the customer terminal C1 to display the "standard performance information" and the "operation and maintenance information" of the plasma processing units of the specific plasma processing apparatus or system identified by the customer ID, the server S retrieves data such as "vacuum performance", "gas charge/discharge performance", "electrical performance of the plasma processing chamber", and the like from the database D, and transmits a specifications page (subpage) CP3 containing these data to the customer terminal C1 (Step S9).

Figure 32:
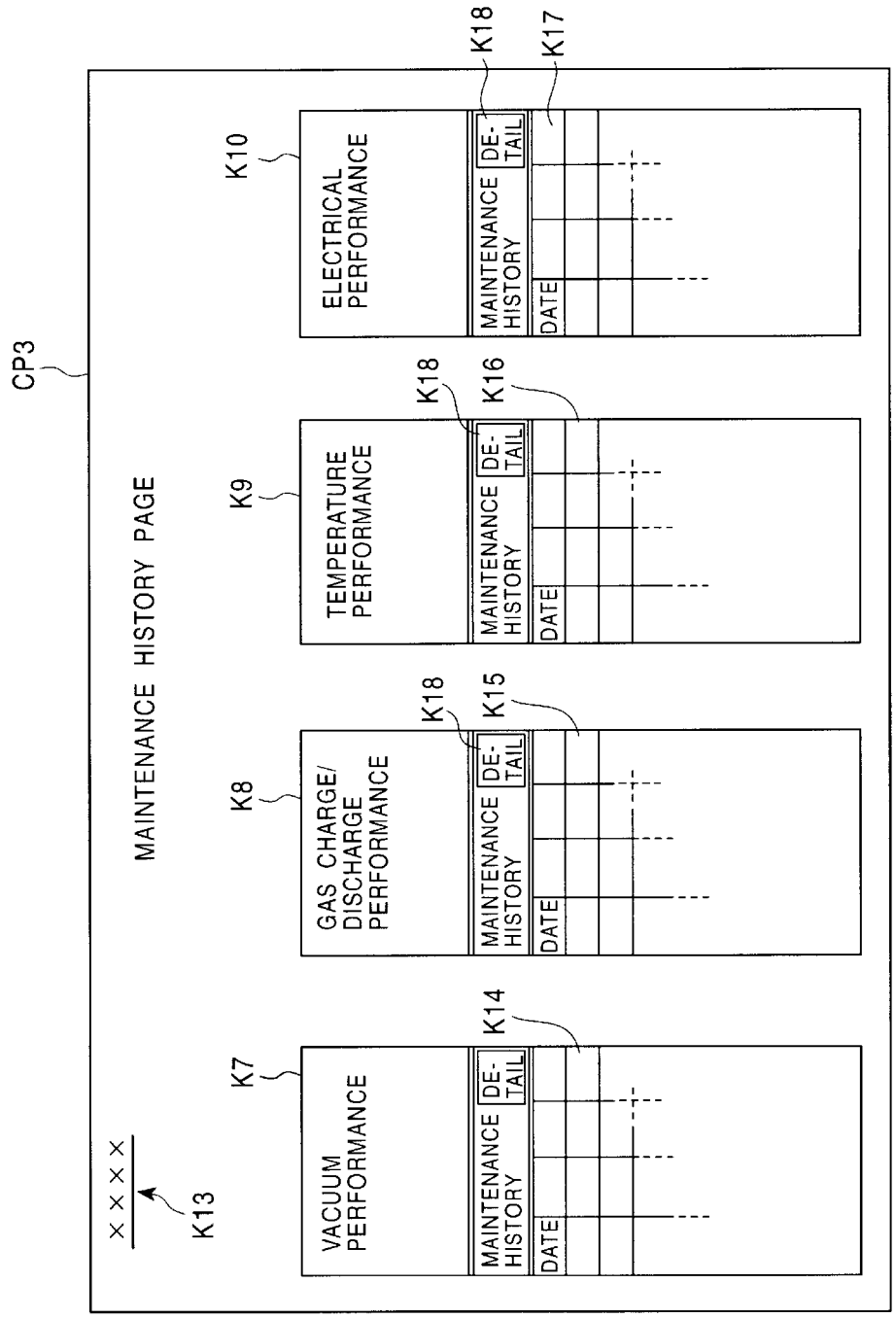
FIG. 32 shows an output form of a subpage CP3 in accordance with the performance validation system of the plasma processing apparatus of the present invention.

FIG. 32 shows a maintenance history page (subpage) CP3 containing "operation and maintenance information", which is transmitted from the server S to the customer terminal C1. The maintenance history page CP3 comprises a serial number section K13 indicating the serial numbers of the plasma processing apparatus or system and the plasma processing chambers thereof, the vacuum performance section K7, the gas charge/discharge performance section K8, the temperature performance section K9, the electrical performance section K10, a vacuum performance maintenance section K14, a gas charge/discharge performance maintenance section K15, a temperature performance maintenance section K16, and an electrical property maintenance section K17. In the sections K14 to K17, the "operation and maintenance information" of the individual plasma processing units is displayed.

The vacuum performance maintenance section K14 includes:
  ultimate vacuum: $1.3 \times 10^{-5}$ Pa or less; and
  operational pressure: 200 Pa.

The gas charge/discharge performance maintenance section K15 includes:
  gas flow rates:

| | |
|---|---|
| $SiH_4$ | 40 SCCM, |
| $NH_3$ | 160 SCCM, |
| $N_2$ | 600 SCCM; and |
| exhaust pressure: | $6.8 \times 10^{-7}$ Pa · m³/sec. | exhaust pressure: $6.8 \times 10^{-7}$ Pa·m³/sec.

The temperature performance maintenance section K16 includes:
  heater temperature: 302.3±4.9° C.; and
  chamber temperature: 80.1±2.1° C.

The variation in each of the above-described parameters P among the plasma processing units constituting the plasma processing apparatus or system is defined by relationship (10B):

$$(P_{max}-P_{min})/(P_{max}+P_{min}) \quad (10B)$$

wherein $P_{max}$ represents the maximum and $P_{min}$ represents the minimum of the particular parameter among these plasma processing chambers. Set ranges of the variations calculated as above are displayed in the corresponding parameter sections.

Based on the facts that the absolute value of the ΔP between a value $P_0$ at a time $t_0$ and a value $P_1$ at a later time $t_1$ of the radiofrequency characteristic P is in close connection with the variation in performance of the plasma processing apparatus and that this variation falls within a given range if the absolute value is less than a predetermined value, the plasma processing apparatus can be evaluated by comparing the absolute value with the predetermined value.

A "detail" button K18 is provided in each of the sections K14, K15, K16, and K17. The customer may access the detailed information of the desired section by selecting one of the "detail" buttons K18.

When the customer submits a display request by selecting the "detail" button K18, a detailed maintenance page CP4 including detailed information on the maintenance history is transmitted from the server S to the customer terminal C1.

FIG. 33 shows the detailed maintenance page CP4 (subpage) transmitted from the server S to the customer terminal C1.

FIG. 33 illustrates the detailed maintenance page CP4 for the electrical property maintenance section K17.

The detailed maintenance page CP4 comprises the serial number display sections K13 for displaying the serial numbers of the plasma processing units and the plasma processing apparatus or system purchased by the customer, the electrical performance section K10, and the electrical property maintenance section K17. In the electrical property maintenance section K17, the values of the parameters P measured during maintenance are displayed in the corresponding parameter sections of each plasma processing unit, and the variations among these measured values are displayed in the variation section for each of the plasma processing apparatus or system.

The electrical performance section K10 includes set ranges for the input-terminal-side AC resistance RA and output-terminal-side AC resistance RB described in the first to fifth embodiments. The electrical property maintenance section K17 includes the measured values of the input-terminal-side AC resistance RA and the output-terminal-side AC resistance RB, and the variation calculated from these values. The electrical property maintenance section K17 further includes the resistance $R_e$ and reactance $X_e$ of the plasma processing chamber at the power frequency $f_e$, the plasma capacitance $C_0$ between the plasma excitation electrode 4 and the susceptor electrode 8, the loss capacitance $C_X$ between the plasma excitation electrode 4 and the ground potential portion of the plasma chamber, etc.

As shown in FIGS. 32 and 33, both the maintenance history page CP3 and the detailed maintenance page CP4 include the "operation and maintenance information" and the "standard performance information" comprising data such as the "vacuum performance", "gas charge/discharge performance", "temperature performance", "electrical performance", etc. which are retrieved from the database D. Thus, the customer can view the "operation and maintenance information" with reference to the "standard performance information". The customer may use the "standard performance information" as the reference in use and the "operation and maintenance information" as the parameter indicative of the actual state of the operation. By comparing the "standard performance information" with the "operation and maintenance information", the customer can validate the operation of the plasma processing units of the plasma processing apparatus or system, determine whether maintenance is required, and confirm the state of the plasma processing.

If the server S does not receive a log-off request from the customer terminal C1 after transmission of the subpages CP3 and CP4 to the customer terminal C1 (Step S5), the server S transmits an invalid connection message to the customer terminal C1 (Step S8) to prompt reentry of the "customer password" or to wait for the next display request (Step S3). If the server S receives the log-off request from the customer terminal C1 (Step S5), the communication with the customer terminal C1 is terminated.

As described above, according to the present invention, the performance validation system for the plasma processing apparatus comprises a customer terminal, an engineer terminal, and information providing means. The customer terminal requests browsing of performance information to the information providing means via a public line, a maintenance engineer uploads the performance information to the information providing means through the engineer terminal, and the information providing means provides the performance information uploaded from the engineer terminal to the customer terminal upon the request from the customer terminal. The performance information contains the input-terminal-side AC resistances RA and output-terminal-side AC resistances RB at the time $t_0$ and later time $t_1$, the absolute values $|\Delta RA|$ and $|\Delta RB|$ for performing evaluation of the performance after passage of time, and the variations in the AC resistances RA and RB among the plasma processing units constituting the plasma processing apparatus or system. The performance information can be output as a catalog or specifications so that any customer can browse the information via a public line for purchasing the apparatus or system. The customer may also view the performance information comprising the standard performance information and the operation and maintenance information at the information terminal via a public line. Thus, the customer can be readily obtain the information regarding the operation, performance, and maintenance of the plasma processing units of the plasma processing apparatus or system in use.

Moreover, the performance information includes the information regarding the input-terminal-side AC resistances RA and output-terminal-side AC resistances RB at the time $t_0$ and later time $t_1$, the absolute values $|\Delta RA|$ and $|\Delta RB|$, and the variations in the AC resistances RA and RB among the plasma processing units; hence the performance of the plasma processing apparatus or system can be readily evaluated. A customer who is considering purchasing a new plasma processing apparatus or system can obtain information for purchasing decisions. Furthermore, the performance information may also be output as a catalog or specifications.

Ninth Embodiment

Figure 34:
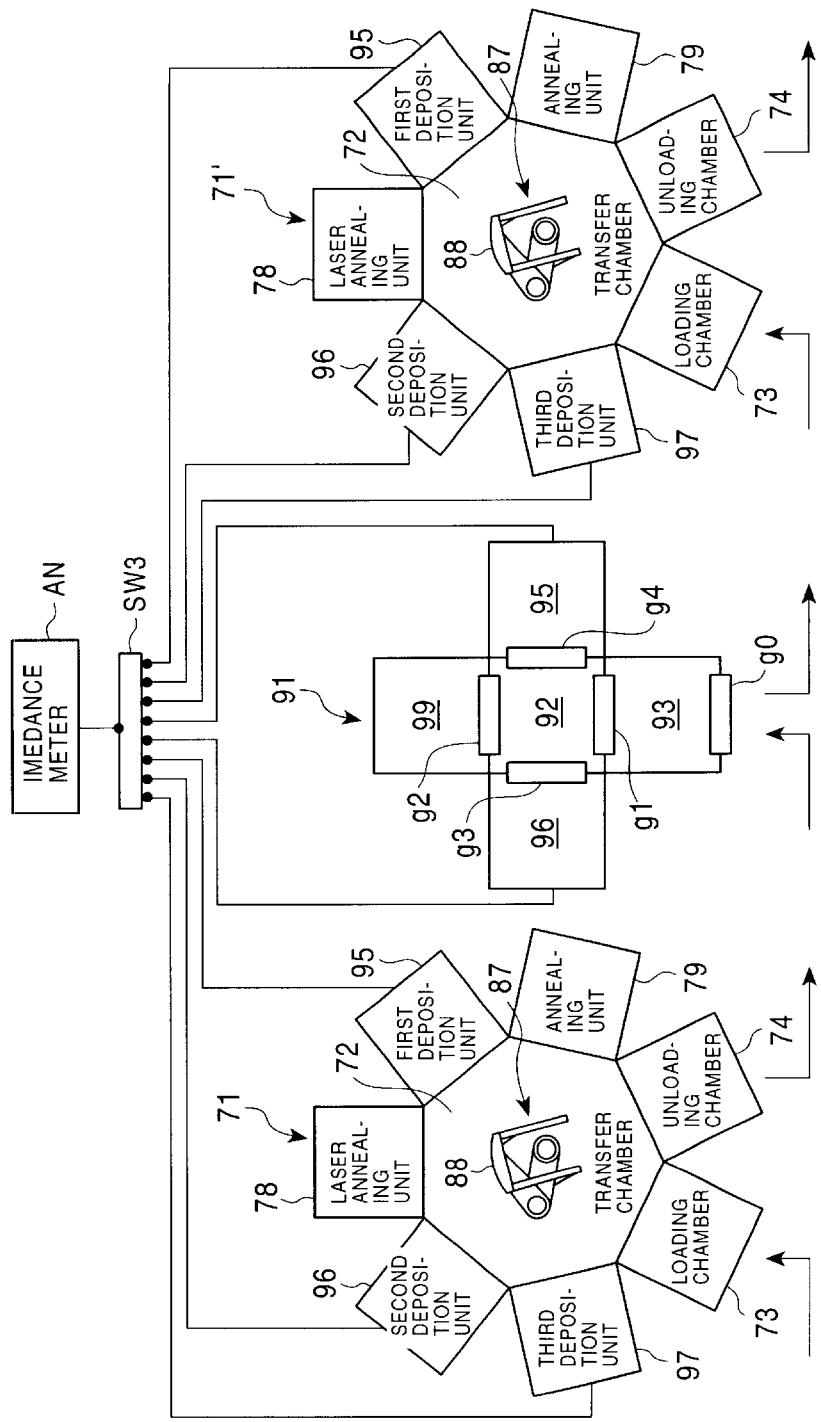
FIG. 34 is a schematic view of a plasma processing apparatus in accordance with a ninth embodiment of the present invention.

FIG. 34 is a schematic diagram illustrating an overall structure of a plasma processing system according to a ninth embodiment of the present invention.

The plasma processing system of this embodiment is substantially a combination of plasma processing apparatuses 71 and 71' which correspond to the plasma processing apparatus 71 of the first embodiment shown in FIG. 1 and a plasma processing apparatus 91 which corresponds to the plasma processing apparatus 91 according to the second to fourth embodiments shown in FIGS. 10 to 20. Similar components are represented by the same reference numerals, and explanations thereof are omitted.

The plasma processing system of this embodiment constitutes a part of a production line and includes the plasma processing apparatus 71, the plasma processing apparatus 91, and a plasma processing apparatus 71'. The plasma processing apparatus 71 has three plasma processing units 95, 96, and 97. The plasma processing apparatus 91 has two plasma processing units 95 and 96. The plasma processing apparatus 71' has three plasma processing units 95, 96, and 97.

The plasma processing apparatuses 71 and 71' differ from that of the first embodiment shown in FIG. 1 in that three plasma processing units 95 to 97 having substantially the same configuration as the plasma processing unit 95 of a dual-frequency excitation type described in the second to fourth embodiments shown in FIGS. 10 to 20 are used instead of the plasma processing units 75 to 77. The plasma processing units 95 to 97 of the fifth embodiment have substantially the same structure.

Referring to FIG. 15, each of the plasma processing units 95 to 97 has an impedance measuring terminal 61 and a switch SW5 which are connected to the impedance meter AN via a switch SW3 in FIG. 34. During the measurement of the impedance, the switch SW3 connects only one of the plasma chambers 95, 96, and 97 to the impedance meter AN. The length of a coaxial cable connecting the measuring terminal 61 to the switch SW3 is the same for all plasma processing units 95 to 97 so that impedances of the coaxial cables for the plasma processing units 95 to 97 become the same. As in the third embodiment shown in FIGS. 15 and 17, a detachable probe 105 of the impedance meter AN is attached to the measuring terminal 61.

Among the plasma processing units 95 to 97 in this embodiment, a variation <RA> is defined by equation (14A):

$$<RA> = (RA_{max} - RA_{min})/(RA_{max} + RA_{min}) \quad (14A')$$

wherein $RA_{max}$ and $RA_{min}$ are the maximum and minimum, respectively, among an input-terminal-side AC resistances $RA_{95}$, $RA_{96}$, and $RA_{97}$ of the plasma processing units 95, 96, and 97, respectively. The variation <RA> defined by equation (14A) is then set at a value less than 0.5. The variation <RA> can be adjusted by the Methods A to D described above.

Similarly, a variation <RB> is defined by equation (14B):

$$<RB> = (RB_{max} - RB_{min})/(RB_{max} + RB_{min}) \quad (14B)$$

wherein $RB_{max}$ and $RB_{min}$ are the maximum and minimum, respectively, among an output-terminal-side AC resistances $RB_{95}$, $RB_{96}$, and $RB_{97}$ of the plasma processing unit 95, 96, and 97, respectively. The variation <RB> defined by equation (14B) is then set to a value less than 0.5. The variation <RB> can also be adjusted by Methods A to D described above.

Furthermore, these plasma processing units are designed and manufactured such that the absolute value $|\Delta RA|$ of the difference $\Delta RA$ between the AC resistance $RA_0$ at a time $t_0$ when the plasma processing units are reassembled and the AC resistance $RA_1$ at a later time $t_1$ in use is less than 0.5 times the AC resistance $RA_0$ and that the absolute value $|\Delta RB|$ of the difference $\Delta RB$ between the AC resistance $RB_0$ at the time $t_0$ and the AC resistance $RB_1$ at the later time $t_1$ in use is less than 0.5 times the AC resistance $RB_0$, wherein the AC resistances $RA_0$ and $RA_1$ are measured from the input terminal side and the AC resistances $RB_0$ and $RB_1$ are measured from the output terminal side of the matching circuit 2A.

In the plasma processing system of the present invention, for example, a preliminarily-treated substrate 16 is subjected to a first layer deposition treatment in the plasma processing unit 95 of the plasma processing apparatus 71, is heat-treated in the annealing unit 79, and is then annealed in the laser annealing unit 78. The treated substrate 16 is subjected to second and third layer deposition treatments in the plasma processing units 96 and 97.

The substrate 16 discharged from the plasma processing apparatus 71 is transferred into another treating apparatus not shown in the drawing, so as to apply a photoresist thereto by a photolithographic step.

Next, the substrate 16 is transferred into the plasma processing apparatus 91 and is plasma-etched in the processing units 95 and 96. Subsequently, the substrate 16 is transferred to another plasma processing unit which is equivalent to the plasma processing apparatus 91 but not shown in the drawing, and is subjected to a deposition treatment.

The substrate 16 is then discharged from the plasma processing apparatus not shown in the drawing and transferred into another treating apparatus also not shown in the drawing so as to remove the resist layer and to perform photolithographic patterning thereon.

The substrate 16 is transferred to the plasma processing apparatus 71' and is sequentially subjected to first, second, and third deposition treatments in the plasma processing units 95, 96, and 97. Finally, the treated substrate 16 is discharged from the plasma processing system to be subjected to post-treatment.

The plasma processing system of this embodiment has the same advantages as those in the first and second embodiments. Moreover, the variations in the input-terminal-side AC resistance RA and the output-terminal-side AC resistance RB in the matching circuits 2A of the plasma processing units 95 to 97 are less than 0.5. Thus, the difference in the radiofrequency characteristics among the plasma processing units 95 to 97 can be minimized, and the plasma processing units 95 to 97 can be maintained at a level which is less than an upper limit indicated by the impedance characteristic, thereby generating plasma of substantially the same density.

Moreover, the absolute value $|\Delta RA|$ of the difference $\Delta RA$ between the AC resistances $RA_0$ and $RA_1$ is less than 0.5 times the AC resistance $RA_0$ and the absolute value $|\Delta RB|$ of the difference $\Delta RB$ between the AC resistances $RB_0$ and $RB_1$ is less than 0.5 times the AC resistance $RB_0$, even after the plasma processing units 95, 96, and 97 are reassembled, are used, and are subjected to an adjustment work. Thus, the difference in the radiofrequency characteristics can be always minimized, even when a phenomenon affecting the radiofrequency characteristics occurs between the time $t_0$ and the later time $t_1$. Moreover, the difference in the radiofrequency characteristics between the plasma processing units 95, 96, and 97 is minimized at the time $t_0$; hence, the plasma processing units 95 and 96 can be maintained at a level which is less than an upper limit indicated by the impedance characteristics, such as AC resistances RA and RB, capacitance, and impedance. As a result, the effective power consumption in the plasma spaces is maintained at substantially the same level at all times.

As a result, substantially the same plasma process results can be achieved by applying the same process recipe to the plasma processing units 95 to 97. When applied to a deposition process, layers having substantially the same layer characteristics, such as layer thickness, isolation voltage, and etching rate, can be manufactured using the plasma processing units 95 to 97. More specifically, the above-described variations are maintained at less than 0.5 so as to maintain the variation in layer thickness among layers manufactured by these plasma processing units 95 to 97 within ±7% using the same process recipe. Thus, the overall radiofrequency characteristics of the plasma processing system can be optimized, and the plasma processing units 95 to 97 can stably generate plasmas, achieving stable and uniform operation.

As a result, a determination of process conditions based on the relationships between enormous amounts of data on these processing chambers 95, 96, and 97 and the results obtained by evaluation of actually processed substrates is no longer necessary.

Even when a phenomenon affecting the radiofrequency characteristics occurs, substantially the same plasma treatment is achieved using the same recipe regardless of passage of time. When film deposition is performed in these processing units 95, 96, and 97 for a certain term, the resulting films have substantially the same characteristics, e.g., thickness, isolation voltage, and etching rate. More specifically, the absolute values $|\Delta RA|$ and $|\Delta RB|$ of the differences $\Delta RA$ and $\Delta RB$, respectively, are set to be less than 0.5 times the AC resistances $RA_0$ and $RB_0$, respectively. In such a case, the variation in thickness between the plasma processing units 95, 96, and 97 can be controlled within ±7% under the same deposition conditions regardless of passage of time, in other words, regardless of, disassembly, transfer, reassembly, repeated operation, and adjustment.

Thus, the overall radiofrequency characteristics of the plasma processing units 95, 96, and 97 including the matching circuits 2A can be set, resulting in stable plasma generation. As a result, the plasma processing units 95, 96, and 97 of the plasma processing apparatus stably operate regardless of passage of time.

Furthermore, substantially the same plasma treatment is achieved in these plasma processing units 95, 96, and 97 using the same recipe regardless of passage of time.

Thus, in installation of new systems and inspection of installed systems, the time required for achieving substantially the same results using the same process recipe in these plasma processing units 95, 96, and 97 can be significantly reduced compared with an inspection method by actual deposition onto the substrate 16. Moreover, this evaluation method can directly evaluate this plasma processing system in situ in a short period of time, instead of a two-stage evaluation, i.e., processing of the substrates and confirmation and evaluation of the operation of the plasma processing system based on the evaluation of the processed substrates. In this embodiment, inspection by layer deposition on substrates is performed to determine the process recipe when the plasma processing apparatus is installed. Since the plasma processing units 95, 96, and 97 have the same radiofrequency characteristics, the layer deposition may be performed in only one of the chambers. In the maintenance of the plasma processing apparatus, actual layer deposition is not required because the radiofrequency characteristics of the plasma processing chambers are controlled within the predetermined value. In contrast, in conventional methods performing actual layer deposition on substrates, these plasma processing chambers must be independently evaluated.

Accordingly, the inspection method of this embodiment does not require a shutdown of the production line for several days to several weeks to check and evaluate the operation of the plasma processing system. The production line, therefore, has high productivity with reduced expenses for substrates used in the inspection, processing of these substrates, and labor during the inspection operations.

In the plasma processing system of this embodiment, overall radiofrequency characteristics of the plasma processing units 95 to 97 can be optimized by adjusting the input-terminal-side AC resistance RA and output-terminal-side AC resistance RB of each of the plasma processing units 95 to 97. Thus, the plasma processing units 95 to 97 can be stably operated, and power loss in the matching circuit 2A and in the vicinity thereof can be reduced even when power of a frequency higher than the frequency conventionally used, i.e., 13.56 MHz, is supplied from the radiofrequency generator 1. Accordingly, power can be efficiently introduced into the plasma generating space between the plasma excitation electrode 4 and the susceptor electrode 8. When a frequency equal to the frequency conventionally used is supplied, the effective power consumed in the plasma generating spaces in the plasma processing units 95 to 97 can be increased compared to conventional plasma processing apparatuses.

Consequently, the processing rate of the plasma processing system as a whole can be improved by using higher plasma excitation frequencies. When applied to a deposition process such as a plasma enhanced CVD process, the deposition rate in all the plasma processing units 95 to 97 can be further improved. Since the plasma processing units 95 to 97 can be stably operated, the plasma processing apparatuses 71, 91, and 71' can also be stably operated to improve the operational stability of the whole plasma processing system. These advantages can be simultaneously achieved in all the plasma processing units.

In the plasma processing units 95 to 97, effective power consumed in the plasma generating spaces is increased to improve the planar uniformity of the plasma processing on the substrate 16. When applied to a deposition process such as a plasma-enhanced CVD or a sputtering process, the uniformity of the layer thickness can be improved, and layer characteristics such as isolation voltage, resistance against etching, density (hardness) of the deposited layer, can be improved as a result of increased plasma density.

Since effective power consumed in the plasma space can be improved compared with conventional plasma processing systems when the same frequency is supplied, the plasma processing system as a whole exhibits an improved power consumption efficiency, requiring less power to obtain the same processing rate or layer characteristics. These advantages can be achieved in all the plasma processing units constituting the system. Accordingly, this plasma processing system achieves reduction in power loss and operating cost, and further improves the productivity. Since the time required for processing is reduced, power consumption can be reduced and emission of carbon dioxide which adversely affects the environment can be reduced.

In the plasma processing system of this embodiment, each of the plasma processing units 95 to 97 is provided with the measuring terminal 61 and the switch SW5 at the point PR3 of the matching circuit 2A. A single impedance meter AN is connected to the measuring terminal 61 and the switch SW5 by operating the switch SW3. The impedance characteristics of the plasma processing units in the plasma processing system can be measured without detaching the matching circuit 2A from the radiofrequency generator 1 and the feed line 1A, unlike the first and the second embodiments. Moreover, the impedance characteristics, the input-terminal-side AC resistance RA, and the output-terminal-side AC resistance RB of the plurality of plasma processing units can be measured by using a single impedance meter AN.

Thus, the impedance characteristics of the plasma processing units 95 to 97 can be measured easily, and the AC resistances RA and RB can be further effectively measured.

Moreover, the impedance between the measuring terminal 61 and the switch SW3 is the same among the plasma processing units 95 to 97 constituting the plasma processing apparatuses 71, 71', and 91; hence, the impedance from the impedance meter AN connected to the measuring terminal 61 is considered to be equal to the impedance measured at the point PR2 at the final stage of the output side of the radiofrequency generator 1, by operating the switches SW1, SW2, and SW3.

Since the difference in the impedance characteristics from the measuring terminal 61 to the switch SW3 of each of the plasma processing units 95 to 97 can be disregarded, the input-terminal-side AC resistance RA and the output-terminal-side AC resistance RB can be measured more precisely and efficiently without correction or conversion. Thus, the input-terminal-side AC resistance RA and the output-terminal-side AC resistance RB can be efficiently and further accurately measured.

In this embodiment, the switches SW3 and SW5 may cooperate to sequentially switch the connection to the plasma processing units 95 to 97. Moreover, these two switches SW1 and SW2 may be replaced with a single switch which sets the impedance between the branching point to the point PR equal to the impedance between the branching point to the probe.

Although in the above-described embodiments, the AC resistances RA and RB are set for the plasma excitation electrode 4 of each plasma processing unit, the AC resistances RA and RB may be set for the susceptor electrode 8. In such a case, measuring points PR', PR3', and PR4' of the matching circuit 25 as shown in FIGS. 11 and 15 are used.

Moreover, the present invention can be applied to a plasma processing apparatus of an inductive coupled plasma (ICP) type or a radial line slot antenna (RLSA) type, and to a processing apparatus for reactive ion etching (RIE).

Figure 35:
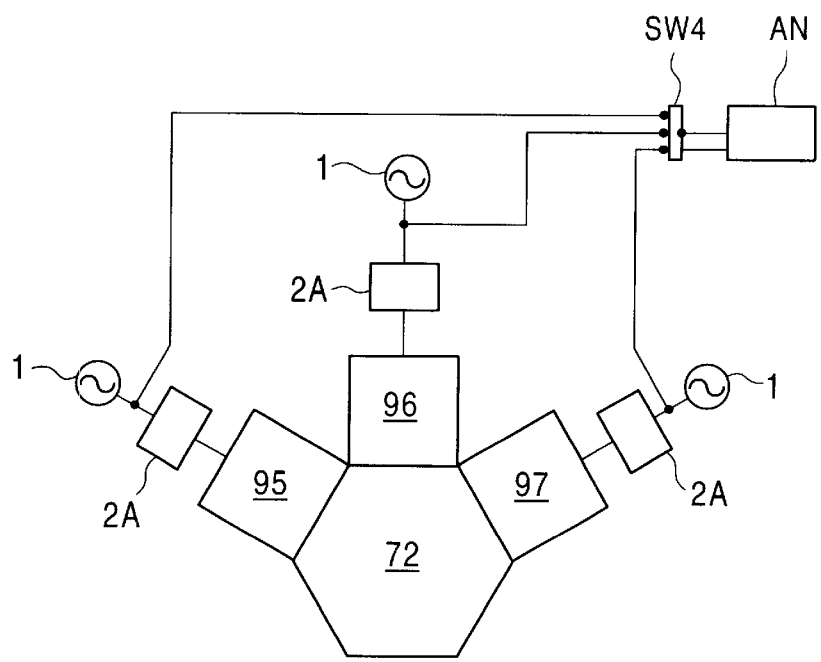
FIG. 35 is a schematic view of a plasma processing apparatus in accordance with another embodiment of the present invention.
Figure 36:
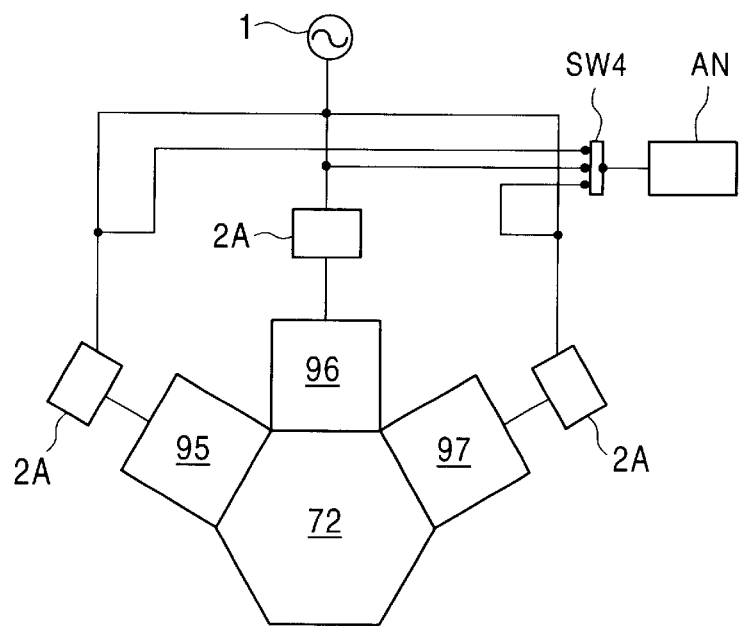
FIG. 36 is a schematic view of a plasma processing apparatus in accordance with another embodiment of the present invention.
Figure 37:
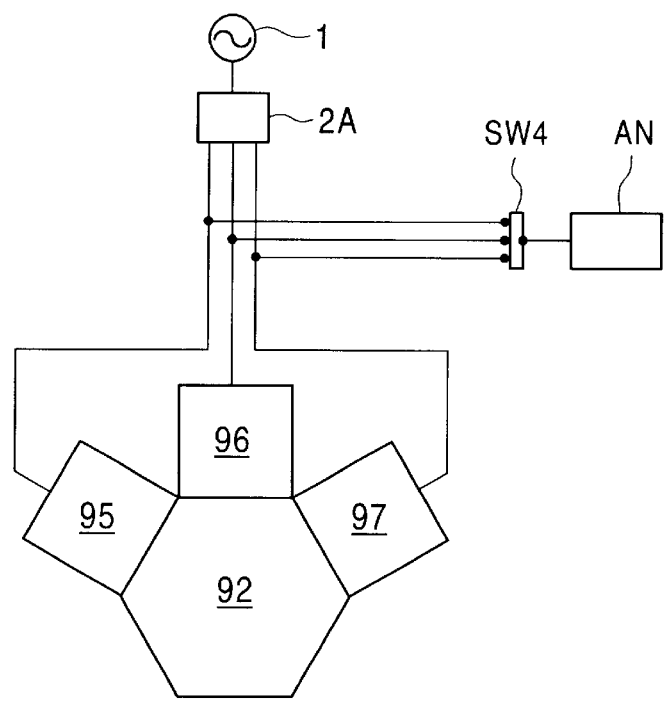
FIG. 37 is a schematic view of a plasma processing apparatus in accordance with another embodiment of the present invention.

In each of the above-described embodiments, one matching circuit 2A and one radiofrequency generator 1 are provided for each of the plasma processing units 95 to 97, as shown in FIG. 35, and the matching circuits 2A are connected to the single impedance meter AN via the switch SW4. Alternatively, as shown in FIG. 36, matching circuits 2A of the plasma processing units 95, 96, and 97 may be connected to the same radiofrequency generator by operating the switch SW4. Alternatively, as shown in FIG. 37, the plasma processing units 95 to 97 may be connected to the same matching circuit 2A by operating the switch SW4.

Alternatively, two impedance meters AN for measuring the input-terminal-side AC resistance RA and the output-terminal-side AC resistance RB may be provided to be connected to the plasma processing unit. In such a case, a switch may be provided to switch between the measurement of the input-terminal-side AC resistance RA and the measurement of the output-terminal-side AC resistance RB.

In the above-described embodiments, the frequency for measuring the input-terminal-side AC resistance RA and the output-terminal-side AC resistance RB oscillated by the impedance meter AN is set at the power frequency $f_e$ supplied from the radiofrequency generator 1. Thus, the characteristics of the plasma processing units 95 to 97 can be adjusted to a level which is less than an upper limit, and the difference in the radiofrequency characteristics of these units can be reduced. The plasma processing units 95 to 97 thereby consume substantially the same power in their plasma generating spaces.

Tenth Embodiment

A performance evaluation method of the plasma processing apparatus according to a tenth embodiment of the present invention will now be described with reference to the drawings.

In the performance evaluation method of this embodiment, the plasma processing apparatus according to the first embodiment shown in FIGS. 1 to 9 is evaluated.

This performance evaluation method determines that the plasma processing apparatus maintains a required level of performance when the absolute value $|\Delta RA|$ of the difference $\Delta RA$ between the AC resistance $RA_0$ at the time $t_0$ after the delivery and the AC resistance $RA_1$ at the later time $t_1$ of the plasma processing unit is less than 0.5 times the AC resistance $RA_0$ and when the absolute value $|\Delta RB|$ of the difference $\Delta RB$ between the AC resistance $RB_0$ at the time $t_0$ after the delivery and the AC resistance $RB_1$ at the later time $t_1$ of the plasma processing unit is less than 0.5 times the AC resistance $RB_0$ and that the plasma processing apparatus does not maintain the required level of performance when the absolute value $|\Delta RA|$ of the difference $\Delta RA$ between the AC resistance $RA_0$ at the time $t_0$ after the delivery and the AC resistance $RA_1$ at the later time $t_1$ of the plasma processing unit is not less than 0.5 times the AC resistance $RA_0$ or when the absolute value $|\Delta RB|$ of the difference ΔRB between the AC resistance $RB_0$ at the time $t_0$ after the delivery and the AC resistance $RB_1$ at the later time $t_1$ of the plasma processing unit is not less than 0.5 times the AC resistance $RB_0$, wherein the measurement is performed as in the first embodiment. When the required level of performance is not maintained, a corrective action for correcting the AC resistance $RA_1$ and/or the AC resistance $RB_1$ is performed such that both the absolute values |ΔRA| and the |ΔRB| are less than 0.5 times the AC resistances $RA_0$ and $RB_0$, respectively.

In the corrective action, the AC resistances $RA_1$ and $RB_2$ may be corrected by any one of Methods A to C described in the first embodiment.

In this performance evaluation method, the above corrective action can be readily performed; hence, the overall radiofrequency characteristics of the plasma processing unit including the matching circuit 2A can be readily optimized.

As a result, electrical power from the radiofrequency generator 1 can be effectively fed into the plasma space between the plasma excitation electrode 4 and the susceptor electrode 8 even if the input radiofrequency is higher than 13.56 MHz, which is conventionally used. When the same frequency is supplied, the electrical power will be more efficiently consumed in the plasma space of each plasma processing chamber compared with conventional plasma processing apparatuses. As a result, the processing rate is improved by the higher-frequency plasma excitation. In other words, the deposition rate of the layer is improved in the plasma enhanced CVD or the like.

Since an adequate corrective action is performed based on the results of the performance evaluation method according to this embodiment, input power is effectively supplied into the plasma space regardless of reassembly, use, adjustment, and the passage of time. Thus, the same treatment is achieved among the plasma processing units 75, 76, and 77 using the same process recipe. When a layer is deposited on a substrate, the layer quality is improved regardless of the passage of time. That is, the isolation voltage, etching resistance in etching solutions, and density or hardness of the resulting layer are improved. The layer density is represented by, for example, etching resistance in a BHF solution.

According to the performance evaluation method of this embodiment, the AC resistance $RA_1$ and the AC resistance $RB_1$ are measured with the RF characteristic meter AN at the installation site of the plasma processing apparatus. The performance of the plasma processing apparatus can be thereby checked and evaluated within a short time. Since no substrate with deposited layers is used for checking, the performance validation and evaluation of the plasma processing apparatus does not require shutdown of the production line for several days to several weeks, thereby improving productivity of the production line.

Since the AC resistance $RA_1$ and the AC resistance $RB_1$ mainly depend on the mechanical structure, thus individual plasma processing units have different AC resistances $RA_1$ and AC resistances $RB_1$. By setting these values to the above-described range, the overall radiofrequency characteristics of these plasma chambers can be optimized, achieving stable plasma generation. Consequently, the plasma processing apparatus exhibits improved operation stability.

Because the performance evaluation is performed after the apparatus is disassembled at the engineer site, is transferred to the customer site, and is reassembled at the customer site, the performance of the apparatus can be readily checked for a short time in view of factors which adversely affect the performance, such as misalignment due to vibration during transfer and unsatisfactory reassembling. Moreover, a period from finding to solving the problem can be reduced; hence, the apparatus can be readily used in practice after a reduced amount of installation and set-up time.

Eleventh Embodiment

Another performance management system for a plasma processing apparatus in accordance with an eleventh embodiment will now be described with reference to the drawings.

Figure 38:
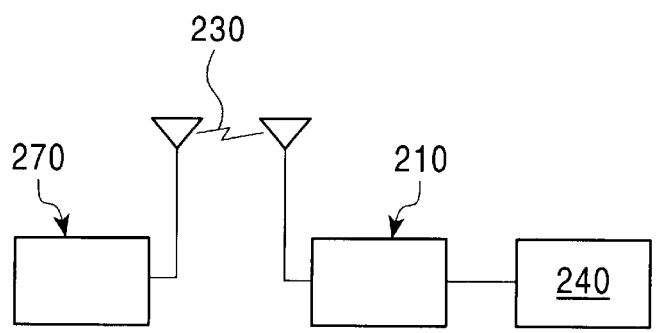
FIG. 38 is a block diagram of a performance management system for a plasma processing apparatus in accordance with an eleventh embodiment of the present invention.
Figure 39:
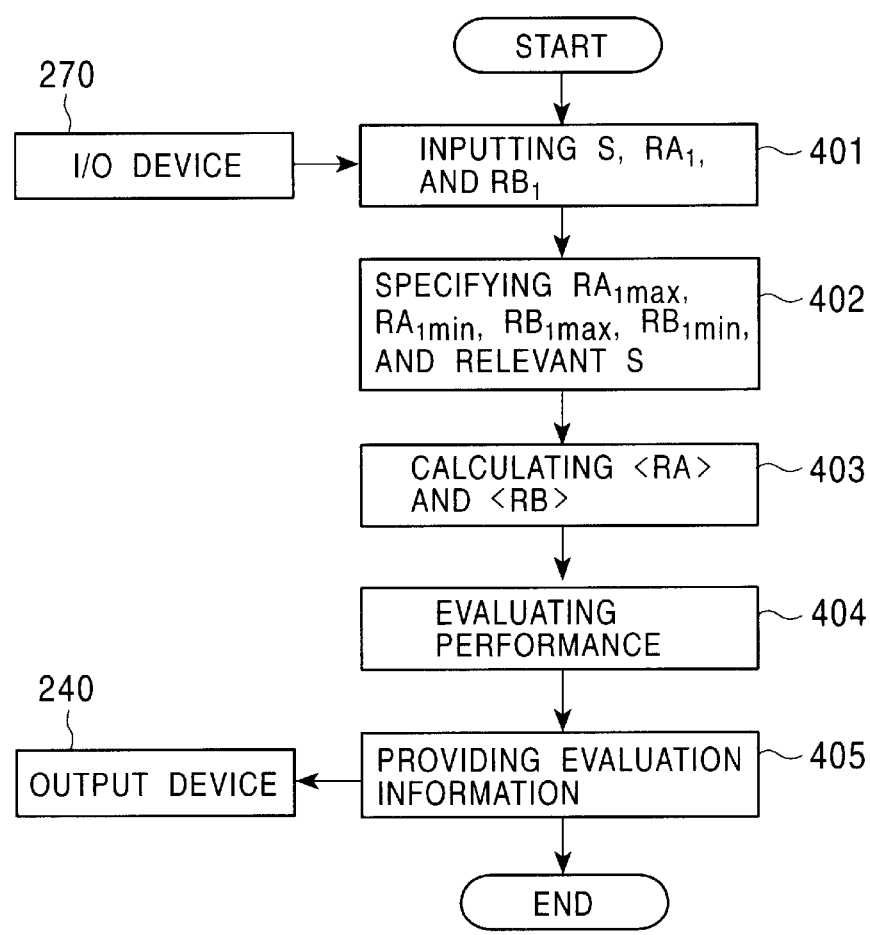
FIG. 39 is a flowchart illustrating a method for providing evaluation information which is prepared by the performance management system shown in FIG. 38.
Figure 40:
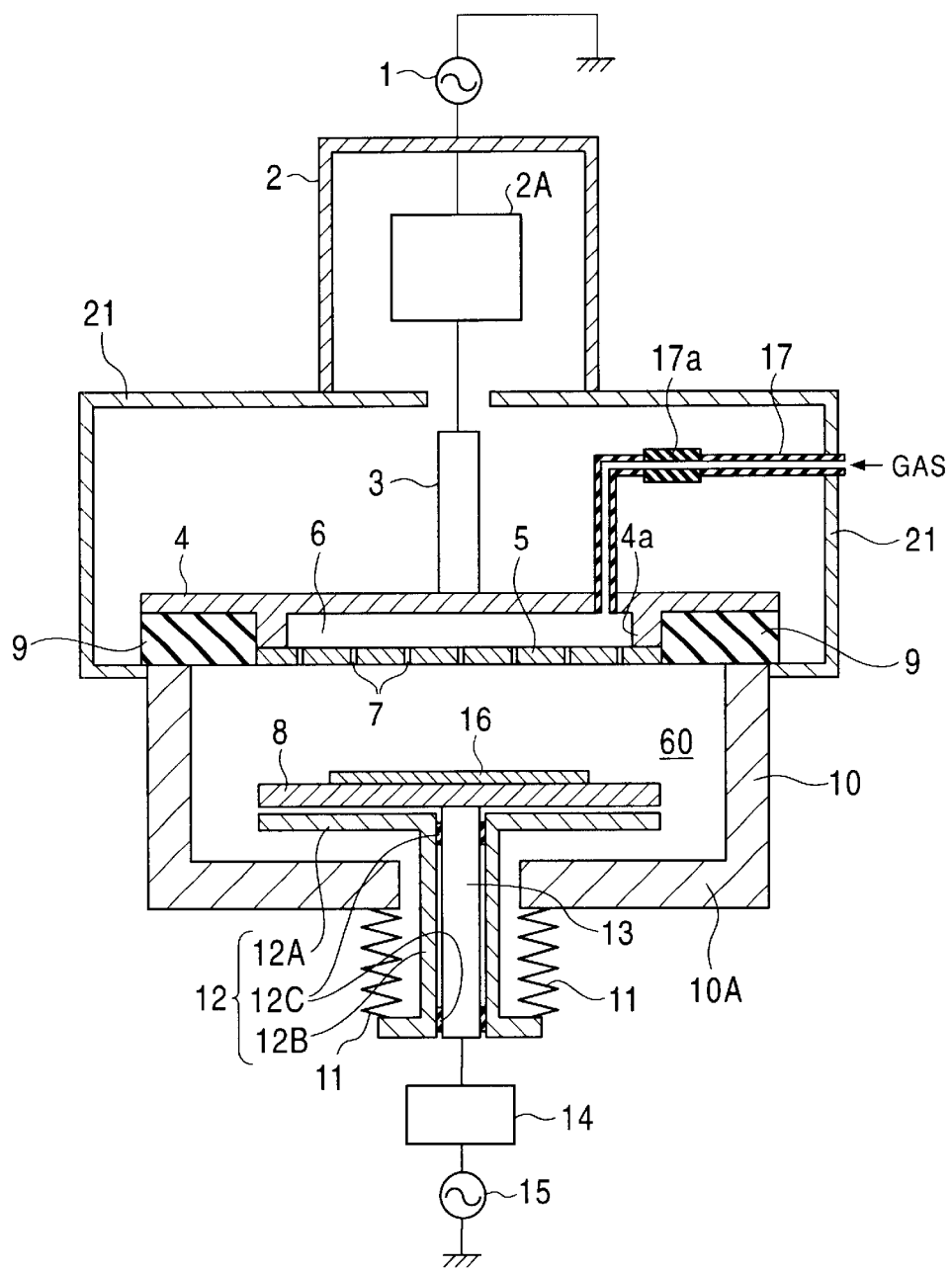
FIG. 40 is a schematic view of a conventional plasma processing apparatus.
Figure 41:
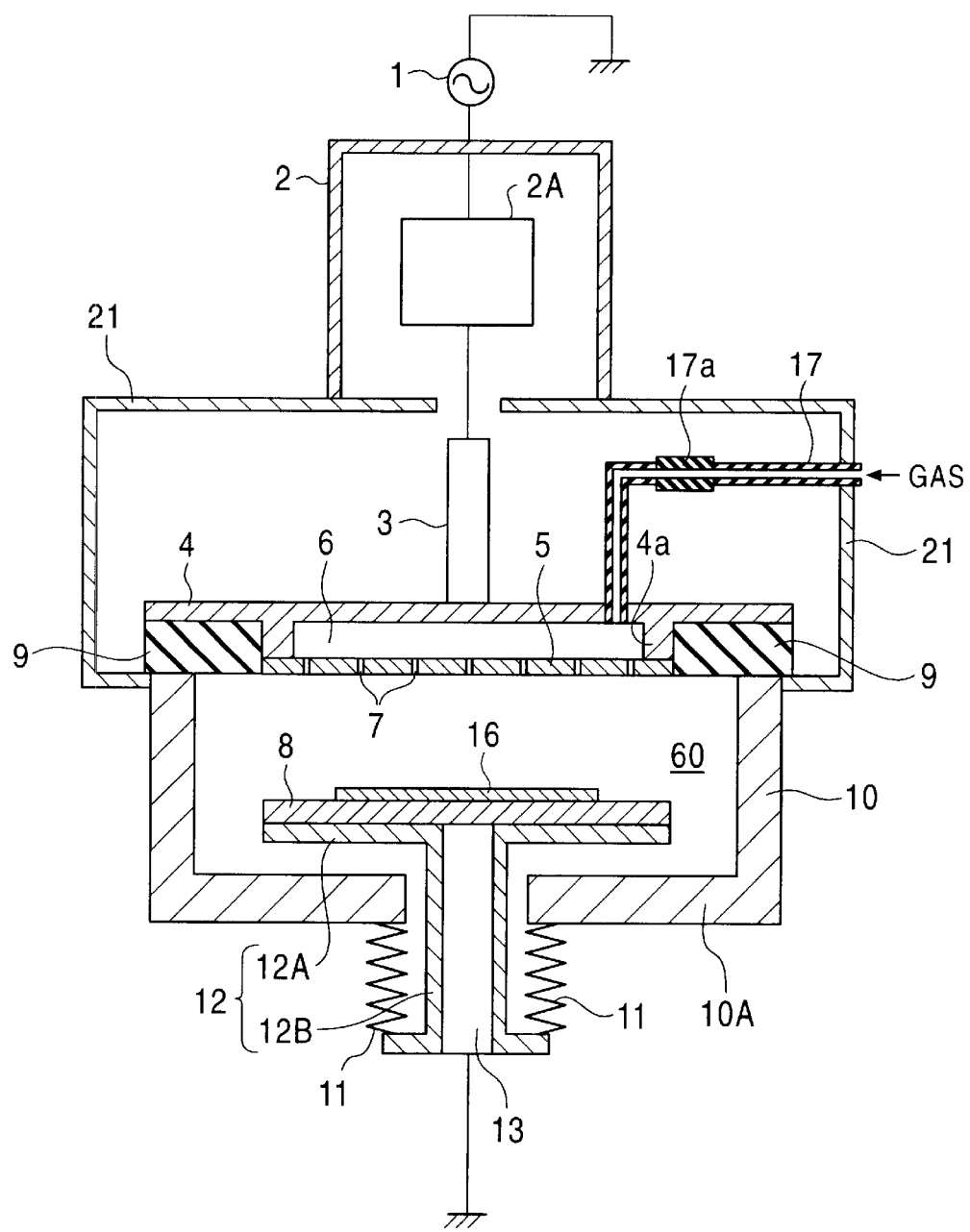
FIG. 41 is a schematic view of another conventional plasma processing apparatus.

FIG. 38 is a block diagrams of a performance management system for a plasma processing system of this embodiment, and FIG. 39 is a flowchart illustrating a method for providing evaluation information which is prepared by this performance management system. The same components as those in FIGS. 21 to 26 are referred to with the same reference numerals, and the description thereof is omitted.

The performance management system shown in FIG. 38 includes a server 210, a customer input device 270, a communication line 230 linking the server 210 and the customer input device 270, and an output device 240 at a delivery site, the output device 240 being linked to the server 210. This performance management system is applicable to plasma processing apparatuses or plasma processing systems, each having a plurality of plasma processing units, shown in the above relevant embodiments.

Referring to FIG. 38, the operation of this embodiment will now be described with reference to FIG. 39. A user of the performance management system, for example, a customer at a delivery site or a maintenance engineer who visits the customer inputs identification numbers S and observed AC resistances $RA_1$ and AC resistances $RB_1$ at the later time $t_1$ of plasma processing units 75, 76, 77, 95, 96, and 97 through the customer input device 270. The identification number S and these resistances are transmitted to the server 210 via the communication line 230 (Step 401).

An impedance meter connected to the plasma processing apparatus may be connected to the customer input device 270 so that the identification numbers S and the AC resistances $RA_1$ and AC resistances $RB_1$ of the plasma processing units 75, 76, 77, 95, 96, and 97 can be automatically transmitted upon the request from the server 210.

The server 210 identifies the plasma processing chamber from the identification number S and determines the maximum $RA_{1max}$ and the minimum $RA_{1min}$ of the AC resistances $RA_1$ and the maximum $RB_{1max}$ and the minimum $RB_{1min}$ of the AC resistances $RB_1$ (Step 402). The variations <RA> and <RB> are calculated based on the following equations (Step 403):

$$<RA>=(RA_{1max}-RA_{1min})/(RA_{1max}+RA_{1min}) \quad (14A)$$

$$<RB>=(RB_{1max}-RB_{1min})/(RB_{1max}+RB_{1min}) \quad (14B)$$

The server 210 compares the calculated variations <RA> and <RB> with an upper limit, for example, 0.5 to evaluate the performance of the plasma processing apparatus. The server 210 determines that the plasma processing apparatus maintains a required level of performance when both the variations <RA> and <RB> are smaller than the upper limit and that the plasma processing apparatus does not maintain the required level of performance when either the variation <RA> or <RB> is not smaller than the upper limit (Step 404).

When determining that the plasma processing apparatus does not maintain the required level of performance, the server 210 provides evaluation information including a maintenance command and identification numbers of the plasma processing chambers having the maximum $RA_{1max}$, the maximum $RB_{1max}$, the minimum $RB_{1min}$, and the minimum $RB_{1min}$ to the output device 240 at the delivery site (Step 405).

In detail, the server 210 transmits print, display, or sound alarm signals to the output device 240. The maintenance command and the identification numbers of the corresponding plasma processing chambers are output at the delivery site to identify the apparatuses which must be subjected to maintenance.

At the delivery site, the performance management system for the plasma processing apparatus of this embodiment can immediately identify the relevant plasma processing apparatus or plasma processing chamber.

As a result, the manufacturer or a maintenance company can evaluate the plasma processing apparatus or plasma processing system based on Evaluation Standard 2 without actually inspecting the substrates used for layer deposition in this apparatus or system.

Moreover, the plasma processing apparatus or system can be directly evaluated in situ in a short period of time, instead of a two-stage evaluation, i.e., processing of the substrates and confirmation and evaluation of the operation of the plasma processing apparatus or system based on the evaluation of the processed substrates. If an inspection process by layer deposition on the substrates is employed in a plasma processing apparatus or system having a plurality of plasma processing chambers, these plasma processing chambers can be simultaneously evaluated.

Accordingly, the performance management system for this embodiment can check the operating performance of the apparatus for a short period in a simplified process, and can reduce a shutdown time of the apparatus. The apparatus, therefore, has high productivity with reduced expenses for substrates used in the inspection, processing of these substrates, and labor during the inspection operations.

The manufacturer at the delivery site can immediately identify the problems of the plasma processing apparatus at the customer site by the maintenance command, thus providing a satisfactory repair service.

EXAMPLES

In the following examples, variations over time in the input-terminal-side AC resistance RA and the output-terminal-side AC resistance RB were adjusted to be less than certain upper limits so as to observe changes in characteristics of deposited layers. Also, variations in the input-terminal-side AC resistance RA and output-terminal-side AC resistance RB among matching circuits of a plurality of plasma processing unit were controlled to be less than certain upper limits so as to observe changes in characteristics of deposited layers.

The plasma processing apparatus used was of a dual-frequency excitation type. Four different matching circuits (Matching Circuits 1 to 4) were sequentially connected to the same plasma processing chamber to eliminate the difference resulting from the mechanical structure of the plasma processing chamber.

The plasma processing apparatus had 25 cm square electrodes 4 and 8 of a parallel plate type. The interelectrode distance was set at 15 mm, the power was set at 600 W, and the power frequency $f_e$ was set at 40.68 MHz.

First, the input-terminal-side AC resistance RA and the output-terminal-side AC resistance RB of each matching circuit were measured. In measuring the input-terminal-side AC resistance RA and the output-terminal-side AC resistance RB, the matching circuit 2A was disconnected from the feed plate 3 and the feed line 1A, and the AC resistances RA and RB were measured from the point PR3 and PR, respectively, as in the second embodiment.

The frequency of the impedance meter was varied over the range of 1 to 100 MHz to determine the vector quantity of the impedance, and the AC resistances RA and RB were calculated from the values Z and θ at the power frequency of 40.68 MHz.

Matching Circuit 1 had a structure identical to the matching circuit 2A in the first embodiment shown in FIG. 3. In Matching Circuit 1, the inductance of the inductance coil 23 made of a copper pipe plated with silver was 372 nH, the output-terminal-side AC resistance RB at the power frequency $f_e$ as a parasitic resistance component was 5.5Ω, and the input-terminal-side AC resistance RA as a parasitic resistance component was 0.54Ω.

In Matching Circuit 2, two inductance coils 23, each identical to that of Matching Circuit 1, were connected in parallel so as to set the total inductance at 370 nH. The output-terminal-side AC resistance RB at the power frequency $f_e$ as a parasitic resistance component was 3.2Ω, and the input-terminal-side AC resistance RA as a parasitic resistance component was 0.55Ω.

In Matching Circuit 3, four inductance coils 23, each identical to that of Matching circuit 1, were connected in parallel so as to set the total inductance at 370 nH. The output-terminal-side AC resistance RB at the power frequency $f_e$ as a parasitic resistance component was 1.6Ω, and the input-terminal-side AC resistance RA as a parasitic resistance component was 0.52Ω.

Matching Circuit 4 had the inductance coil 23 composed of a copper pipe having a larger diameter compared to the inductance coil 23 of Matching Circuit 1. The total inductance was set at 370 nH, the output-terminal-side AC resistance RB at the power frequency $f_e$ as a parasitic resistance component was 4.1Ω, and the input-terminal-side AC resistance RA as a parasitic resistance component was 0.54Ω.

The above-described four matching circuits were sequentially connected to the same plasma processing chamber, and silicon nitride layers were deposited according to the same process recipe to measure the variations in the layer thickness as below:

Step 1: Depositing a $SiN_x$ layer on a 6-inch glass substrate by a plasma-enhanced CVD;
Step 2: Patterning a resist layer by photolithography;
Step 3: Dry-etching the $SiN_x$ layer with $SF_6$ and $O_2$;
Step 4: Removing the resist layer by $O_2$ ashing;
Step 5: Measuring the surface roughness of the $SiN_x$ layer using a contact displacement meter to determine the layer thickness;
Step 6: Calculating the deposition rate from the deposition time and the layer thickness; and
Step 7: Measuring the planar uniformity of the layer at 16 points on the substrate surface.

The deposition conditions were as follows:

Substrate temperature: 300° C.

Gas pressure: 100 Pa $SiH_4$ flow rate: 40 SCCM $NH_3$ flow rate: 160 SCCM $N_2$ flow rate: 600 SCCM The results are shown in Table 2.

TABLE 2

|  | Matching Circuit 1 | Matching Circuit 2 | Matching Circuit 3 | Matching Circuit 4 |
| --- | --- | --- | --- | --- |
| Input-terminal-side AC resistance RA ($\Omega$) | 0.54 | 0.55 | 0.52 | 0.54 |
| Output-terminal-side AC resistance RB ($\Omega$) | 5.52 | 3.17 | 1.62 | 4.13 |
| Inductance of the coil (nH) | 372 | 370 | 370 | 370 |
| Deposition rate (nm/min) | 184 | 224 | 237 | 207 |

Example 1

Matching Circuits 2 and 3 above were selected in Example 1.

Example 1 exhibited the highest deposition rate, and the variation in the deposition rate was 2.8%, i.e., less than 3%. The variation in the output-terminal-side AC resistance RB according to equation (14B) was 0.32, i.e., less than 0.4.

Example 2

Matching Circuits 1, 2, and 3 were selected in Example 2.

Example 2 exhibited the second highest deposition rate. However, the variation in the deposition rate was 12.6%, i.e., more than 10%. The variation in the output-terminal-side AC resistance RB according to equation (14B) was 0.55, i.e., not less than 0.5.

Example 3

Matching Circuits 2, 3, and 4 were selected in Example 3.

The variation in the deposition rate was 6.8%, i.e., less than 7%. The variation in the output-terminal-side AC resistance RB according to equation (14B) was 0.44, i.e., less than 0.5.

These results are shown in Table 3.

TABLE 3

|  | Example 1 (2, 3) | Example 2 (1, 2, 3) | Example 3 (2, 3, 4) |
| --- | --- | --- | --- |
| Variation <RA> | 0.028 | 0.019 | 0.028 |
| Variation <RB> | 0.32 | 0.55 | 0.44 |
| Variation in the deposition rate (%) | 2.8 | 12.6 | 6.75 |

Layers of silicon nitride are used as gate insulating layers in thin-film-transistor liquid-crystal devices (TFT-LCDs) and as insulating layers in storage capacitors loaded to maintain the voltage applied to the liquid crystal at a satisfactory level. The property of the silicon nitride layer affects the contrast, i.e., the ratio of the maximum to minimum luminance values in a TFT-LCD as an end product, and a variation of 10% in the thickness of the silicon nitride layers will result in a variation of approximately 50 in the contrast. That is, the contrast will vary over the range of 200 to 250 among a plurality of end products.

When the variations in the input-terminal-side AC resistance RA and output-terminal-side AC resistance RB are less than 0.5, the variation in deposition characteristics can be maintained at 10% or less, and a variation in the contrast in the TFT-LCD as an end product can be maintained at about 50 or less.

When the variations in the input-terminal-side AC resistance RA and output-terminal-side AC resistance RB are less than 0.45, the variation in deposition characteristics can be maintained at 7% or less, and a variation in the contrast in the TFT-LCD as a product can be maintained at about 30 or less.

When the variations in the input-terminal-side AC resistance RA and output-terminal-side AC resistance RB are less than 0.4, the variation in deposition characteristics can be maintained at 3% or less, and a variation in the contrast in the TFT-LCD as a product can be maintained at about 10 or less.

As demonstrated above, the difference between different plasma processing units can be minimized by adjusting the variations in the input-terminal-side AC resistance RA and the output-terminal-side AC resistance RB.

Next, the matching circuits of Examples 4 to 6 were prepared. The matching circuits had the same configuration as Matching Circuit 1 described above.

The input-terminal-side AC resistance RA and the output-terminal-side AC resistance RB were measured for each of the matching circuits. In measuring the input-terminal-side AC resistance RA and the output-terminal-side AC resistance RB, the matching circuit 2A was disconnected from the feed plate 3 and the feed line 1A, and the AC resistances RA and RB were measured from the point PR3 and PR, respectively, as in the second embodiment. The frequency of the impedance meter was varied over the range of 1 to 100 MHz to determine the vector quantity of the impedance, and the AC resistances RA and RB were calculated from the values Z and $\theta$ at the power frequency of 40.68 MHz. The observed values at this time were defined as the AC resistance $RA_0$ and $RB_0$ at the time $t_0$.

The disassembly and reassembly of the above-described plasma processing apparatus was performed as the event between the time $t_0$ and the later time $t_1$. The input-terminal-side AC resistance RA and the output-terminal-side AC resistance RB were then measured.

In measuring the input-terminal-side AC resistance RA and the output-terminal-side AC resistance RB, the matching circuit 2A was disconnected from the feed plate 3 and the feed line 1A, and the AC resistances RA and RB were measured from the point PR3 and PR, respectively, as in the second embodiment. The frequency of the RF characteristic meter was varied over the range of 1 to 100 MHz to determine the vector quantity of the impedance, and the AC resistances RA and RB were calculated from the values Z and $\theta$ at the power frequency of 40.68 MHz. The observed values at this time were defined as the AC resistance $RA_1$ and $RB_1$ at the time $t_1$.

Based on $RA_0$, $RB_0$, $RA_1$, and $RB_1$, the absolute value $|\Delta RA|$ of the difference $\Delta RA$ between $RA_0$ and $RA_1$ and the absolute value $|\Delta RB|$ of the difference $\Delta RB$ between $RB_0$ and $RB_1$ were calculated, and a coefficient C in each of relationships (20A) and (20B) below was determined to examine the relationships between the prescribed upper limits and the absolute values $|\Delta RA|$ and $|\Delta RB|$:

$$|\Delta RA|; C \times RA_0 \tag{20A}$$

$$|\Delta RB|; C \times RB_0 \tag{20B}$$

The larger of the calculated coefficients C is shown in Table 4 for each of Examples 4 to 6.

Next, the matching circuits of Examples 4 to 6 are sequentially connected to the same plasma processing chamber, and silicon nitride layers were deposited according to the same process recipe and under the same conditions as in Examples 1 to 3 to measure the variations in the thickness of the deposited layers.

The results are shown in Table 4.

TABLE 4

|  | Example 4 | Example 5 | Example 6 |
|---|---|---|---|
| Larger of the coefficients C | 0.32 | 0.44 | 0.55 |
| Variation in deposition rates | 2.8% | 6.8% | 12.6% |

$|\Delta RA|$; C×RA $|\Delta RB|$; C×RB

Example 4

In Example 4, the larger coefficient C was 0.32, i.e., less than 0.4. The variation in the deposition rates was 2.8%, i.e., less than 3%.

Example 5

In Example 5, the larger coefficient C was 0.44, i.e., less than 0.5. The variation in the deposition rates was 6.8%, i.e., more than 3% but less than 7%.

Example 6

In Example 6, the larger coefficient C was 0.55, i.e., more than 0.5. The variation in the deposition rates was 12.6% exceeding 7% and 10%.

Layers of silicon nitride are used as gate insulating layers in thin-film-transistor liquid-crystal devices (TFT-LCDs) and as insulating layers in storage capacitors loaded to maintain the voltage applied to the liquid crystal at a satisfactory level. The property of the silicon nitride layer affects the contrast, i.e., the ratio of the maximum to minimum luminance values in a TFT-LCD as an end product, and a variation of 10% in the thickness of the silicon nitride layers will result in a variation of approximately 50 in the contrast. That is, the contrast will vary over the range of 200 to 250 among a plurality of end products.

The variation in the contrast of the TFT-LCDs as end products can be maintained to be less than 30 by controlling the absolute values $|\Delta RA|$ and $|\Delta RB|$ calculated using $RA_1$ and $RB_1$ measured at the time $t_1$ to be less than 0.5 times the unique values $RA_0$ and $RB_0$, respectively.

Moreover, when the absolute values $|\Delta RA|$ and $|\Delta RB|$ calculated using $RA_1$ and $RB_1$ measured at the time $t_1$ are controlled to be less than 0.4 times the unique values $RA_0$ and $RB_0$, respectively, the variation in the deposition rate is decreased to less than 3%. The variation in the end products can also be reduced to less than 10.

The above described examples demonstrate that the process variation over time of the plasma processing unit can be decreased by improving the uniformity over time in the input-terminal-side AC resistance RA and the output-terminal-side AC resistance RB.

What is claimed is:

1. A performance evaluation method for a plasma processing apparatus comprising a plasma processing unit, the plasma processing unit comprising:

a plasma processing chamber including an electrode for exciting a plasma;

a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point, the performance evaluation method comprising:

calculating the absolute value $|\Delta RA|$ of the difference $\Delta RA$ between an AC resistance $RA_0$ at a time $t_0$ and an AC resistance $RA_1$ at a later time $t_1$ in the matching circuit, the AC resistances $RA_0$ and $RA_1$ being measured from the input terminal side of the matching circuit;

calculating the absolute value $|\Delta RB|$ of the difference $\Delta RB$ between an AC resistance $RB_0$ at the time $t_0$ and an AC resistance $RB_1$ at the later time $t_1$ in the matching circuit, the AC resistances $RB_0$ and $RB_1$ being measured from the output terminal side of the matching circuit; and determining that the plasma processing apparatus maintains a required level of performance when the absolute value $|\Delta RA|$ is less than a first upper limit and when the absolute value $|\Delta RB|$ is less than a second upper limit and that the plasma processing apparatus does not maintain the required level of performance when the absolute value $|\Delta RA|$ is not less than the first upper limit or when the absolute value $|\Delta RB|$ is not less than the second upper limit.

2. The performance evaluation method for the plasma processing apparatus according to claim 1, wherein the matching circuit is disconnected from the plasma processing unit at the output terminal and at the input terminal, and the AC resistances $RA_0$ and $RA_1$ are measured at a first measuring point corresponding to the input terminal.

3. The performance evaluation method for the plasma processing apparatus according to claim 1, the plasma processing unit further comprising a radiofrequency supplier disposed between the radiofrequency generator and the input terminal of the matching circuit, wherein the matching circuit is disconnected from the plasma processing unit at the output terminal and at an input end of the radiofrequency supplier, and the AC resistances $RA_0$ and $RA_1$ are measured at a second measuring point corresponding to the input end of the radiofrequency supplier.

4. The performance evaluation method for the plasma processing apparatus according to claim 1, wherein the matching circuit is disconnected from the plasma processing unit at the input terminal and at the output terminal of the matching circuit, and the AC resistances $RB_0$ and $RB_1$ are measured at a third measuring point corresponding to the output terminal.

5. The performance evaluation method for the plasma processing apparatus according to claim 1, the plasma processing unit further comprising a radiofrequency feeder disposed between the output terminal of the matching circuit and the electrode, wherein the matching circuit is disconnected from the plasma processing unit at the input terminal of the matching circuit and at an output end of the radiofrequency feeder, and the AC resistance $RB_0$ and $RB_1$ are measured at a fourth measuring point corresponding to the output end of the radiofrequency feeder.

6. The performance evaluation method for the plasma processing apparatus according to claim 1, wherein the AC resistances $RA_0$, $RA_1$, $RB_0$, and $RB_1$ are measured at a power frequency of the radiofrequency generator.

7. The performance evaluation method for the plasma processing apparatus according to claim 1, wherein the first upper limit is 0.5 times the AC resistance $RA_0$, and the second upper limit is 0.5 times the AC resistance $RB_0$.

8. The performance evaluation method for the plasma processing apparatus according to claim 7, wherein the first upper limit is 0.4 times the AC resistance $RA_0$, and the second upper limit is 0.4 times the AC resistance $RB_0$.

9. The performance evaluation method for the plasma processing apparatus according to claim 1, the matching circuit further comprising at least one connection point for connecting the matching circuit to the ground potential portion, wherein the AC resistances $RA_0$, $RA_1$, $RB_0$, and $RB_1$ are measured for each of the connection points by sequentially switching the connection points so that only one of the connection points is connected to the ground potential portion.

10. The performance evaluation method for the plasma processing apparatus according to claim 1, wherein a workpiece is introduced into the plasma processing chamber to perform a plasma process on the workpiece between the time $t_0$ and the later time $t_1$.

11. The performance evaluation method for the plasma processing apparatus according to claim 1, wherein adjustment work is performed between the time $t_0$ and the later time $t_1$.

12. The performance evaluation method for the plasma processing apparatus according to claim 1, wherein the plasma processing apparatus is disassembled, transferred, and reassembled between the time $t_0$ and the later time $t_1$.

13. A maintenance method for a plasma processing apparatus, wherein, based on the results obtained by the evaluation method of claim 1, the AC resistances $RA_1$ and $RB_1$ are corrected when the absolute value $|\Delta RA|$ is not less than the first upper limit or the absolute value $|\Delta RB|$ is not less than the second upper limit.

14. A performance management system for a plasma processing apparatus comprising a plasma processing unit, the plasma processing unit comprising:

a plasma processing chamber including an electrode for exciting a plasma;

a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point, the performance management system comprising:

a server for storing an AC resistance $RA_0$ in the matching circuit measured from the input terminal side of the matching circuit at a time $t_0$ and an AC resistance $RB_0$ in the matching circuit measured from the output terminal side of the matching circuit at the time $t_0$; and a customer I/O device linked to the server via a communication line, wherein the server receives an AC resistance $RA_1$ at a later time $t_1$ and an AC resistance $RB_1$ at the later time $t_1$ from the customer I/O device, calculates the absolute value $|\Delta RA|$ of the difference $\Delta RA$ between the AC resistances $RA_0$ and $RA_1$ and the absolute value $|\Delta RB|$ of the difference $\Delta RB$ between the AC resistances $RB_0$ and $RB_1$, and transmits to the customer I/O device a signal indicating that the plasma processing apparatus maintains a required level of performance when the absolute value $|\Delta RA|$ is less than a first upper limit and when $|\Delta RB|$ is less than a second upper limit and a signal indicating that that the plasma processing apparatus does not maintain the required level of performance when the absolute value $|\Delta RA|$ is not less than the first upper limit or when the absolute value $|\Delta RB|$ is not less than the second upper limit.

15. The performance management system for the plasma processing apparatus according to claim 14, the server further storing the identification number of the plasma processing unit, the identification number being associated with the AC resistances $RA_0$ and $RB_0$, wherein the server receives the identification number of the plasma processing unit from the customer I/O device and calculates the absolute values $|\Delta RA|$ and $|\Delta RB|$ based on the AC resistances $RA_0$ and $RB_0$ associated with the identification number.

16. The performance management system for the plasma processing apparatus according to claim 14, wherein an RF characteristic meter is connected to the plasma processing apparatus and the customer I/O device, and the AC resistances $RA_1$ and $RB_1$ are directly transmitted from the RF characteristic meter to the server.

17. The performance management system for the plasma processing apparatus according to claim 14, the server comprising an output device located at the site of a supplier, wherein a maintenance command is output through the output device when the absolute value $|\Delta RA|$ is not less than the first upper limit or when the absolute value $|\Delta RB|$ is not less than the second upper limit.

18. A performance management system for a plasma processing apparatus comprising a plasma processing unit, the unit comprising:

a plasma processing chamber including an electrode for exciting a plasma;

a radiofrequency generator for supplying radiofrequency power to the electrode; and a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point, the performance management system comprising:

a server for storing an AC resistance $RA_0$ at a time $t_0$ in the matching circuit measured from the input terminal side of the matching circuit, an AC resistance $RB_0$ at the time $t_0$ in the matching circuit measured from the output terminal side of the matching circuit, and service engineer information containing fault levels and names of registered service engineers corresponding to the fault levels;

an output device of the server, the output device being located at the site of a supplier; and a customer I/O device linked to the server via a communication line;

wherein the server receives an AC resistance $RA_1$ and an AC resistance $RB_1$ measured at a later time $t_1$ from the customer I/O device, calculates the absolute value $|\Delta RA|$ of the difference $\Delta RA$ between the AC resistances $RA_0$ and $RA_1$ and the absolute value $|\Delta RB|$ of the difference $\Delta RB$ between the AC resistances $RB_0$ and $RB_1$, and, when one of the absolute values $|\Delta RA|$ and $|\Delta RB|$ falls under any one of the fault levels, outputs the relevant fault level, information on the registered service engineer corresponding to the relevant fault level, and a maintenance command from the output device.

19. The performance management system for the plasma processing apparatus according to claim 18, the server further storing the identification number of the plasma processing unit, the identification number being associated with the AC resistances $RA_0$ and $RB_0$, wherein the server receives the identification number of the plasma processing unit from the customer I/O device and calculates the absolute values $|\Delta RA|$ and $|\Delta RB|$ based on the AC resistances $RA_0$ and $RB_0$ associated with the received identification number.

20. The performance management system for the plasma processing apparatus according to claim 18, wherein an RF characteristic meter is connected to the plasma processing apparatus and the customer I/O device, and the AC resistances $RA_1$ and $RB_1$ are directly transmitted from the RF characteristic meter to the server.

21. The performance management system for the plasma processing apparatus according to claim 18, wherein the server transmits the relevant fault level to the customer I/O device.

22. A plasma processing apparatus having a plasma processing unit comprising:
a plasma processing chamber including an electrode for exciting a plasma;
a radiofrequency generator for supplying radiofrequency power to the electrode; and
a matching circuit for matching the impedances of the plasma processing chamber and the radiofrequency generator, the matching circuit having an input terminal connected to the radiofrequency generator, an output terminal connected to the electrode, and a connection point provided between the input terminal and the output terminal, the matching circuit being connected to a ground potential portion via the connection point,
wherein the absolute value $|\Delta RA|$ of the difference $\Delta RA$ between an AC resistance $RA_0$ at a time $t_0$ and an AC resistance $RA_1$ at a later time $t_1$ in the matching circuit, the AC resistances $RA_0$ and $RA_1$ being measured from the input terminal side of the matching circuit, is maintained at a value less than a first upper limit, and the absolute value $|\Delta RB|$ of the difference $\Delta RB$ between an AC resistance $RB_0$ at the time $t_0$ and an AC resistance $RB_1$ at the later time $t_1$ in the matching circuit, the AC resistances $RB_0$ and $RB_1$ being measured from the input terminal side of the matching circuit, is maintained at a value less than a second upper limit.

23. A performance validation system for a plasma processing apparatus, comprising:
a customer terminal which allows a customer to request via a public line browsing of performance information indicating operation performance at the time $t_0$ and at the later $t_1$ of the plasma processing apparatus of claim 22 which the customer purchased from an engineer;
an engineer terminal which allows the engineer to upload the performance information; and
performance information providing means for providing the performance information uploaded from the engineer terminal to the customer terminal upon the request from the customer terminal.

24. The performance validation system for the plasma processing apparatus according to claim 23, wherein the performance information includes the AC resistances $RA_1$, $RA_1$, $RB_0$, and $RB_1$.

25. The performance validation system for the plasma processing apparatus according to claim 24, wherein the performance information is output as a catalog or a specification document.

* * * * *